United States Patent [19]

Matsuo et al.

[11] Patent Number: 5,208,629
[45] Date of Patent: May 4, 1993

[54] OPTICAL PROJECTION EXPOSURE METHOD AND SYSTEM USING THE SAME

[75] Inventors: Seitaro Matsuo, Kanagawa; Yoshinobu Takeuchi, Tokyo; Kazuhiko Komatsu; Emi Tamechika, both of Kanagawa; Katsuhiro Harada, Tokyo; Yoshiaki Mimura; Toshiyuki Horiuchi, both of Kanagawa, all of Japan

[73] Assignee: Nippon Telegraph & Telephone Corporation, Japan

[21] Appl. No.: 863,454

[22] Filed: Apr. 3, 1992

[30] Foreign Application Priority Data

| Apr. 5, 1991 | [JP] | Japan | 3-99822 |
|---|---|---|---|
| May 13, 1991 | [JP] | Japan | 3-135317 |
| May 20, 1991 | [JP] | Japan | 3-142782 |
| May 24, 1991 | [JP] | Japan | 3-148133 |
| Jun. 3, 1991 | [JP] | Japan | 3-157401 |
| Jun. 24, 1991 | [JP] | Japan | 3-177816 |
| Jul. 12, 1991 | [JP] | Japan | 3-197457 |
| Aug. 5, 1991 | [JP] | Japan | 3-218098 |
| Aug. 5, 1991 | [JP] | Japan | 3-218099 |
| Aug. 5, 1991 | [JP] | Japan | 3-218100 |
| Aug. 12, 1991 | [JP] | Japan | 3-225335 |
| Aug. 23, 1991 | [JP] | Japan | 3-235753 |
| Sep. 6, 1991 | [JP] | Japan | 3-254306 |
| Oct. 11, 1991 | [JP] | Japan | 3-290442 |

[51] Int. Cl.$^5$ .................. G03B 27/42; G03B 27/54
[52] U.S. Cl. ............................ 355/53; 355/67
[58] Field of Search .................. 355/53, 67, 71

[56] References Cited

U.S. PATENT DOCUMENTS

| 5,062,692 | 11/1991 | Marui et al. | 359/45 |
|---|---|---|---|
| 5,117,255 | 5/1992 | Shiraishi et al. | 355/53 |
| 5,121,160 | 6/1992 | Sano et al. | 355/53 |
| 5,144,362 | 9/1992 | Kamon et al. | 355/53 |

FOREIGN PATENT DOCUMENTS

61-91662 5/1986 Japan.

OTHER PUBLICATIONS

H. Fukuda et al., "New Approach to Resolution Limit and Advanced Image Formation Techniques in Optical Lithography", IEEE Transactions on Electron Devices. vol. 38, No. 1, Jan. 1991, pp. 67–75.

D. L. Fehrs et al., "Illuminator Modification of an Optical Aligner", KTI Microelectronics Seminar, Nov. 6–7, 1989, San Diego, pp. 217–230.

*Primary Examiner*—Richard A. Wintercorn
*Attorney, Agent, or Firm*—Blakely, Sokoloff, Taylor & Zafman

[57] ABSTRACT

According to this invention, illumination light for illuminating a mask on which a micropattern is drawn is inclined at an angle corresponding to a numerical aperture of an optical projection lens located below the mask with respect to an optical axis. The illumination light is obliquely incident on the mask to expose the micropattern on an object located below the optical projection lens.

91 Claims, 70 Drawing Sheets

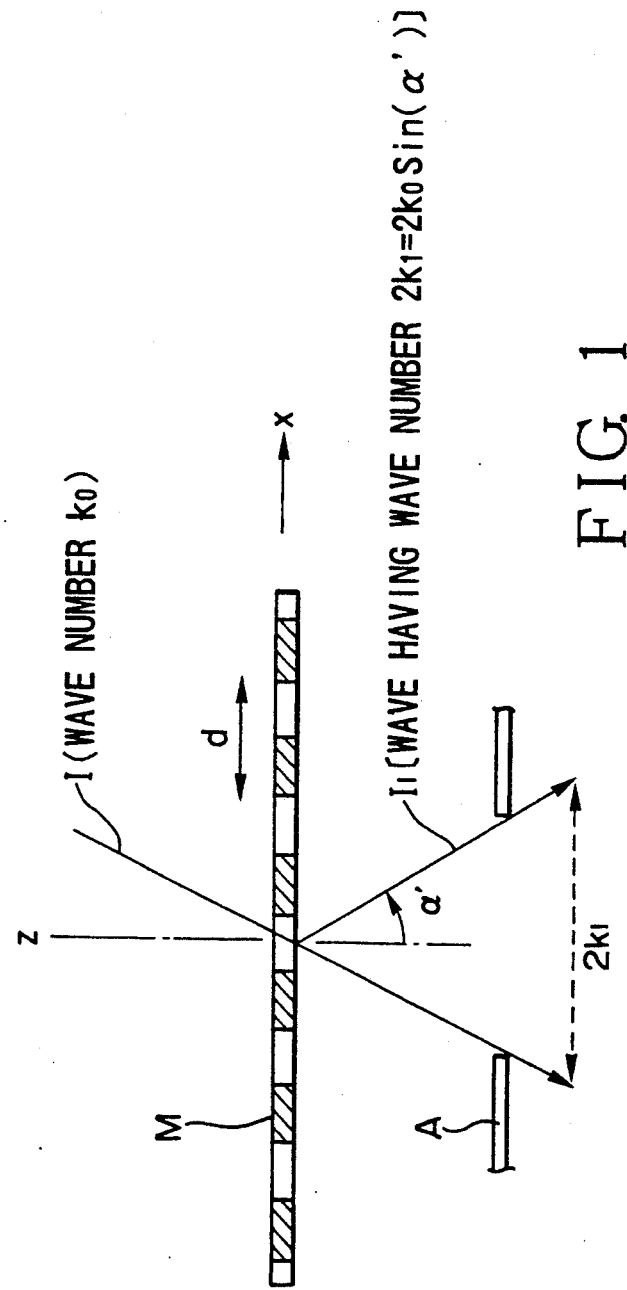

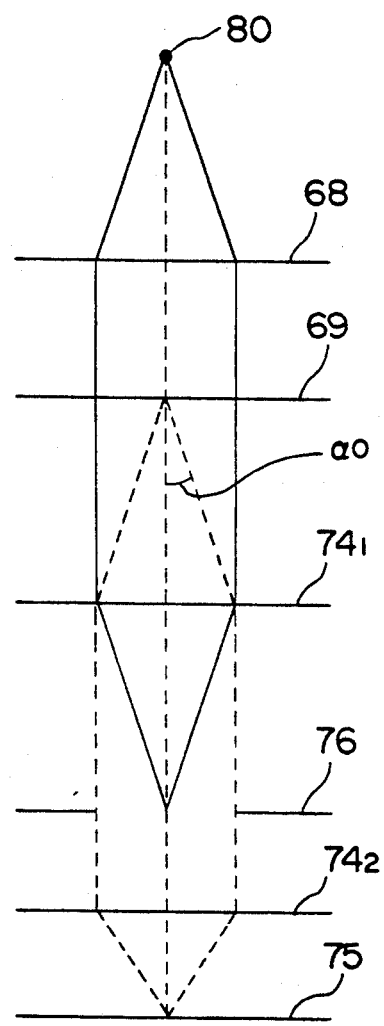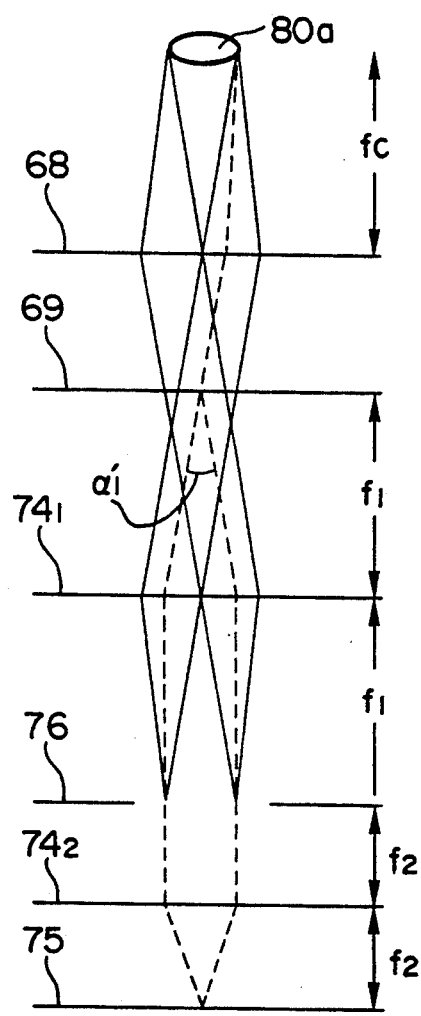
FIG. 42(a)
FIG. 42(b)
PRIOR ART

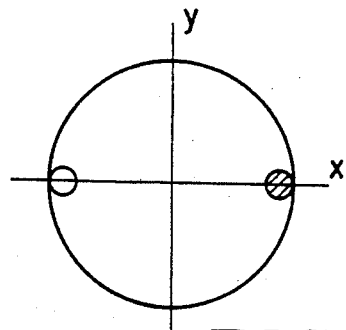
FIG. 57(a)
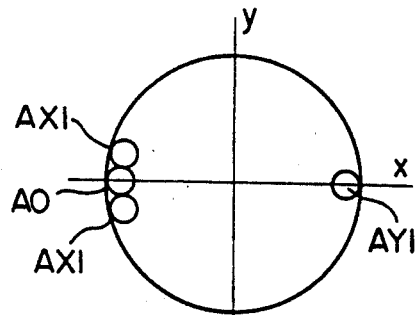
FIG. 57(a')
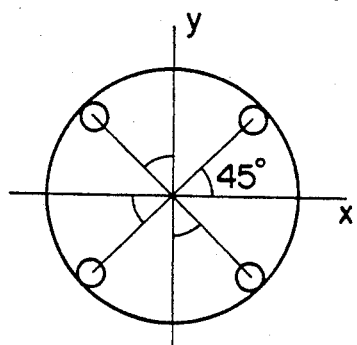
FIG. 57(b)
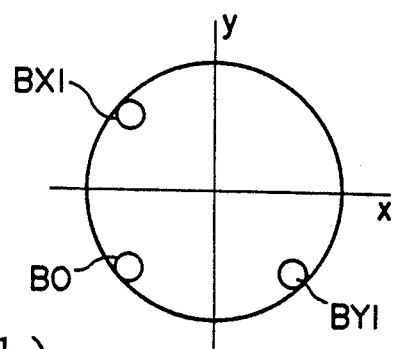
FIG. 57(b')
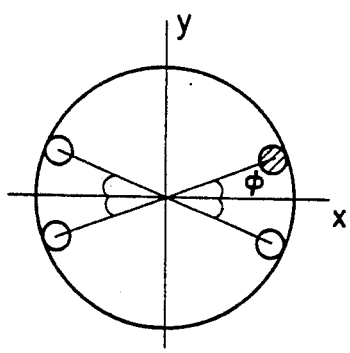
FIG. 57(c)
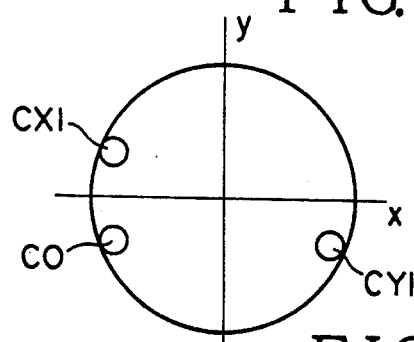
FIG. 57(c')
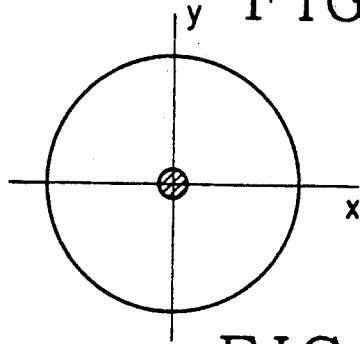
FIG. 57(d)
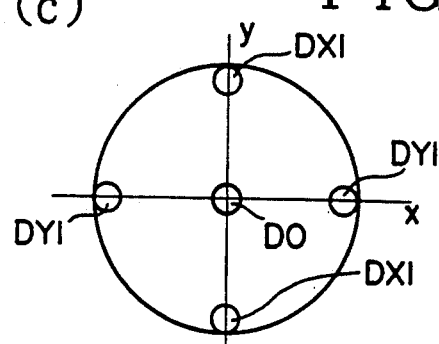
FIG. 57(d')

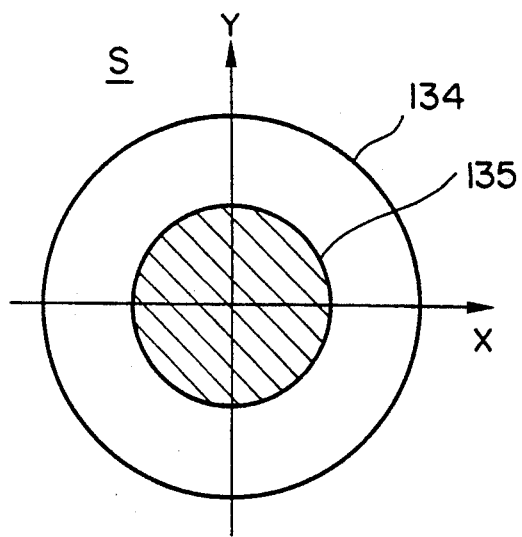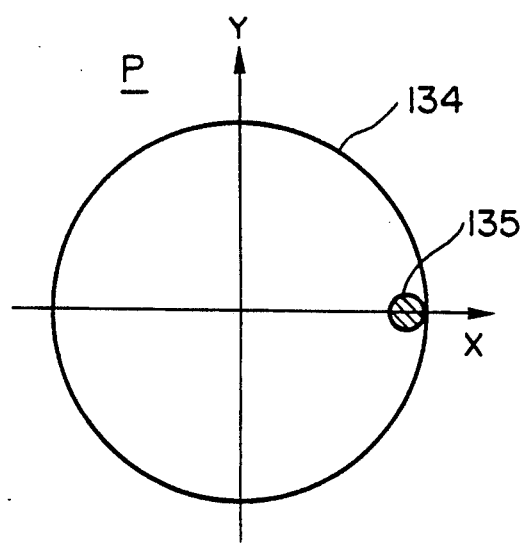
FIG. 60(a)   FIG. 60(b)
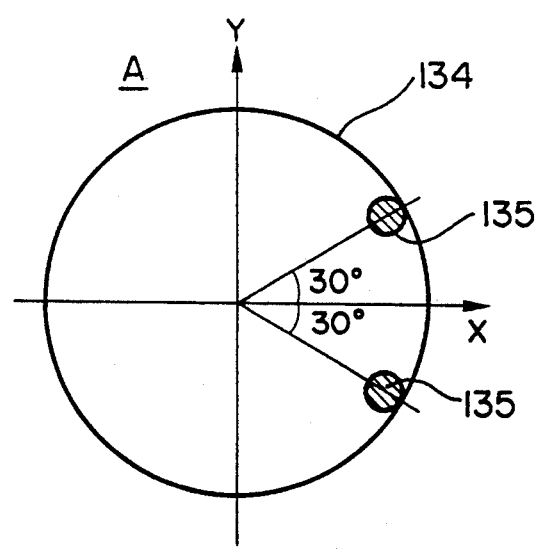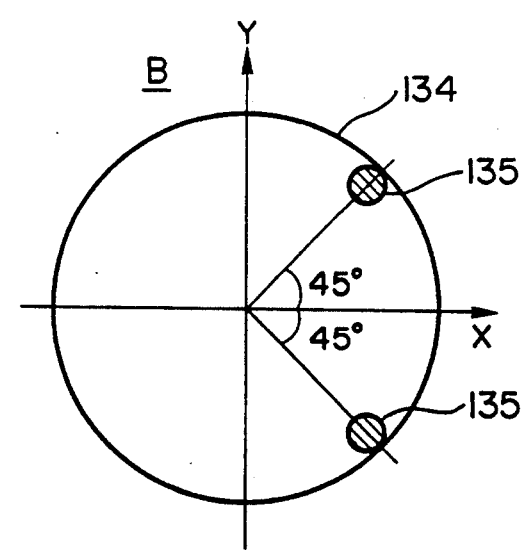
FIG. 60(c)   FIG. 60(d)
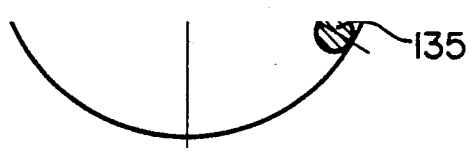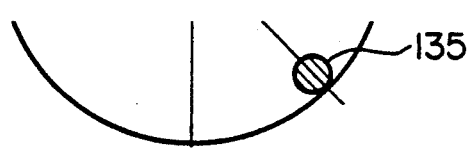

$1 : 1 : 1 \leftarrow t = \frac{1}{3}$ (PRESENT INVENTION)

$1 : 2 : 1 \leftarrow t = 0$ (CORRESPONDING TO CONVENTIONAL CASE)

(-1ST-ORDER)(ZERO-ORDER)(1ST-ORDER)

OPTICAL PROJECTION EXPOSURE METHOD AND SYSTEM USING THE SAME

BACKGROUND OF THE INVENTION

The present invention relates to an optical projection exposure method and a system using the same and, more particularly, a method and system for exposing a micropattern such as an LSI pattern to form the micropattern on a substrate using an optical projection lens.

An optical projection exposure system called a stepper for forming a micropattern such as an LSI pattern conventionally requires a high resolving power. In order to satisfy this demand, an optical projection lens of a recent optical projection exposure system has a larger numerical aperture and shortens the wavelength of light to improve a resolution property. The most advanced optical projection lens has a resolving power almost close to a theoretical limit determined by a wavelength of light. Nevertheless, a higher resolving power is required to cope with micropatterning of recent LSI patterns. In order to cope with this demand, there is proposed a phase-shifting mask method in which phase sifters are added every predetermined interval of transparent patterns so that a phase difference $\pi$ appears in transmitted rays between adjacent patterns on the mask placed on the object plane of the optical projection lens, thereby causing a light intensity in an opaque region to come close to zero. This method will be described by way of a simple example.

FIG. 17 is a view for explaining a resolution limit of the mask of this phase-shifting mask method, while FIG. 18 is a view for explaining a resolution limit of a mask by a normal illumination method. Each mask is assumed to have a large number of line figures having equal widths and parallel to each other at equal intervals. FIG. 18 is a sectional view of a mask M taken along a plane perpendicular to a direction of lines of the mask M. A length of a repetition period of the line figures of the mask M shown in FIG. 18 is defined as d. Phase shifters S are added every predetermined interval of transparent regions in a phase-shifting mask MP shown in FIG. 17 to cause a phase difference $\pi$ between rays passing through two adjacent transparent regions. That is, since a negative amplitude is obtained every predetermined interval of the patterns, the period is defined as 2d, and a DC component becomes zero. For this reason, illumination light $I_0$ having a wave number $k_0$ and vertically incident on the phase-shifting mask MP is diffracted by the mask to produce a wave $I_1$ inclined at an angle with respect to an optical axis z. The wave number of this wave is defined as $k_1 = k_0 \sin(\alpha')$ where $\alpha'$ is a diffraction angle. However, since the fundamental period of the repetition pattern is 2d, the wave number is defined as $k_1 = 2\pi/2d$. An electric field amplitude u of transmitted light has components in $\pm x$ directions and is represented as follows:

$$u = \frac{u_0}{2} (e^{ik_1 x} + e^{-ik_1 x}) \quad (1)$$

where x is a coordinate in a pattern repetition direction.

When a wave defined by equation (1) propagates toward the optical projection lens, it is assumed that this wave passes near the periphery of an aperture A (entrance pupil) located below the phase-shifting mask MP. That is, assume that a small pattern diffracted at an angle larger than the size of the aperture A cannot be resolved by the optical projection lens. Since a light intensity in image plane is proportional to a square of an absolute value of the electric field amplitude, the following equation is derived:

$$|u|^2 = (\tfrac{1}{2})|u_0|^2(1 + \cos 2k_1 x) \quad (2)$$

so that a pattern having a fundamental period d and a wave number $k_1$ can be reproduced.

On the other hand, when the light $I_0$ having the wave number $k_0$ is vertically incident on the normal mask M having no phase shifter S, a wave $I_1'$ having the following wave number is produced, as shown in FIG. 18:

$$k2_{k_1} = 2k_0 \sin(\alpha')$$

This wave $I_1$ is shielded by the aperture A and does not reach the image plane. That is, in vertical incidence on the normal mask, the pattern is not resolved.

As can be apparent from the above description, a resolving power can be increased as compared with the conventional technique when the phase-shifting mask method is used.

As described above, although the phase-shifting mask method is effective for adjacent linear patterns, it is always not effective for adjacent patterns having different sizes and isolated patterns. A step of adding phase shifters in mask fabrication results in a low yield and high mask fabrication cost.

Another method satisfying a higher resolving power to cope with micropatterning is a ring light source aperture method. As described in Japanese Patent Application No. 59-211269 (Japanese Patent Laid-Open No. 61-91662 laid open on May 9, 1986) entitled the "Optical Projection Exposure System" and filed by the present applicant, a ring aperture is used as a light source aperture. The function of this method is based on experimental facts. This prior art describes that a higher resolving power can be obtained by an outermost light source in the ring light source aperture. However, no description is made on a method of determining a size of the ring light source aperture to obtain a maximum resolution of the optical projection lens.

SUMMARY OF THE INVENTION

It is, therefore, a principal object of the present invention to provide an optical projection exposure method and a system using the same, which can improve resolution than a conventional case.

It is another object of the present invention to provide an optical projection exposure method and a system using the same, which can improve the contrast in addition to the above object.

In order to achieve the above objects according to an embodiment of the present invention, there is provided an optical projection exposure method of a micropattern, comprising the steps of inclining illumination light for illuminating a mask having the micropattern thereon by an angle corresponding to a numerical aperture of an optical projection lens located below the mask with respect to an optical axis, and causing the illumination light to be obliquely incident on the mask to expose the micropattern on an object located below the optical projection lens.

According to another aspect of the present invention, there is provided an optical projection exposure apparatus of a micropattern, comprising a light source, a mask on which the micropattern is drawn, an optical projection lens located below the mask, and means for obliquely illuminating the micropattern on the mask with illumination light inclined at an angle corresponding to a numerical aperture of the optical projection lens with respect to an optical axis, wherein the illumination light is obliquely incident on the mask to expose the micropattern on an object located below the optical projection lens.

BRIEF DESCRIPTION OF THE DRAWINGS

FIG. 1 is a view for explaining the principle of the present invention;

FIGS. 6(a) to 6(dl) are views showing a relationship between a light source layout and a transmittance of an optical projection lens aperture, in which FIGS. 6(a) to 6(d) are views showing the light source layout, and FIGS. 6(al) to 6(dl) are views showing optical projection lens apertures corresponding to light sources shown in FIGS. 6(a) to 6(d);

FIGS. 34(a) and 34(b) are views showing the principle according to still another embodiment of the present invention, in which FIG. 34(a) is a view showing a schematic arrangement, and FIG. 34(b) is a view showing an inverted conical oblique illumination;

FIGS. 39(a) and 39(b) show still another embodiment of the present invention, in which FIG. 39(a) is a sectional view showing an optical fiber portion, and FIG. 39(b) is a view showing a practical arrangement of an annular light source using this optical fiber;

FIGS. 41(a) and 41(b) show still another embodiment of the present invention, in which FIG. 41(a) is an enlarged sectional view showing a conical lens portion, and FIG. 41(b) is a view showing a practical arrangement of an annular light source using this conical lens;

FIGS. 42(a) and 42(b) show a track of rays emitted from a secondary source in an optical projection exposure system and a state in which rays diffracted by a reticle are focused on a wafer surface, in which FIG.

42(a) is a view illustrating a point light source, and FIG. 42(b) is a view illustrating an annular light source whose radius is not optimized;

FIGS. 43(a) and 43(b) show still another embodiment of the present invention, and particularly shows a track of rays emitted from a secondary source and a state in which rays diffracted by a reticle are focused on a wafer surface, in which FIG. 43(a) is a view illustrating an annular light source having a radius corresponding to the numeral aperture of an optical projection system, and FIG. 43(b) is a view illustrating a case in which a condenser lens having a high magnification is used in an annular light source as in FIG. 42(b);

FIGS. 57(a) to 57(d) and 57(a') to 57(d') are views for explaining practical cases for changing the direction and angle of light incident on a reticle according to a pattern shape;

FIGS. 60(a) to 60(d) are views for explaining still another embodiment of the present invention, in which FIGS. 60(a) and 60(b) show the positions and sizes of light sources in pupil spaces in a conventional method S used for comparison and an oblique incidence illumination system P, and FIGS. 60(c) and 60(d) show the positions and sizes in pupil spaces A and B when conditions of a prism or grating and a special diaphragm are changed;

FIGS. 61(a), 61(b), and 61(c) are views for explaining this embodiment, in which FIGS. 61(a), 61(b), and 61(c) show the positions and sizes in pupil spaces C, D, and E, respectively, when the conditions of the prism or grating and the special diaphragm are changed;

FIGS. 62(a), 62(b), and 62(c) are views explaining this embodiment, in which FIGS. 62(a), 62(b), and 62(c) show the positions and sizes in pupil spaces F, G, and H, respectively, when the conditions of the prism or grating and the special diaphragm are changed;

DESCRIPTION OF THE PREFERRED EMBODIMENTS

Figure 2A:
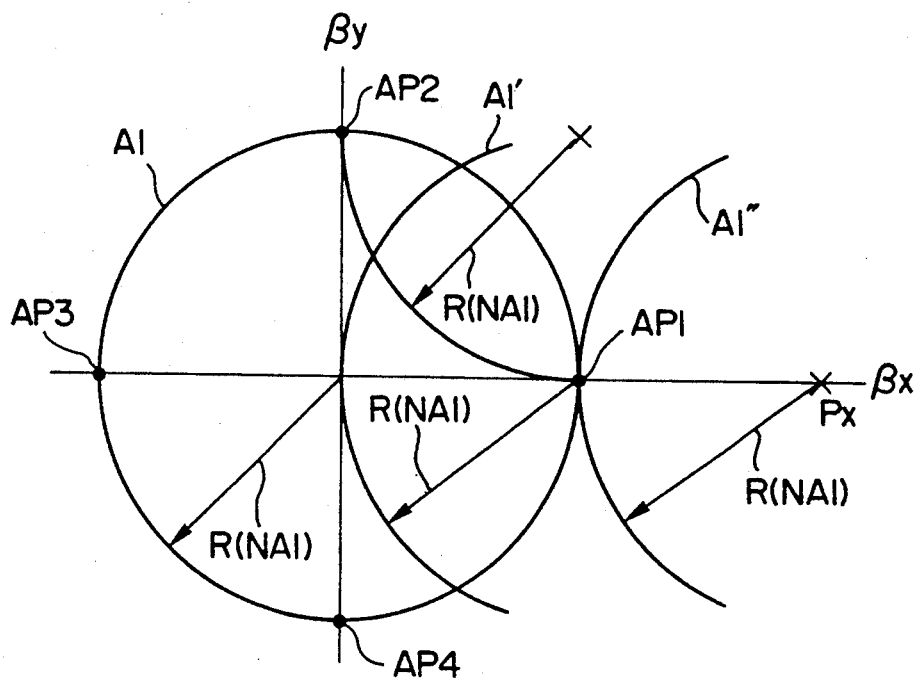
FIGS. 2(a) and 2(b) are views for explaining resolution in a 2- or 4-point oblique incidence illumination method according to an embodiment of the present invention.

The present invention will be generally described. The basic principle of an optical projection exposure method according to the present invention is to give an inclination to illumination light for illuminating a mask with respect to an optical axis.

The principle will be described with reference to linear patterns (wave number: $2k_1$) in FIG. 1. FIG. 1 shows a section of a mask M taken along a plane perpendicular to the direction of lines of the mask M. A length of a repetition period of line figures is defined as d. As shown in FIG. 1, when light I having a wave number $k_0$ spatially coherent in a direction from the center of an optical axis z on the mask M to the edge of an aperture A at an inclination angle $\alpha'$ inclined with respect to the optical axis z is incident on the normal mask M, a wave $I_1$ diffracted by and transmitted through the mask M is a wave having an angle $2\alpha'$ with respect to the incident light. This wave has a wave number $k_1$. A wave propagating straight in the incident direction and passing by the edge of the aperture A is assumed to be a wave having the wave number $k_1$. Alternatively, when a wave propagating straight in the incident direction is defined as 1, the wave number of the diffracted wave is $2k_1$. Therefore, an electric field amplitude u of the transmitted light is defined as follows:

$$u = \frac{u_0}{2}(e^{-ik_1x} + e^{i2k_1x}) \tag{3}$$

A light intensity in image plane is defined as follows:

$$|u|^2 = (|u_0|^2/2)(1 + \cos 2k_1 x) \tag{4}$$

Equation (4) is identical to equation (2). That is, when the normal mask M is irradiated with light from an oblique direction, a function equal to a phase-shifting mask is found to be obtained. This is also understood that oblique illumination can give phase differences of 0, $\pi$, 0, $\pi$, ... to the respective transparent patterns.

The present inventors found for the first time the fact that the phase-shifting method was identical to the oblique incidence illumination method at a maximum resolving power. The present invention is based on this fact.

A function of two-directional periodicity of a mask pattern according to the present invention will be described below. Most of integrated circuit patterns are constituted by vertical and horizontal patterns. In this case, when oblique incidence illumination from the x and y directions can be expected to obtain the same effect as linear patterns. This two-directional illumination and four-directional illumination obtained by improving symmetry of the two-directional illumination will be described with reference to FIGS. 2(a) and 2(b).

Illumination techniques incoherent to each other from a plurality of directions are used, these operations are equal to the cases in which independent rays are illuminated, and excessive interference does not occur. An inclination amount $\beta x$ (wave number: $\beta x$) in the x direction is plotted along the abscissa in FIG. 2(a), and an inclination amount $\beta y$ (wave number: $\beta y$) in the y direction is plotted along the ordinate. Points AP1 to AP4 representing inclination amounts of a light source are plotted on a circle A1 at four points symmetrical about the origin. A radius R of the circle A1 is equal to a numerical aperture NA1 obtained when the exit pupil of an optical projection lens is observed from the center of the optical axis of the image plane. An illumination angle corresponding to the numerical aperture of the optical projection lens is given by $\alpha'$, for a reduction magnification 1/m:

$$\sin\alpha' = (1/m)\sin\alpha \tag{5}$$

where $\sin\alpha$ is the numerical aperture of the optical projection lens. For example, if a reduction magnification is 1/5 and the numerical aperture of the optical projection lens is 0.5, then $\sin\alpha' = (1/5) \times 0.5$, i.e., $\alpha' \approx 5.7°$.

According to the gist of the present invention, oblique incidence illumination is performed at an angle equal to this value. A point representing illumination light is located on the circle A1. Circles A1, and A1'' represent ranges within which higher-order components corresponding to the wave numbers $k_1$ and $2k_1$ are received by the optical projection lens when a mask pattern is separated into spatial harmonic waves. The circle A1, represents a position of an optimal resolution circle obtained when rays are illuminated parallel to the optical axis. The circle A1'' represents the range within which wave number components resolved by the present invention fall. A center Px of the circle A1'' has a value of parallel illumination.

Figure 2B:
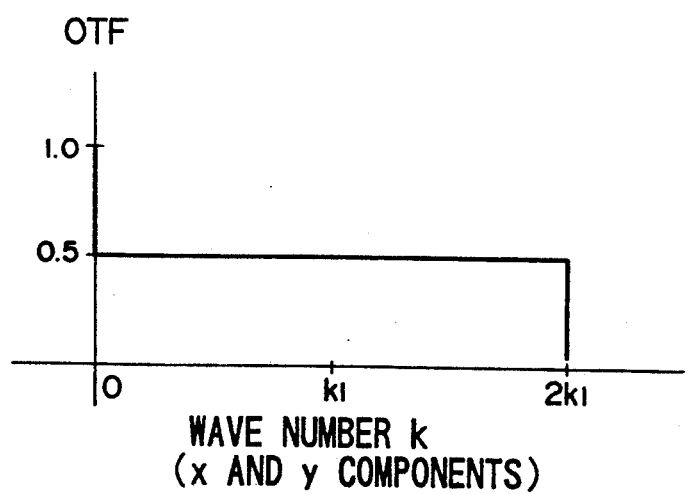

An optical transfer function OTF in FIG. 2(a) has flat characteristics shown in FIG. 2(b). A maximum wave number in the x or y direction is twice (i.e., $2k_1$) the value k obtained in illumination parallel tot he optical axis. The wave number in a direction intermediate between the x and y directions is $\sqrt{2}$ times that of illumination parallel to the optical axis and is suitable for a desired pattern to be resolved.

Figure 3A:
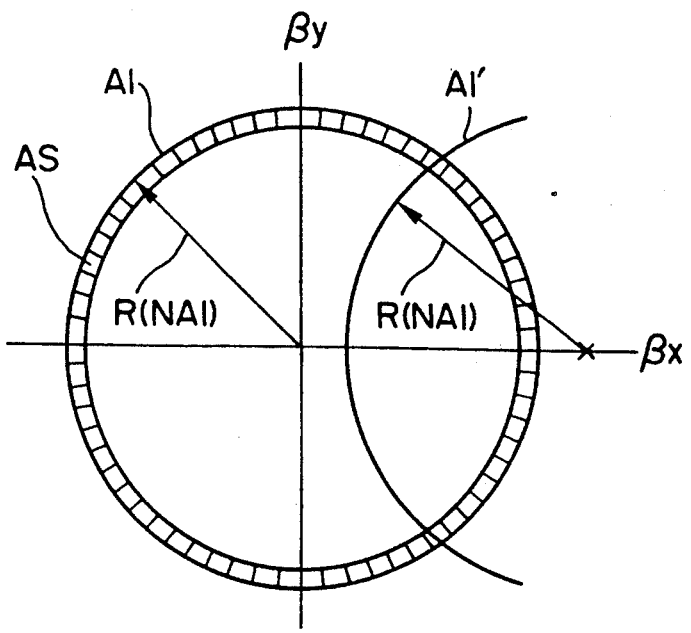
FIGS. 3(a) and 3(b) are views for explaining resolution in an axially symmetrical oblique incidence illumination method according to another embodiment of the present invention.

If symmetry of the mask pattern about the optical axis is required, oblique illumination light corresponding to the numerical aperture NA1 with respect to the optical axis must be isotopically (axial symmetry) incident on the mask. At this time, the illumination light has a small annular shape, as shown in FIG. 3(a), and its optical transfer function OTF is given as follows:

$$f(k) = (1/\pi)\cos^{-1}(k/2k_1) \qquad (6)$$

Figure 3B:
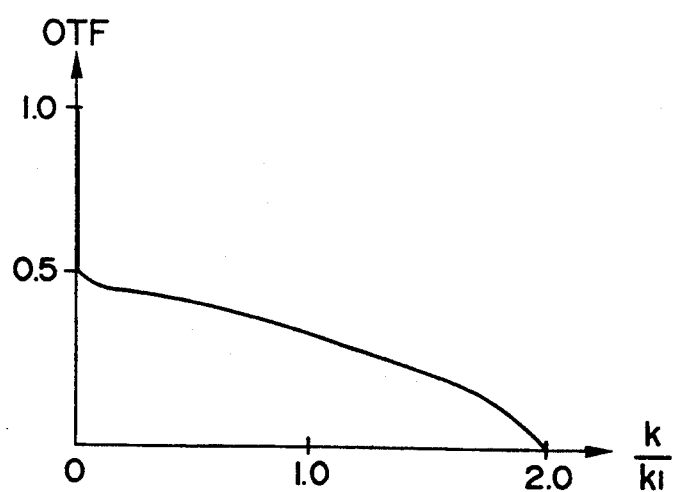

This is shown in FIG. 3(b). As compared with the normal illumination method including components parallel to the optical axis and inclined at a given inclination angle, harmonic components are slightly reduced. However, a large value up to the maximum harmonic wave number can be maintained, which is superior to the normal illumination method.

If the numerical aperture of the illumination light is not caused to accurately correspond to that of the optical projection lens system, no large difference from normal partially coherent illumination is obtained even if an annular illumination system is used, as is apparent from the OTF calculation described above.

A method of further improving imaging characteristics and increasing the contrast will be described below.

Figure 4:
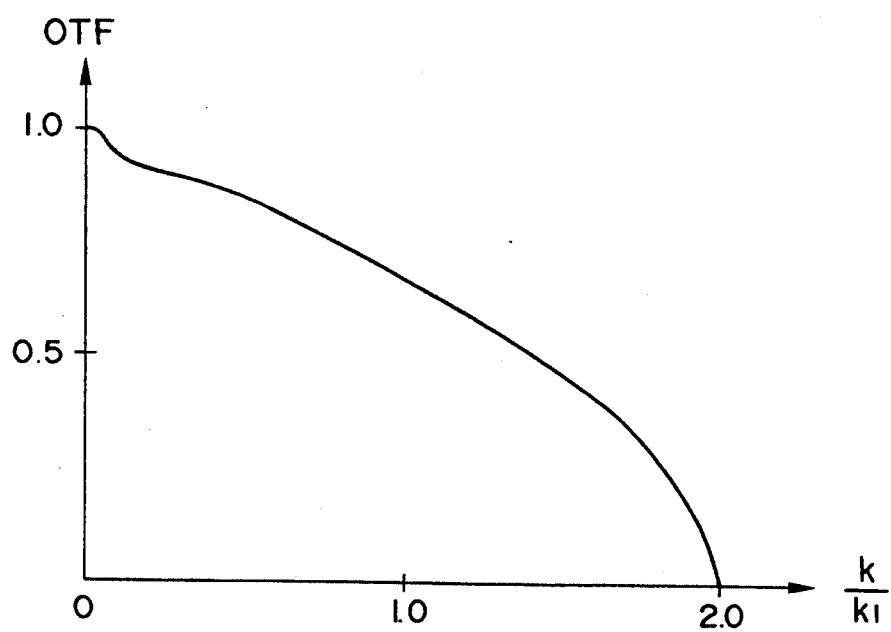
FIG. 4 is a graph showing an OTF when an amplitude transmittance on an arc of the peripheral portion of the optical projection lens aperture according to the present invention is 50%.

An OTF component for k=0 in FIG. 3(b) is extremely large, and this indicates that a DC component of a spatial frequency component of a pattern is large, thereby decreasing the contrast. This DC component can be removed when the DC component of the oblique incident illumination passes by the periphery of the aperture of the optical projection lens. Since higher-order components of the pattern also pass by this peripheral portion, the transmittance of the peripheral portion must be set in consideration of a relationship between the resolution and the contrast in correspondence with oblique incidence illumination. If this aperture of the optical projection lens is used, better imaging characteristics can be obtained. The aperture of the optical projection lens represents a portion of an aperture stop mounted at a position where a light source image is focused in the optical projection lens system. FIG. 4 shows the OTF obtained when only the arc of the peripheral portion of the aperture of the optical projection lens has an amplitude transmittance of 50%.

Figure 5A:
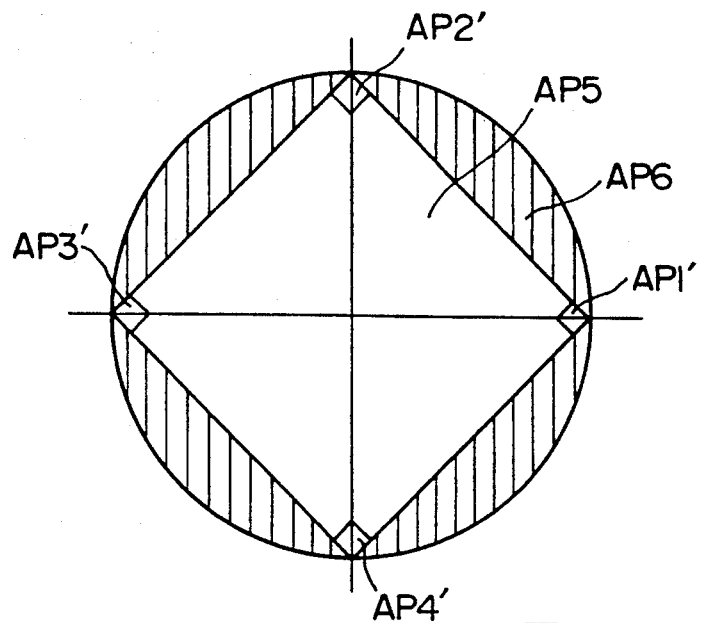
FIGS. 5A and 5B are views showing an optical projection lens aperture to improve the contrast in the 4-point oblique incidence illumination method according to the present invention.
Figure 5B:
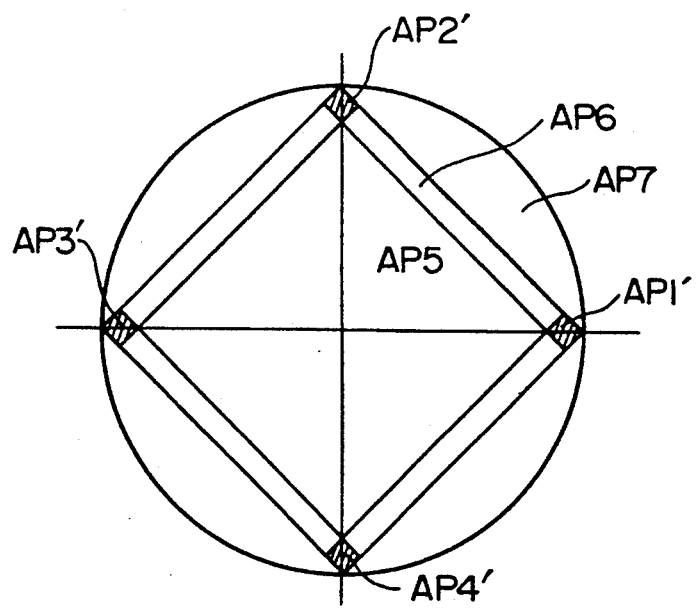

In order to remove a DC component having an OTF spike DC component in FIG. 2(b) in four-point oblique incidence illumination method shown in FIGS. 2(a) and 2(b), an aperture of an optical projection lens shown in FIGS. 5A and 5B is used.

AP1', AP2', AP3', and AP4' in FIG. 5A are portions corresponding to oblique incidence illumination points, and the amplitude transmittance of these portions is set to be "½". A square area represented by AP5 has an amplitude transmittance of "1". Four semicircular areas represented by AP6 are set not to transmit light, i.e., have a transmittance of "0". When this aperture of the optical projection lens is used, the contrast can be improved.

AP1', AP2', AP3', and AP4' in FIG. 5B are portions corresponding to the oblique incidence illumination points as in FIG. 5A, and an amplitude transmittance of these portions is set to be ¼. Four elongated rectangles represented by AP6 have an amplitude transmittance of ½. A square area represented by AP5 has a transmittance of 1/1. Four semicircular areas represented by AP7 do not transmit light therethrough. The contract can be improved even if this aperture of the optical projection lens is used.

If the numerical aperture of the illumination light is not caused to accurately correspond to that of the optical projection lens system, no large difference from normal partially coherent illumination is obtained even if an annular illumination system is used, as is apparent from the OTF calculation described above.

The OTF used in the above description will be described. A transmission cross-coefficient must be used in a partially coherent light source. This is a function having two sets of wave numbers and depends on types of patterns. For this reason, the OTF is defined by the transmission cross-coefficient having one variable by eliminating pattern dependency and is used in the above description.

Figure 6A:
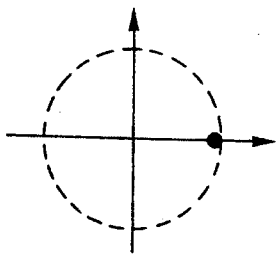
Figure 6:
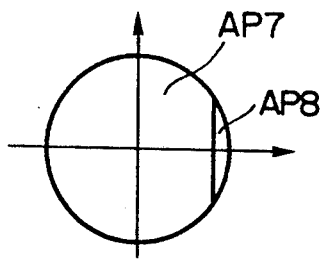
Figure 6B:
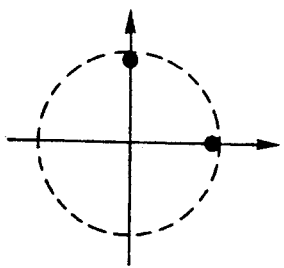
Figure 6:
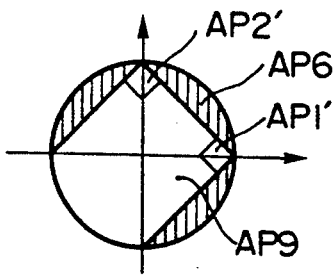
Figure 6C:
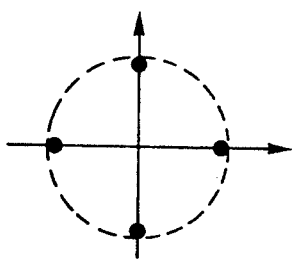
Figure 6:
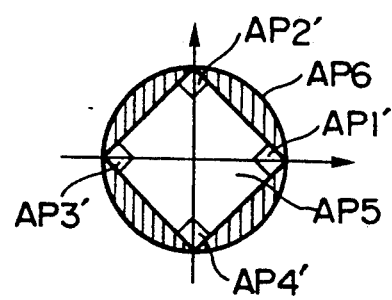
Figure 6D:
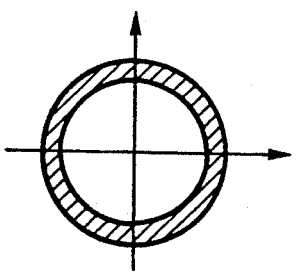
Figure 6:
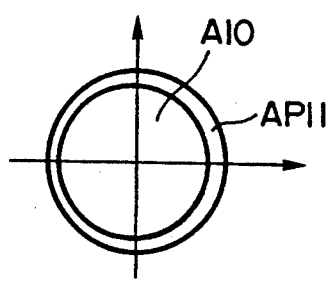

A relationship between the light source layout and the transmittances of the apertures of the optical projection lenses is shown in FIGS. 6(a) to 6(dl). FIG. 6(a) shows a case in one-point oblique incidence illumination, FIG. 6(b) shows a case in two-point oblique incidence illumination, FIG. 6(c) shows a case in four-point oblique incidence illumination shown in FIG. 5A, and FIG. 6(d) shows a case using an annular illumination system. FIGS. 6(al) to 6(dl) show transmittances of the apertures of the optical projection lenses corresponding to the light sources in FIGS. 6(a) to 6(d), respectively. More specifically, FIG. 6(al) shows the aperture of an optical projection lens in which an almost circular area AP7 corresponding to the oblique incidence illumination point has a transmittance of "1", and an arcuated area AP8 corresponding to the oblique incidence illumination point has a transmittance of "½". FIG. 6(bl) shows the aperture of an optical projection lens in which portions AP1' and AP2' corresponding to the oblique incidence illumination points have a transmittance of "½", an almost rectangular area AP9 has a transmittance of "1", and three semicircular areas AP6 have a transmittance of "0". FIG. 6(cl) shows the aperture of an optical projection lens in which a circular area AP10 has a transmittance of "1", and an annular area AP11 has a transmittance of "½".

The above description has been made to clarify the basic principle of the present invention. An optical system of a practical optical reduction projection exposure system will be supplementarily and generally described below.

Figure 7:
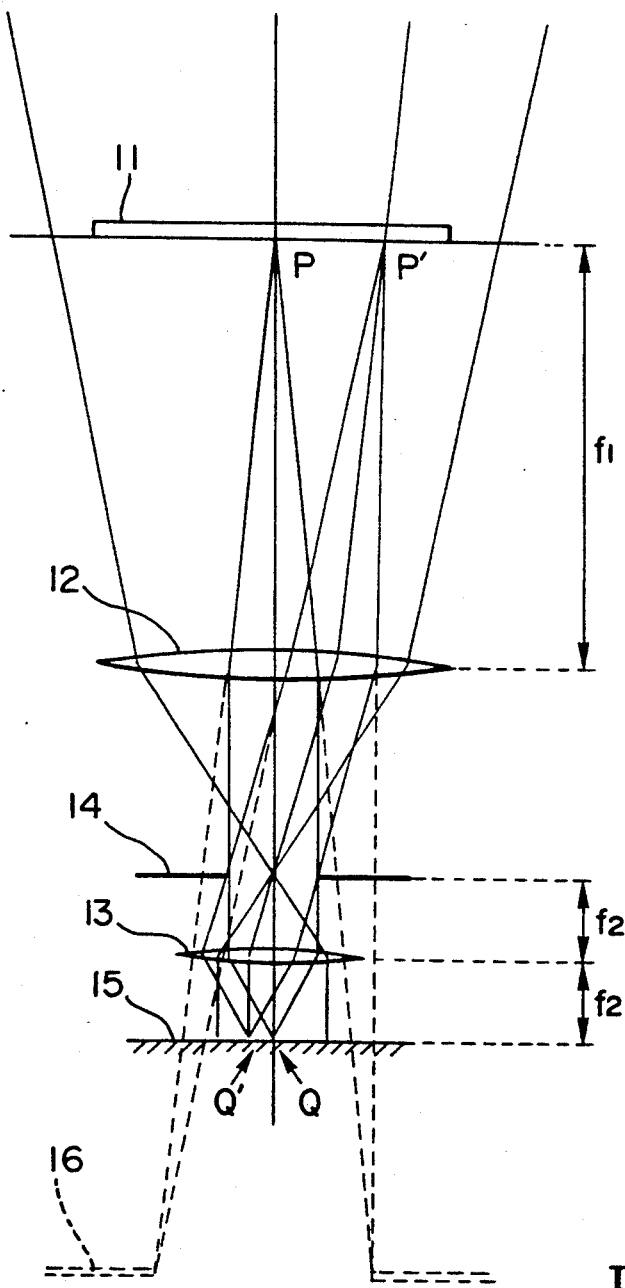
FIG. 7 is a schematic view of an optical system for forming an image on a wafer surface upon incidence of illumination light from a point light source on a mask pattern through a condenser lens.

FIG. 7 shows a basic arrangement of an optical system in which illumination light from a point light source is slightly conversed using a condenser lens (not shown) and illuminates a mask pattern (reticle) 11 to form an image on a wafer surface 15. The optical projection lens system is divided into a first lens system 12 and a second lens system 13 in view of its functions. Each of the first and second lens systems 12 and 13 is illustrated as a single lens in FIG. 7. In practice, however, each lens system is constituted by a plurality of lenses for optimization for aberration and the like. From the viewpoint of the lens functions, each lens can be represented by a single lens.

An aperture stop 14 is located between the first and second lens systems 12 and 13. In a normal state, an image of an illumination point light source is focused at the center of the aperture stop 14. An image (virtual image) at the aperture stop 14 which is observed through the first lens system 12 is called an entrance pupil. Rays diffracted (from points p and p') by the mask pattern 11 can pass through the optical projection lens system within the angular range including the entrance pupil 16 and contribute to image formation on the wafer surface 15. Note that the entrance pupil is infinitive upward.

The aperture A showing the basic principle, as shown in FIG. 1, actually indicates the entrance pupil described above. Since an telecentric optical system in which a principal ray passing through the center of the aperture stop 14 is perpendicular to the wafer surface 15 is used in an imaging unit, the aperture stop 14 and the wafer surface 15 are located at the illustrated positions with respect to a focal length $f_2$ of the second lens system 13. When a reduction magnification is 1/5, the mask pattern (reticle) 11 is located at the position of the focal length $f_1$ of the first lens system 12, so that $f_1/f_2 \approx 5$.

FIG. 7 shows a state in which diffracted rays from the point p on the optical axis and the point p' outside the optical axis of the mask pattern 11 are focused at Q and Q' on the wafer surface 15. These rays are parallel rays between the first and second lens systems 12 and 13.

When the aperture stop 14 is taken into consideration, a diffracted ray having the largest diffraction angle does not depend on the positions c and p' on the mask pattern 11 and passes by the peripheral portion of the aperture stop 14. That is, the aperture stop 14 corresponds to a Fourier transform plane of the mask pattern 11.

In order to improve imaging characteristics by adjusting the transmittance of the aperture of the optical projection lens, a filter is arranged at the aperture stop 14 to adjust the light transmittance. Therefore, as can be easily understood, the imaging characteristics (contrast) can be improved on the entire surface of the mask pattern 11.

Figure 8:
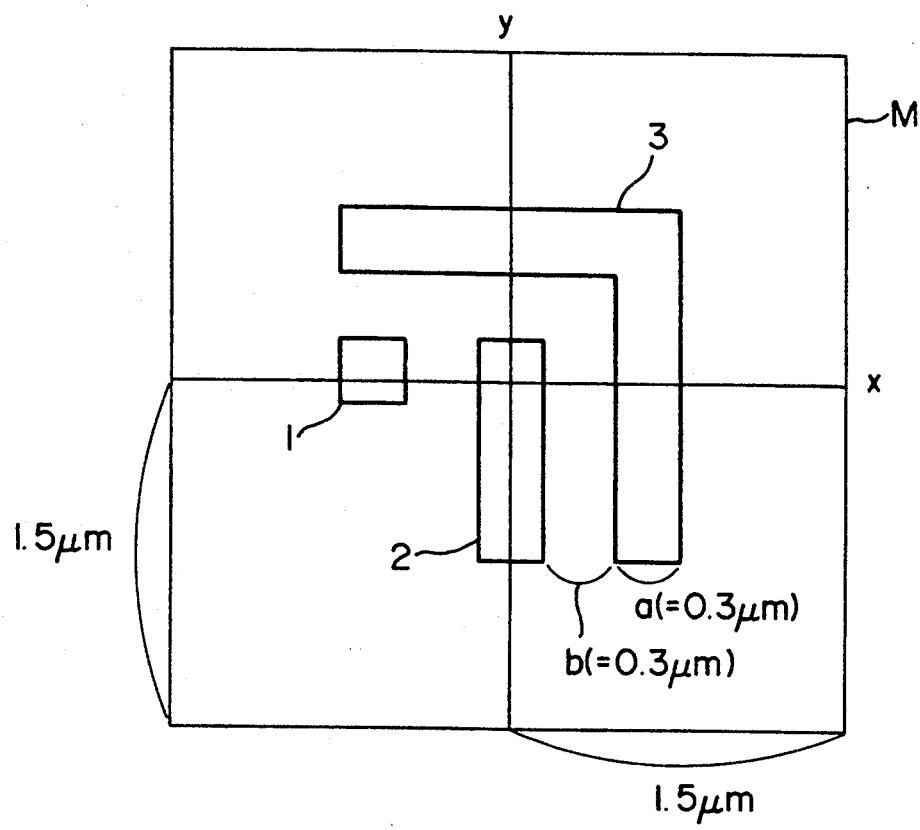
FIG. 8 is a view showing a mask pattern used in the embodiments.

This embodiment according to the present invention will be exemplified by numerical values below. FIG. 8 shows the mask pattern 11 (M). Rectangular portions represented by patterns 1 to 3 are transparent regions, and the remaining region is an opaque region. This mask pattern is based on an assumption that a 3 $\mu$m $\times$ 3 $\mu$m area is periodically and infinitely arranged in the x and y directions. A width a of each pattern is 0.3 $\mu$m, and a distance b between the patterns is 0.3 $\mu$m.

Figure 9A:
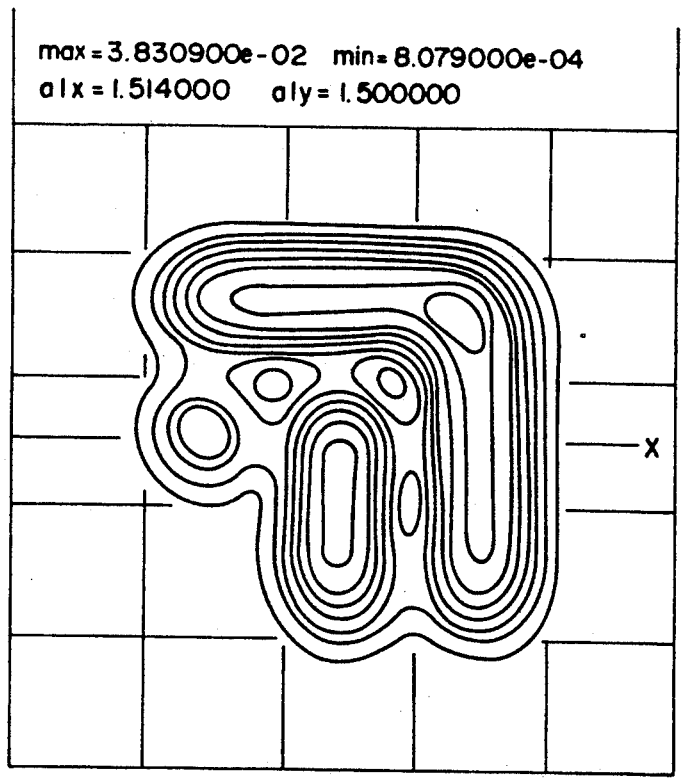
FIGS. 9(a) and 9(b) are graphs showing a light intensity distribution of an image obtained by the oblique incidence illumination method of the present invention.
Figure 9B:
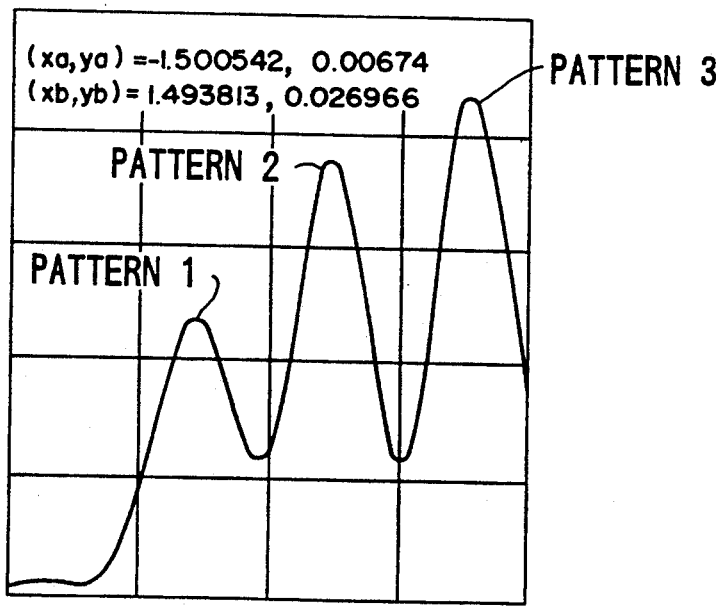

FIGS. 9(a) and 9(b) show a numerical embodiment in which an oblique incidence illumination range is defined as NAs=0.37 to 0.40, a numerical aperture of an optical projection lens is set to be NA1 =0.40, a light wavelength $\lambda$ is set to be $\lambda$=0.365 $\mu$m, and a reduction magnification is set to be 1/1. FIG. 9(a) shows contour lines of light intensity distributions of the 3 $\mu$m$\times$3 $\mu$m area on the image plane. A maximum intensity value max and a minimum intensity value min are indicated as max=3.830900e−02 and min=8.079000e−0.4. Contour values obtained by dividing the (0−max) value by 10 are plotted as thick contour lines. The coordinate origin is located at the center of the display frame. A distance alx up to the end of the frame in the x direction and a distance aly in the y direction are represented in units of $\mu$m. FIG. 9(a) is a graph of a light intensity distribution when viewed along the line in the x-direction line represented by a mark x in FIG. 9(a). Patterns 1 to 3 correspond to patterns denoted by numerals 1 to 3 in FIG. 8, respectively. Numerical values represented as (xa,ya) and (xb,yb) are coordinate values of both ends of a line segment represented by the mark x in FIG. 9(a) in units of $\mu$m. More specifically, (xa,ya)= −1.500542, 0.00674, and (xb,yb)=1.493813, 0.026966.

As is apparent from FIGS. 9(a) and 9(b), the light intensities are decreased in an order of pattern 3, pattern 2, and pattern 1. When a photosensitive resist film formed on a substrate is exposed using this light intensity distribution, it is estimated to obtain an almost limit condition, although whether or not the developed pattern 1 is resolved or not depends on a resist system.

Figure 10A:
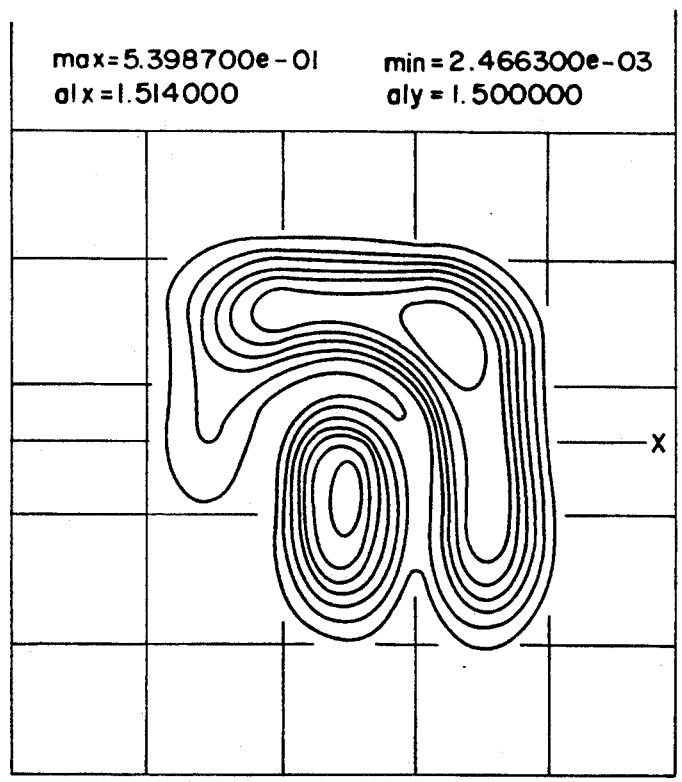
FIGS. 10(a) and 10(b) are graphs showing a light intensity distribution of an image obtained by a conventional phase-shifting mask method.
Figure 10B:
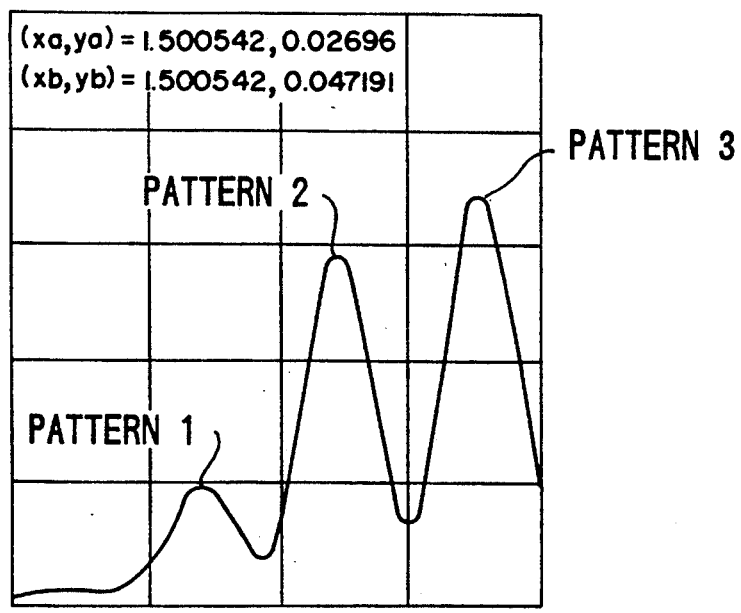

FIGS. 10(a) and 10(b) show a light intensity distribution of an image when pattern 1 and pattern 3 are not modified and a phase shifter for shifting a phase by $\pi$ is added to pattern 2. The imaging conditions are substantially the same as those of FIG. 9(a) and 9(b) except that NAs=0.0 to 0.2. As is apparent from FIG. 10(a), pattern 1 is continuous with pattern 3, and they are not resolved because pattern 1 is in phase with pattern 3. The phase-shifting mask method makes it difficult to obtain a 0−$\pi$ phase relationship.

Figure 11A:
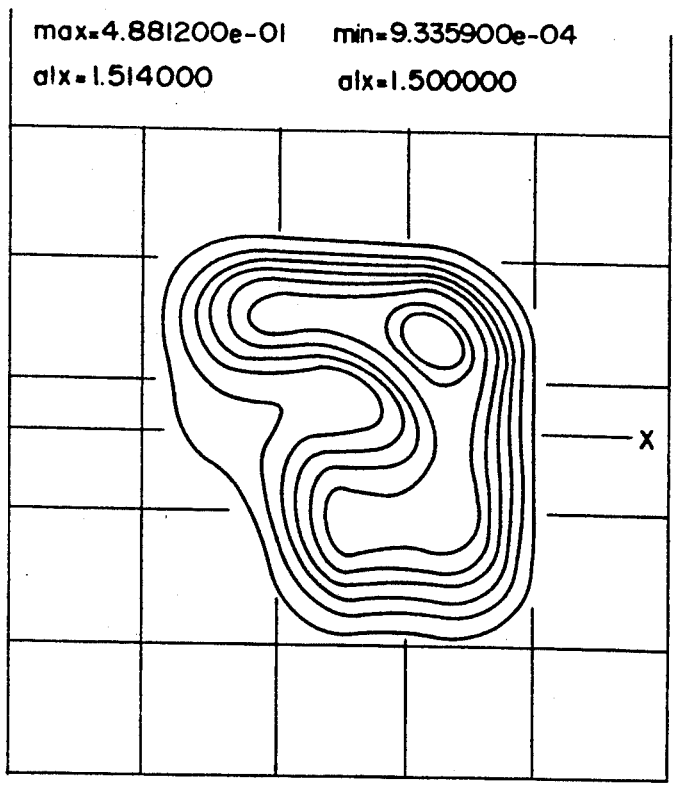
FIGS. 11(a) and 11(b) are graphs showing a light intensity distribution of an image obtained by a normal illumination method.
Figure 11B:
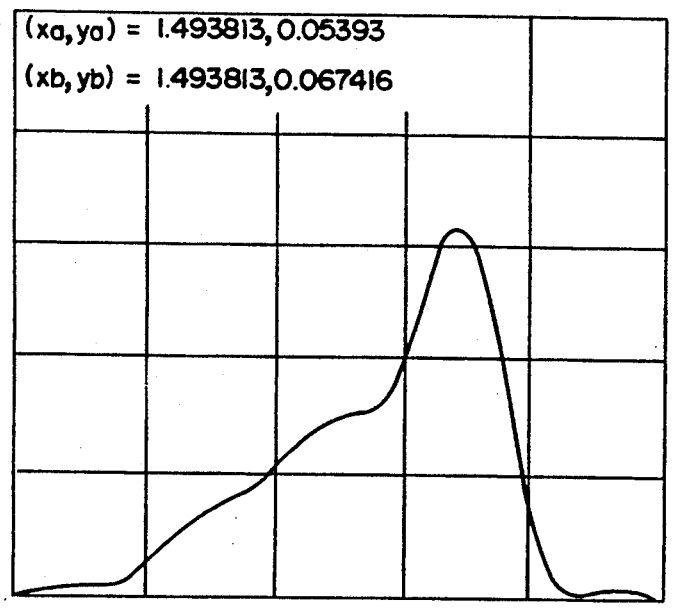

FIGS. 11(a) and 11(b) show a light intensity distribution when the mask (FIG. 8) which is not phase-shifted is subjected to an imaging operation under the same optical conditions as in FIGS. 10(a) and 10(b). Patterns 1, 2, and 3 are not resolved.

Figure 12A:
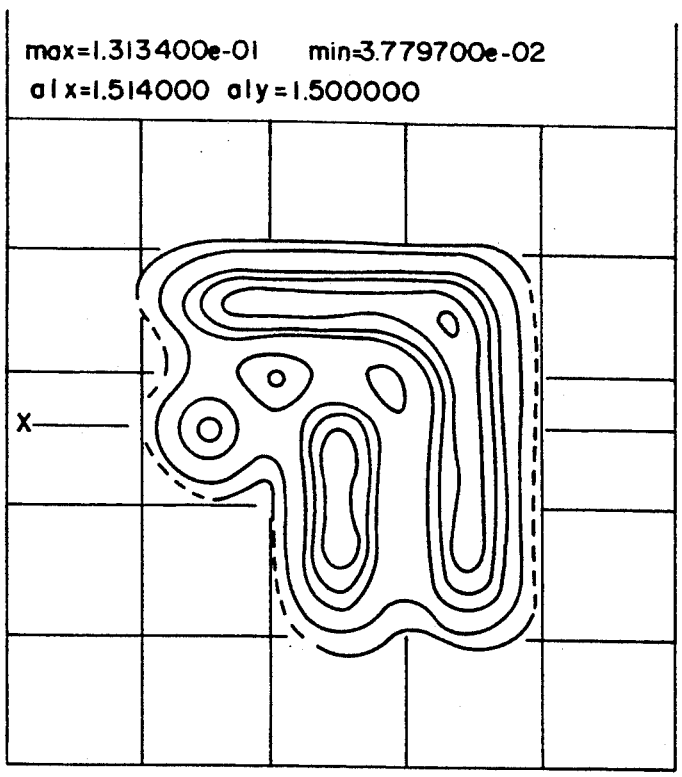
FIGS. 12(a) and 12(b) are graphs showing a light intensity distribution of an image obtained using an inversion mask according to the present invention.
Figure 12B:
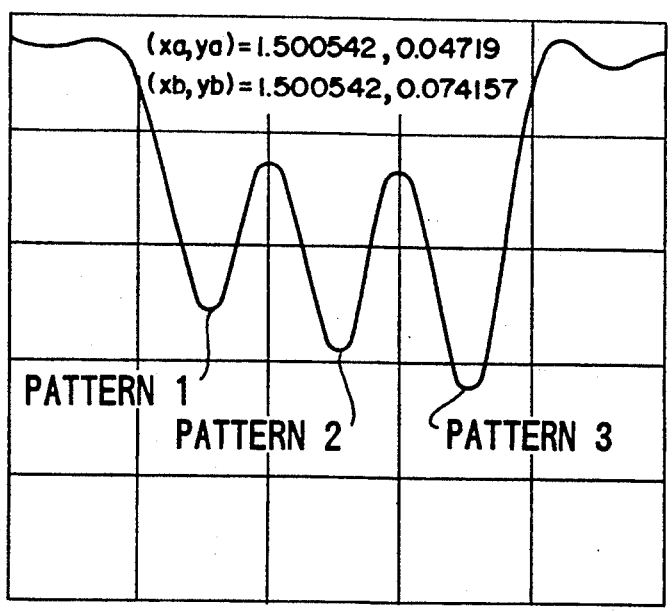

FIGS. 12(a) and 12(b) show a light intensity distribution obtained using an inversion mask for causing patterns 1, 2, and 3 not to transmit light therethrough and causing a peripheral portion to transmit light when the oblique incidence illumination method according to the present invention is used. The imaging conditions are the same as those in FIGS. 9(a) and 9(b).

Figure 13A:
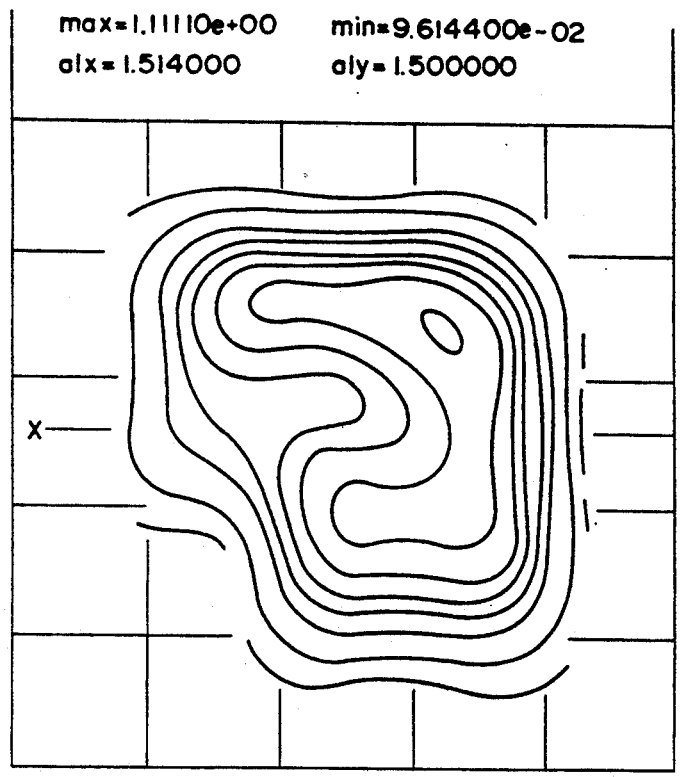
FIGS. 13(a) and 13(b) are graphs showing a light intensity distribution of an image obtained by a normal method using an inversion mask.
Figure 13B:
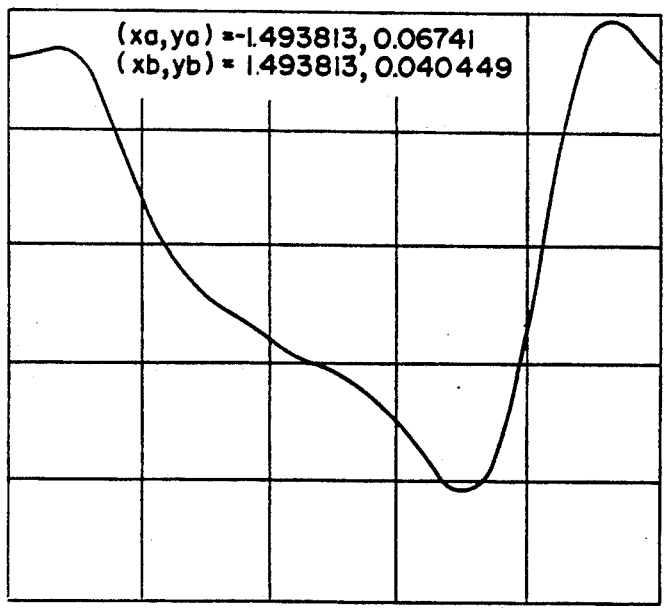

FIGS. 13(a) and 13(b) show a light intensity distribution obtained under the conditions of the normal mask as in FIGS. 12(a) and 12(b), i.e., under the same conditions as in FIGS. 11(a) and 11(b). As is apparent from comparison between FIGS. 12(a) and 12(b) and FIGS. 13(a) and 13(b), the present invention is found to be effective. An arrangement of a phase-shifting mask for this mask is not illustrated because this phase-shifting mask layout is considerably difficult.

Figure 14A:
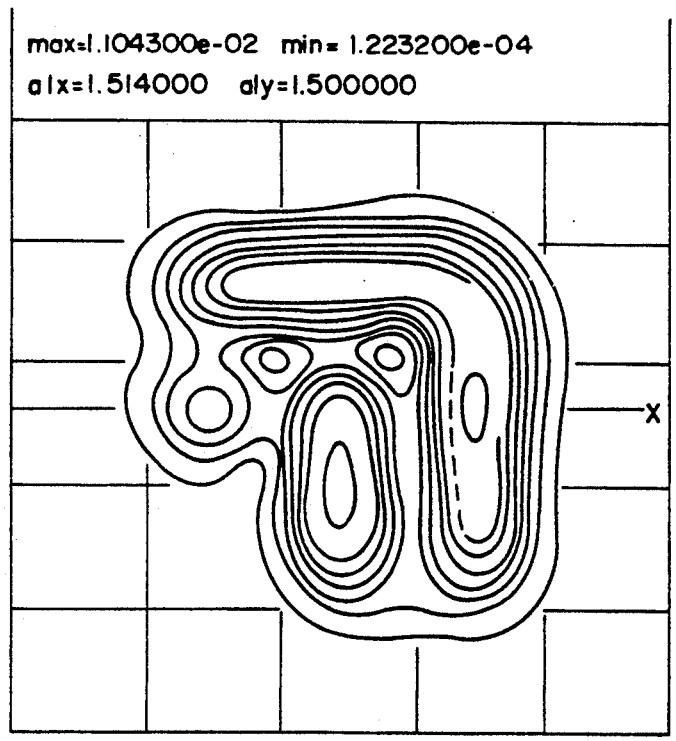
FIGS. 14(a) and 14(b) are graphs showing a light intensity distribution of an image obtained by illumination light used in the 4-point oblique incidence illumination method according to the present invention.
Figure 14B:
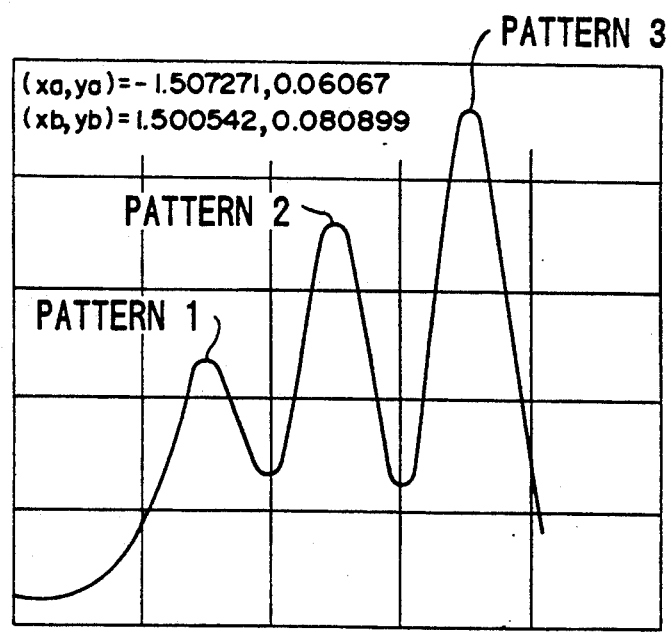

FIGS. 14(a) and 14(b) show a light intensity distribution obtained when illumination light is focused using the mask shown in FIG. 8 in accordance with the four-point oblique incidence illumination method. A square area is set for AP1 in FIG. 2(a) ($\beta$x=0.35 to 0.4 and $\beta$y=0.55 to 0.05), and the same areas as the square area are set for AP2, AP3, and AP4. As is apparent from FIGS. 14(a) and 14(b), the present invention is found to be effective as compared with the conventional method.

Figure 15A:
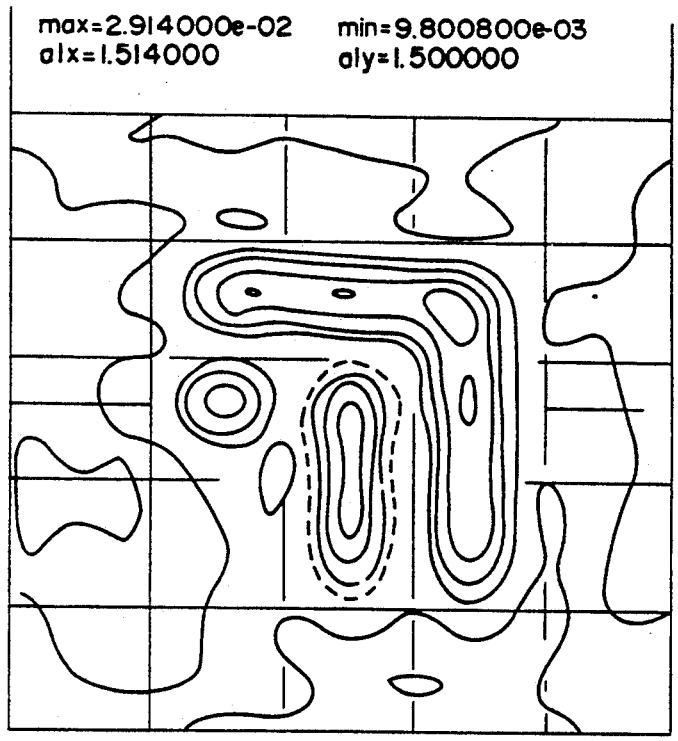
FIGS. 15(a) and 15(b) are graphs showing a light intensity distribution of an image obtained by the 4-point oblique incidence illumination method using an inversion mask according to the present invention.
Figure 15B:
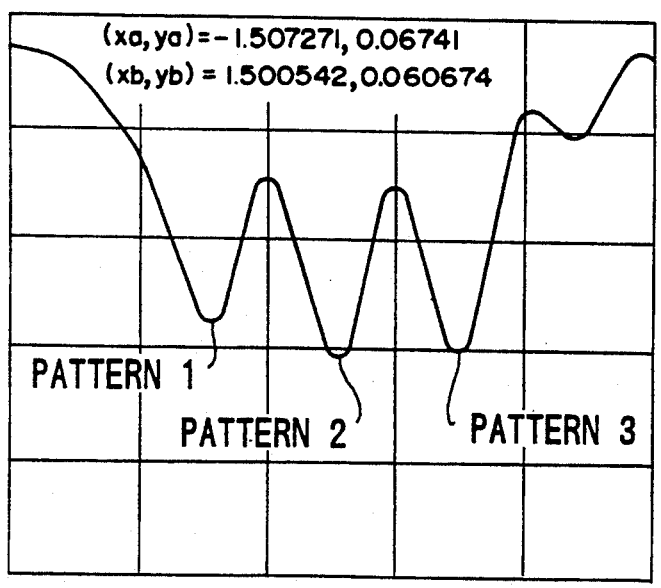

FIGS. 15(a) and 15(b) show a light intensity distribution obtained when illumination light is focused using the inversion mask (FIG. 8) having patterns 1, 2, and 3 for shielding light and a remaining portion for transmitting light therethrough in accordance with the four-point oblique incidence illumination method. As is apparent from FIGS. 15(a) and 15(b), the present invention is found to be effective as compared with the conventional method.

Another numerical embodiment in which a transmittance of an aperture of an optical projection lens is adjusted to improve the contrast will be described below.

Figure 16A:
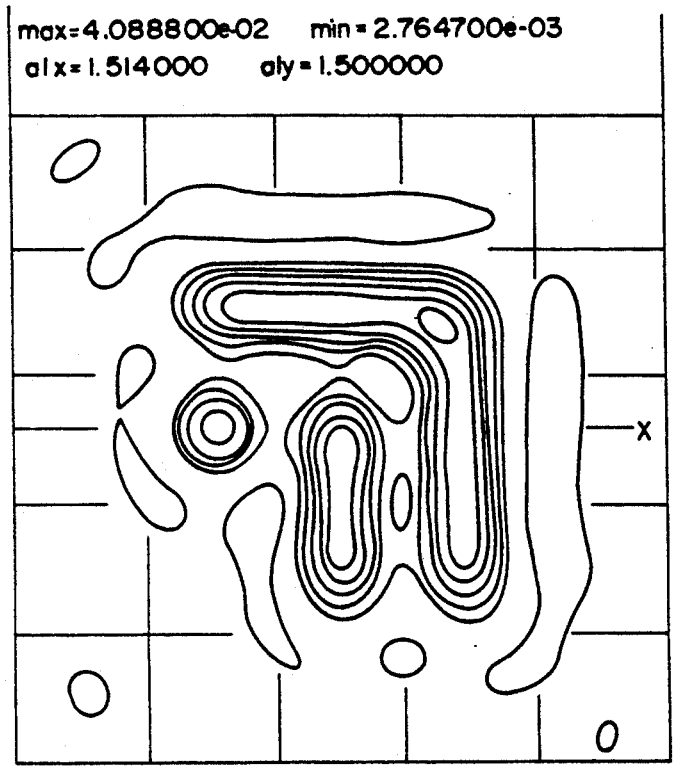
FIGS. 16(a) and 16(b) are graphs showing a light intensity distribution of an image obtained when a transmittance of the peripheral portion of the aperture of an optical projection lens is 50% and an inversion mask is used.
Figure 16B:
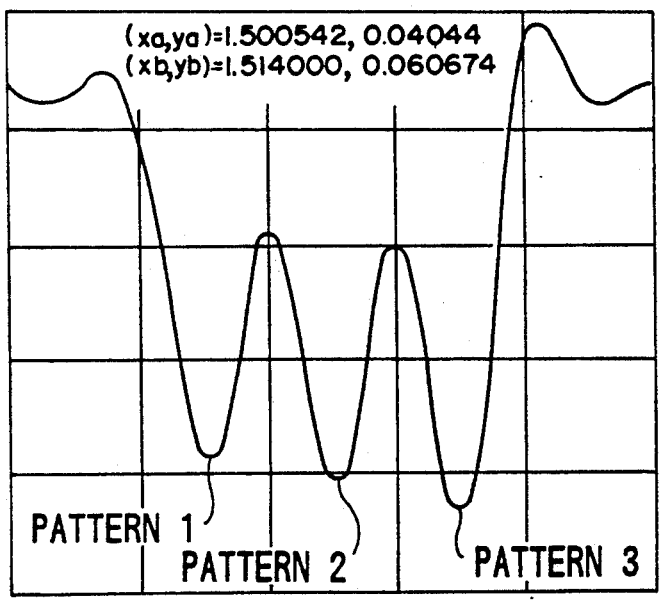

FIGS. 16(a) and 16(b) show a light intensity distribution obtained using the same inversion mask as in FIGS. 12(a) and 12(b) under the conditions that the peripheral portion of the aperture of the optical projection lens which is set to be NA1=0.37 to 0.40 has a transmittance of 50%, and a portion which is set to be NA1=0.0 to 0.37 has a transmittance of 100%. As compared with FIG. 12(b), the contrast is improved about twice, and the imaging characteristics are found to be greatly improved.

A calculation result obtained using an i-ray of a mercury-arc (Hg) lamp as a light source has been exemplified. However, a g-ray of the Hg lamp or an excimer laser may be used as a light source to obtain the same effect as described above.

Since the peripheral portion of the optical projection lens is slightly more important than the central portion of the optical projection lens according to the present invention, an influence of aberration of the lens and an influence on the depth of focus are estimated to be larger than those of the conventional method. For these reasons, an aperture stop having a slightly smaller than the numerical aperture of the maximum performance of the optical projection lens is used. In addition, when the present invention is applied while the numerical aperture is slightly reduced, the frequency range is sufficiently widened, and the depth of focus is also increased to allow optical projection exposure with little aberration.

According to the embodiment described above, the range of inclination of the illumination light used in the conventional system is set in accordance with the numerical aperture of the optical projection lens, and the optical projection lens can focus an image with a maximum resolving power. The same resolving power as in the phase-shifting mask method of the conventional system can be achieved for any pattern without using the phase-shifting mask. In particular, this embodiment has an advantage in that the resolution can be improved for a pattern having a shape which makes it difficult to arrange a conventional shifter layout. With the above arrangement, an integration density can be increased and reliability can be improved in formation of micropatterns such as an LSI pattern.

Figures 19A, 19B:
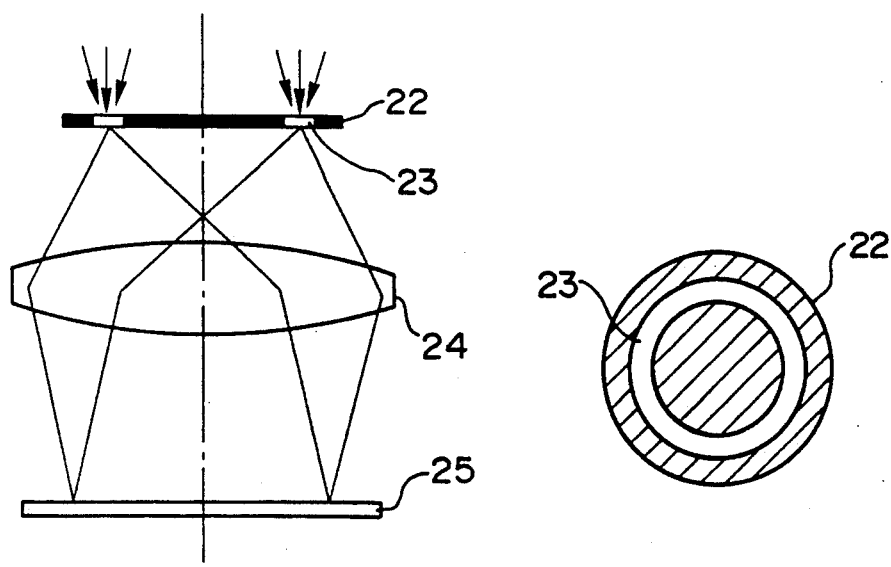
FIGS. 19(a) and 19(b) area views showing a basic arrangement of an annular light source.

Still another embodiment in consideration of a light source for applying oblique incidence illumination to the mask surface will be described below. A method using the aperture shown in FIG. 6(d) will be taken into consideration. In this case, as shown in FIGS. 19(a) and 19(b), oblique incidence illumination can be achieved utilizing an aperture 22 having an annular transparent region 23. FIG. 19(a) shows the main part of its optical system, and FIG. 19(b) is a plan view of the aperture. Reference numeral 24 denotes a condenser lens; and 25, a normal mask. In order to obtain the same effect as in the phase-shifting method, it is important to obtain illumination light inclined at an angle corresponding to the numerical aperture of the projection optical system.

If the numerical aperture of the illumination optical system is defined as $NA_S$ and the numerical aperture of the projection optical system is defined as $NA_0$, coherency of the optical projection exposure system is given as $\sigma = NA_S/NA_0$, which becomes an important factor for determining pattern formation characteristics. Even if an annular aperture is used, illumination light having coherency $\sigma = 1$ indicating that the numerical aperture of the illumination optical system is set equal to that of the projection optical system must be utilized to effectively use oblique incidence illumination. The coherency $\sigma$ of the optical projection exposure system used in pattern formation of integrated circuits is determined by the required resolution and the required depth of focus and generally falls within the range of 0.4 to 0.6. For this reason, a sufficient oblique incidence illumination effect cannot be obtained even if the aperture of the existing system is changed.

Although utilization of the annular aperture is important to realize oblique incidence illumination, an illumination optical system having coherency $\sigma = 1$ is required. When an existing exposure system is used, it must be greatly modified. Even if such a modification is made, it is difficult to simultaneously establish a normal exposure condition representing coherency $\sigma = 0.5$ and the above exposure condition due to a decrease in light a mount and uniformity of the illumination intensity. A proposal of an illumination optical system having a variable coherency $\sigma$ is made in correspondence with an examination of the phase-shifting method. This aims at a decrease in coherency $\sigma$ and is not compatible with oblique incidence illumination having $\sigma = 1$.

In order to solve this problem, a mask illumination optical system is set such that an optical device such as a phase grating or the like having a periodic structure is located immediately above a mask, and that illumination light is inclined at an angle corresponding to the numerical aperture of the projection optical system with respect to the optical axis. This arrangement will be described with reference to FIGS. 20 to 26(b) below.

Figure 20:
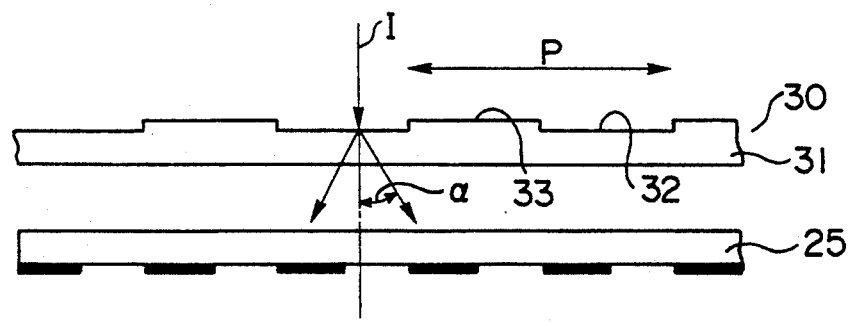
FIGS. 20 to 26(b) are views showing still another embodiment using a phase grating type optical device having a periodic structure as a light source.

An optical device 30 having a periodic structure in FIG. 20 comprises a phase grating plate 31 having a period p. The width of each recess 32 and the width of each projection 33 are equal to each other to be p/2, and a phase difference between light passing through the recess 32 and light passing through the projection 33 is set to be $\pi$. In this phase grating plate 31, the zero-order diffracted ray ideally has an intensity of zero, and only 1st-order or more diffracted rays. If the period p is selected such that ±1st-order diffraction angles are set to angles corresponding to the projection optical system and that the optical device 30 having the phase grating plate 31 is arranged immediately above a normal mask 25 so as to cause the optical device 30 to cover the entire pattern area of the mask 25, oblique incidence illumination on the mask 25 from two directions can be realized using the vertical illumination light I.

An operation utilizing a prism will be described with reference to FIG. 21. A vertex angle $\phi$ of a prism 36 is determined such that vertical incident light I inclined at an angle corresponding to the numerical aperture of the projection optical system, and the prism 36 is inserted immediately above a mask 25. Under these conditions, oblique incidence illumination from one direction can be realized.

These embodiments will be exemplified using numerical values. When an optical projection exposure system is set under the conditions that the numerical aperture of the optical projection lens is set to be $NA_0 = 0.5$ and a reduction magnification is set to be 1/5, an illumination angle α of the illumination system corresponding to the projection optical system is defined as follows:

$$sin\alpha = (1/5)*0.5 = 0.1 \quad (7)$$

therefore $\alpha \approx 5.7°$. Exposure light is given as a g-ray of the high-pressure mercury-arc lamp, and a wavelength is set to be $\lambda = 436$ nm. These parameter values vary depending on a system used.

FIG. 20 shows a basic arrangement according to still another embodiment of the present invention. This embodiment exemplifies use of a phase grating plate. In this embodiment, since the 1st-order diffraction angle of the phase grating plate 31 is set to be equal to α, a period (pitch) p of the grating based on the vertical incident light I is defined as follows:

$$p*sin\alpha = \lambda \quad (8)$$

therefore $p = 4.36$ μm. This period is equal to ten times the wavelength. The structure of the phase grating plate 31 is given such that a phase difference between the recess 32 and the projection 33 is set to be π, and the lengths of the recess 32 and the projection 33 are equal to each other to be p/2. If a transfer area of the optical projection exposure system is given as 15 mm × 15 mm, a pattern on the mask 25 falls within the area having a size of 75 mm × 75 mm. The size of the grating plate 31 is required to cover this area, e.g., 80 mm × 80 mm.

The pattern of the grating plate 31 can be drawn using an electron beam as in the pattern of the mask 25. In order to set a phase difference π, a substrate on which a grating is formed may be directly etched, or an oxide film or the like may be formed on a substrate, and the substrate may be etched. Such a grating can be easily manufactured by using the state-of-the-art IC processing techniques.

As is apparent from the above principle, the optical device 30 on which the phase grating plate 31 is formed may be directly placed on the mask 25. However, since light interferes between the lower surface of the grating substrate and the upper surface of the mask substrate to form fringes, the optical device 30 is preferably spaced apart from the mask 25 by an appropriate distance, e.g., 5 mm. With the above arrangement, oblique incidence illumination from the two directions can be achieved.

Figure 22:
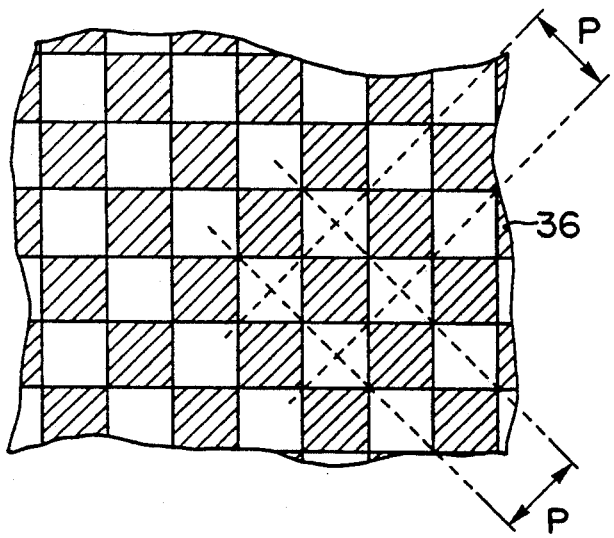

FIG. 22 shows part of a two-dimensional grating element 36 obtained by two-dimensionally arranging a grating as the optical device of the above arrangement. A planar pattern of the grating is a checkerboard pattern. Hatched portions correspond to recesses, and non-hatched portions correspond to projections. In this embodiment, a fundamental period p of the grating is given as illustrated, and a 1st-order diffraction angle is determined by this pitch. Oblique incidence illumination from four directions can be achieved using the two-dimensional grating element 36.

Figure 21:
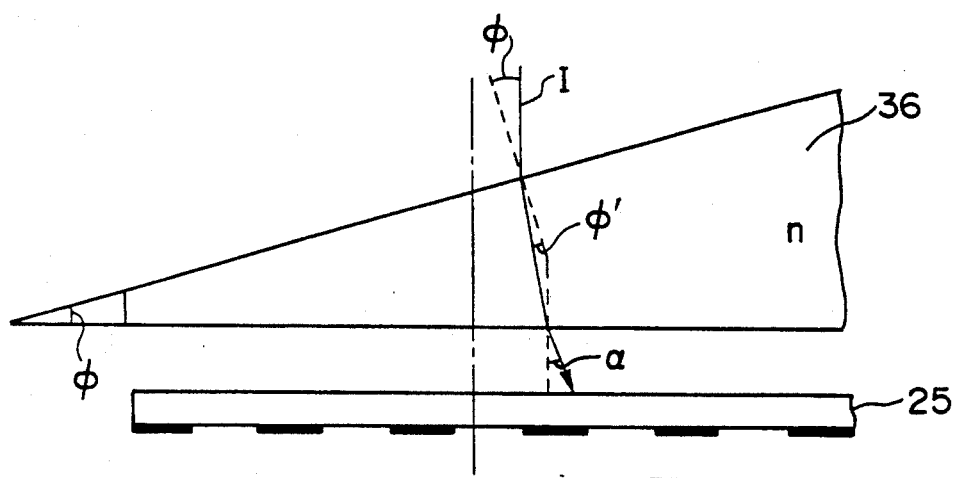

FIG. 21 shows still another embodiment using a prism 36 as an optical device. A refractive index of the prism material is defined as n and an incident angle is defined as φ, the following relations are established between α and φ:

$$sin\phi = n*sin\phi' \quad (9)$$

$$n*sin(\phi-\phi') = sin' \quad (10)$$

If the refractive index of quartz glass is given as $n=1.465$, and $sin\alpha = 0.1$, then $\phi = 12.2$. The prism 36 is located immediately above the mask 25 and operated to obtain the same effect as in FIG. 20. In this case, oblique incidence illumination from one direction can be performed.

Figure 23A:
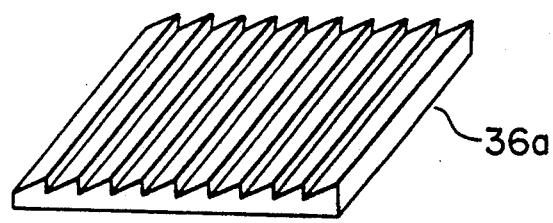
Figure 23B:
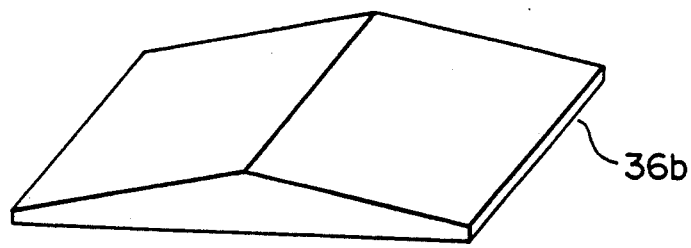
Figure 23C:
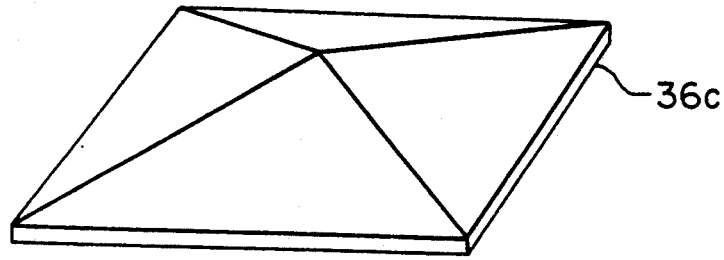
Figure 23D:
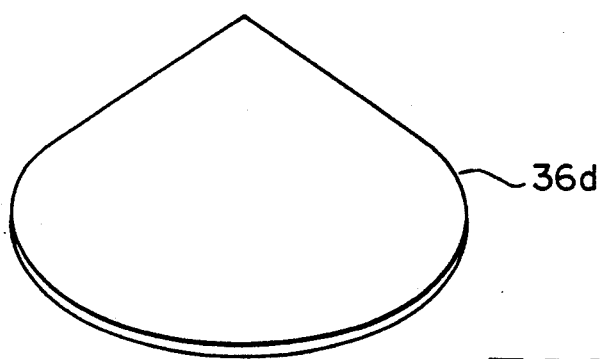

FIGS. 23(a) to 23(d) respectively show various prisms 36a to 36d used in oblique incidence illumination of the present invention. FIG. 23(a) shows a prism having a small height by periodically repeating an inclined surface, FIG. 23(b) shows a roof-like prism which allows oblique incidence illumination from two directions, FIG. 23(c) shows a pyramidal prism which allows oblique incidence illumination from four directions, and FIG. 23(d) shows a conical prism which allows oblique incidence illumination of axial symmetry. In each of the prisms 36b to 36d respectively shown in FIGS. 23(b), 23(c), and 23(d), in order to focus rays from two or four points on the prism to one point on the mask, the prism has a size larger than the pattern area on the mask, and a distance between the prism and the mask must be large. Low-profile arrangements each obtained by periodically repeating an inclined surface can be obtained in the prisms shown in FIGS. 23(b), 23(c), and 23(d).

Figure 24:
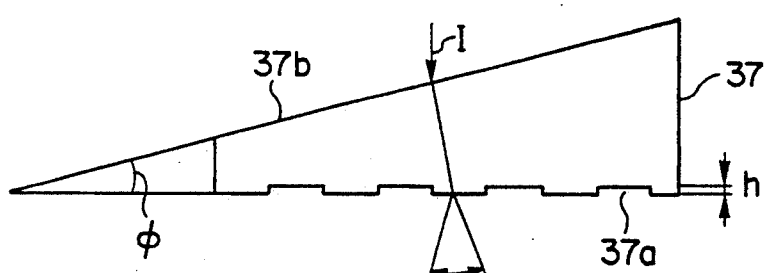

FIG. 24 shows still another embodiment. In this embodiment, oblique incidence illumination from two directions can be achieved using an optical device 37 constituted by a grating 37a and a prism 37b. Mask illumination can be performed using only a zero-order diffracted ray $I_0$ and a +1st-order diffracted ray $I_{+1}$ of the grating. A depth h of the grating 37a is properly selected to increase the intensity of the 1st diffracted ray. The amount of higher-order diffracted rays can be reduced because the diffraction angle can be set to be 2α, thereby effectively performing oblique incidence illumination. According to this method, even if any defect or fabrication error is present in the grating 37a, an illumination light component perpendicular to the mask surface is not advantageously present.

Figure 25:
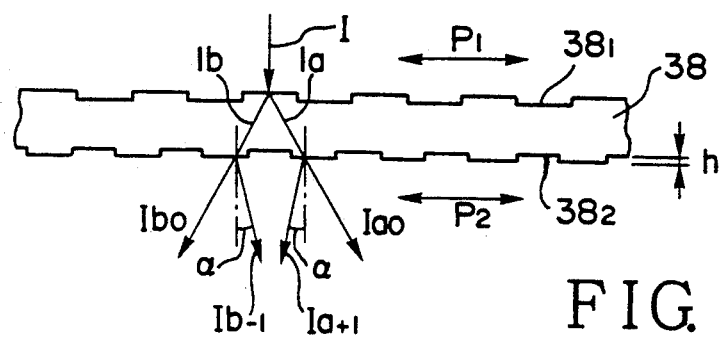

FIG. 25 shows still another embodiment of the present invention. This embodiment uses a grating device 38 consisting of two gratings $38_1$ and $38_2$. This device 38 may be obtained by stacking two substrates each of which has a grating on one surface thereof. However, in order to effectively use incident light, the gratings $38_1$ and $38_2$ are formed on both surfaces of one substrate. At this time, the refractive index of the substrate is defined as n, and a pitch $p_1$ of the grating $38_1$ on the light source side, a pitch $p_2$ of the grating $38_2$ on the mask side, a diffraction angle, and the like are defined as shown in FIGS. 6(a) to 6(dl). Referring to FIG. 25, reference numerals Ia and Ib denote −1st- and +1st-order diffracted rays produced by the grating $38_1$. The zero-order diffracted ray from the lower grating $38_2$ upon incidence of the −1st-order diffracted ray Ia is defined as $Ia_0$, and the +1st-order diffracted ray from the lower grating $38_2$ upon incidence of the −1st-order diffracted ray Ia is defined as $Ia_{+1}$. Similarly, zero- and 1st-order diffracted rays upon incidence of the ray Ib are respectively defined as $Ib_0$ and $Ib_{-b}$.

If a wave having a wavelength λ in a vacuum is incident from a medium having a refractive index $n_{in}$ on a grating having a pitch p at an incident angle $\theta_{in}$ and is diffracted by a medium having a refractive index $n_{out}$ at a diffraction angle $\theta_{out}$, the following relation is obtained for m as an arbitrary integer:

$$p(n_{in}*sin\theta_{in} - n_{out}*sin\theta_{out}) = m\lambda \quad (11)$$

In order to perform oblique incidence illumination, $sin\alpha = 0.1$, $n = 1.465$, and $\theta_1 = 30°$ are exemplified. From the above equation, $p_1 = 595$ nm and $p_2 = 524$ nm. The diffraction angle is set large at the grating $38_1$ having the pitch $p_1$ to increase the intensities of the $-1$st- and $+1$st-order diffracted rays Ia and Ib. The $\pm 1$st-order diffracted rays are utilized at the grating $38_2$ having the pitch $p_2$ to obtain a desired oblique incidence illumination angle. The grating $38_2$ having the pitch $p_2$ is formed such that the depth h of the grating is selected so as to increase the intensities of the $\pm 1$st-order diffracted rays $Ia_{-1}$ and $Ib_{-1}$.

In the arrangement of the grating device 38 shown in FIG. 25, since the diffraction angle can be arbitrarily increased, it is possible to increase the intensities of diffracted rays to be used. In this case, a phase difference x is set in the grating $38_1$ having the pitch $p_1$ to eliminate the zero-order diffracted ray. Since the pitch p: is equal to the wavelength, the width of the projection must be smaller than $p_1/2$. In addition to the case in FIG. 25, when the pitch of a grating is less than about four times the wavelength, the width of a projection must be smaller than half the pitch.

The optical devices themselves used in the present invention have been described above, and oblique incidence illumination angles will now be described.

Figure 26A:
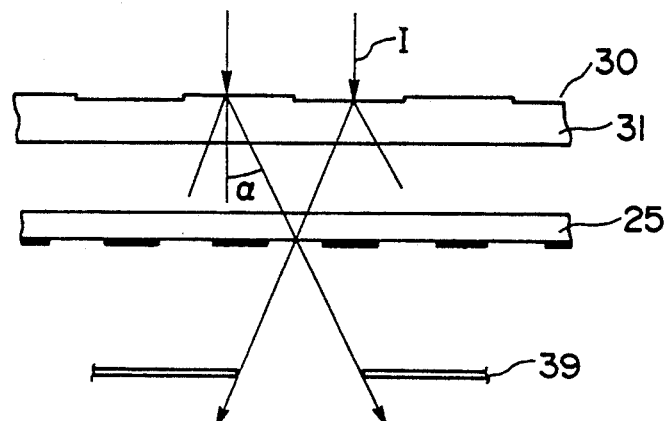
Figure 26B:
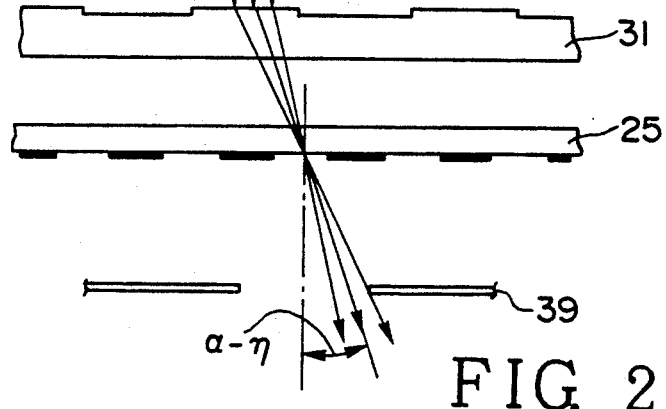

FIG. 26(a) is a view for explaining an arrangement for realizing oblique incidence illumination by utilizing the phase grating 31 (FIG. 20) and minimizing the numerical aperture of the illumination system. For the sake of descriptive simplicity, $\alpha$ has been used as an angle corresponding to the numerical aperture of the optical projection lens to be inclined, because the case in FIG. 26(a) is assumed. That is, oblique incidence illumination which matches with the numerical aperture of the optical projection lens to allow transfer having a fine pattern having the shortest period is assumed under the condition that the illumination light on the mask 25 consists of perfectly parallel rays. Such a system is effective for only a fine periodic pattern but is not effective for a pattern such as a mask pattern of an integrated circuit having various spatial frequency components. A ratio of the numerical aperture of the illumination system to that of the projection system, i.e., the o value is normally set to be about 0.5. As shown in FIG. 26(b), since the numerical aperture of the illumination system corresponds to a divergent angle $\eta$ of rays for illuminating the mask 25, the oblique incidence illumination angle with respect to such illumination light is set to be $(\alpha - \eta)$ rather than $\alpha$ for more effective utilization of the illumination light.

This indicates that the oblique incidence illumination angle is reduced by an angle corresponding to the numerical aperture of the illumination system to obtain a better result when the illumination optical system is to be inclined by the angle corresponding to the numerical aperture of the projection system described above. A method of reducing the inclination angle corresponding to the numerical aperture of the optical projection lens by an angle corresponding to the numerical aperture of the illumination system is applied to any optical device other than that shown in FIGS. 26(a) and 26(b), as a matter of course.

One of the features of utilization of the optical device described in the present invention resides in that it is easy to realize its method. That is, an optical device is simply placed above a mask in an existing exposure system. In this case, since the exposure system should not be contaminated with dust or the like, in order to achieve the present invention, the optical device requires not only a mounting space immediately above the mask, but also preferably automatic mounting and dismounting. If an exposure system has such a mechanism, the optical device can be mounted or dismounted without considering attachment of dust.

In addition, in an exposure system having a mechanism for mounting/dismounting the optical device on/from a portion above the mask, and a mechanism for selecting a position for storing at least one optical device, and selecting one of a plurality of optical devices if they can be mounted, the presence/absence of use of oblique incidence illumination can be determined and an inclination angle can be selected. Therefore, pattern transfer can be performed under the optical conditions corresponding to a pattern to be transferred or the $\sigma$ value of the exposure system.

As described above, as shown in FIGS. 21 to 26(b), when an optical device having a periodic structure such as a phase grating is located immediately above a mask, the inclination of the illumination light can be set in accordance with the numerical aperture of the optical projection lens, and imaging can be performed at an optimal resolving power of the optical projection lens.

FIGS. 27 to 33(b) show other embodiments of the present invention. These embodiments exemplify oblique incidence illumination using an existing system. These embodiments are the same as those of FIGS. 20 to 26(b) in that an optical element having a function of changing an angle of illumination light is located on the light source side of the pattern surface of the mask, but is different from that in that an optical device and a mask are formed integrally, and the optical device and the mask are simultaneously mounted or dismounted.

Figure 27:
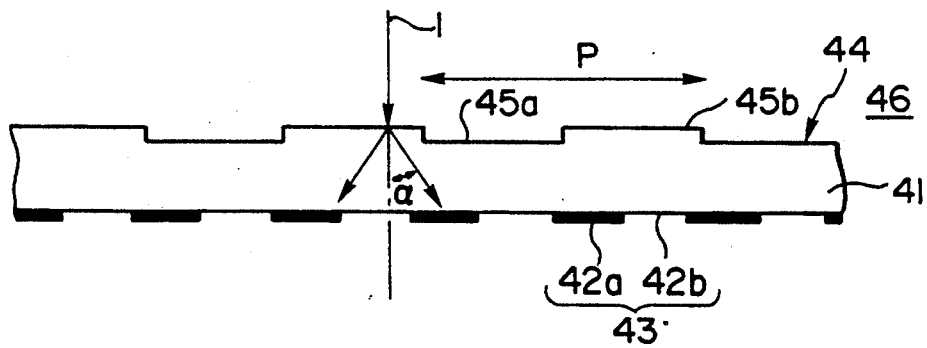
FIG. 27 is a schematic view of a mask used in the embodiment shown in FIGS. 20 to 26(b)

An operation of these embodiments will be exemplified using an optical device having a periodic device. Referring to FIG. 27, a transparent material such as quartz is used as a mask substrate 41, an opaque pattern, i.e., a mask pattern 43 is constituted by an opaque region 42a and a transparent region 42b on the lower surface of the mask substrate 41, thereby obtaining an optical device 44. The optical device 44 formed on the upper surface of the mask substrate 41 is a phase grating having a period p. The mask substrate 41 is processed to obtain a mask 46 such that the width of each recess 45a and the width of each projection 45b of the optical element 44 are equal to each other to be p/2, and that a ray passing through each recess 45a has a phase difference $\pi$ from that passing through each projection 45b.

In the optical device 44 having the above periodic structure, i.e., in the phase grating 44, the intensity of the zero-order diffracted ray ideally becomes zero, and only diffracted rays having 1st-order or more can be obtained. Assume that the period p is selected so that the $\pm 1$st-order diffraction angles correspond to the angle of the projection optical system, assume that the phase grating 44 is formed on the upper surface of the mask substrate 41 to cover the entire pattern area formed by the opaque region 42a, and that incident light I is vertically incident from the above on the mask substrate 41. Under these assumptions, oblique incidence illumination on the mask pattern 43 from two directions can be realized.

Numerical values for this embodiment are exemplified as described with reference to equation (7). That is, when the numerical aperture of the optical projection exposure system is given as $NA_0 = 0.5$ and a reduction magnification is set to be 1/5, an illumination angle of the illumination system becomes $\alpha \approx 5.7°$. Light used in exposure is a g-ray of a high-pressure mercury-arc lamp, and a wavelength λ is set to be λ=436 nm. These parameters vary depending on a system used, as has been described above.

The phase grating shown in FIG. 27 will be described below. The 1st-order diffraction angle of the phase grating 44 is set equal to α. For this reason, the grating period p becomes p=4.36 μm upon incidence of vertical incident light I. This period is sufficiently larger than the wavelength. In the structure of the phase grating 44, a phase difference between the recess and projection 45a and 45b is set to be π, and the lengths of the recess and projection 45a and 45b are set equal to each other to be p/2. If a transfer area of the exposure system is given as 15 mm×15 mm, the pattern on the mask 46 is present within the area having a size of 75 mm and 75 mm, and the grating 44 must have an area (e.g., 80 mm×80 mm) for covering the pattern area.

The pattern of this grating 44 can be drawn using an electron beam as in the pattern 43 on the mask 46. In order to obtain a phase difference π, a substrate on which a grating is formed may be directly etched, or a film (e.g., an oxide film) having a predetermined thickness and a predetermined optical constant may be uniformly formed on a substrate, and the substrate may be etched. The opaque region 42a formed on the opposite surface of the substrate must be protected. This grating 44 can be easily formed using the state-of-the-art IC processing techniques.

The operation of the embodiment of FIGS. 28(a) to 29(b) is the same as that of FIG. 27. A phase grating 44 is formed on a substrate 41a different from that of a mask and is bonded to a mask substrate 41b formed with an opaque portion 42a and a pattern 43.

Figure 28A:
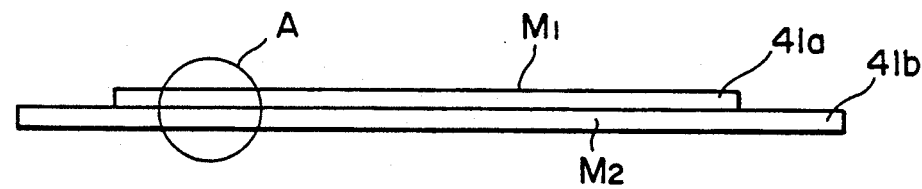
FIG. 28(a) is a schematic view showing a mask according to still another embodiment of the present invention.
Figure 28B:
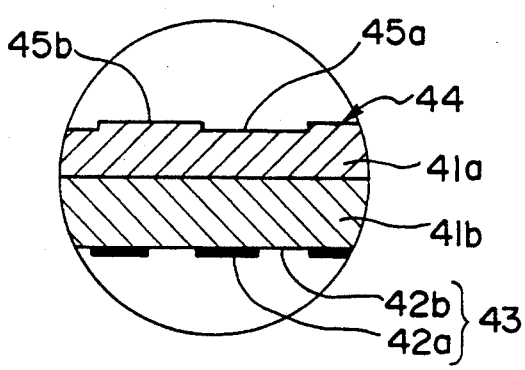
FIG. 28(b) is an enlarged view of a portion A in FIG. 28(a)

FIG. 28(a) has a structure in which the two substrates 41a and 41b are in tight contact with each other, and FIG. 28(b) is an enlarged view of a portion A in FIG. 28(a). These substrates may be bonded using an adhesive or may be set in so-called optical contact with each other without using any adhesive.

Figure 29A:
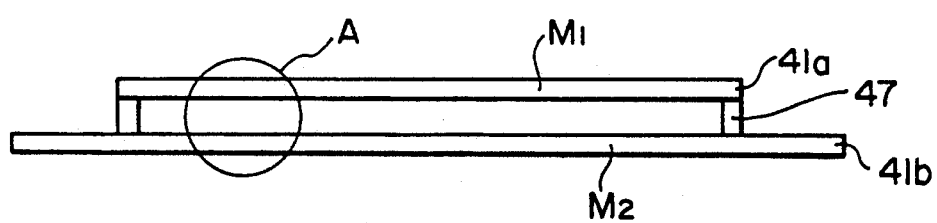
FIG. 29(a) is a schematic view showing a mask according to still another embodiment of the present invention.
Figure 29B:
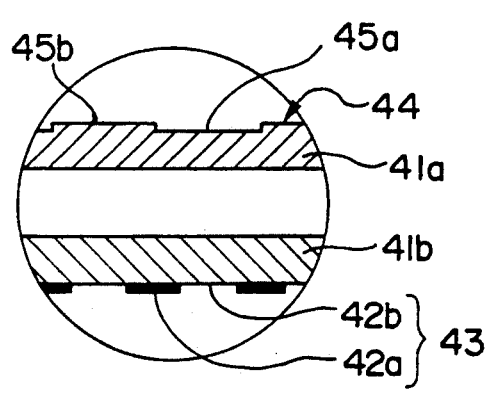
FIG. 29(b) is an enlarged view of a portion A in FIG. 29(a)

FIG. 29(a) shows a method of forming a space between two substrates 41a and 41b, and FIG. 29(b) is an enlarged view of a portion A in FIG. 29(a). The substrates 41a and 41b are fixed parallel to each other by an adhesive or the like through a spacer 47. Although this structure requires much labor, the substrates 41a and 41b can be integrally formed after they are independently checked, so that the product yield can be expected to be increased during fabrication process. Note that the grating substrate 41a is smaller than the mask substrate 41b because the substrate 41a can cover only the surface of the pattern to be transferred.

Referring to FIGS. 28(a) to 29(b), $M_1$ represents a grating formation surface of one substrate 41a, and $M_2$ represents a mask formation surface of the other substrate 41b.

Figure 30A:
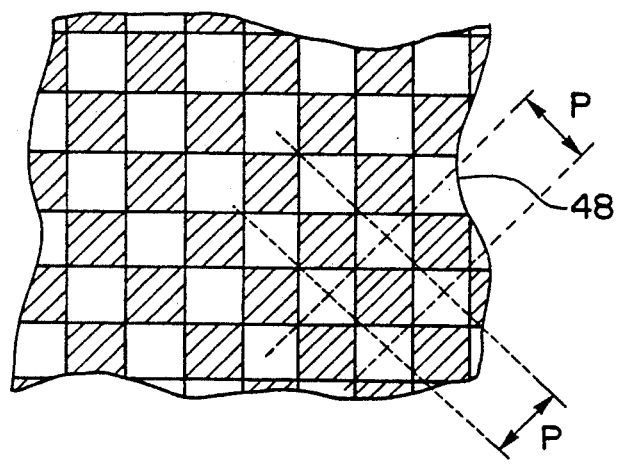
FIGS. 30(a) and 30(b) are views showing modifications of the phase grating pattern structure in FIG. 27, respectively.
Figure 30B:
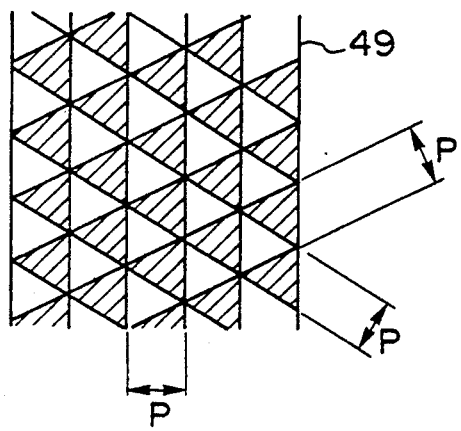

The description with reference to FIG. 27 has been made on the basis of the one-dimensional grating 44. However, as shown in FIG. 30(a), a planar pattern is a square checkerboard pattern, a two-dimensional grating 48 as in FIG. 22 can be obtained, and oblique incidence illumination from four directions can be achieved. The presence/absence of hatched lines indicate discrimination between two areas in which rays passing therethrough have a phase difference of a half wavelength. As a planar pattern, a grating 49 having a triangular pattern shown in FIG. 30(b) can be assumed. In this case, oblique incidence illumination from six directions can be realized.

Figure 31A:
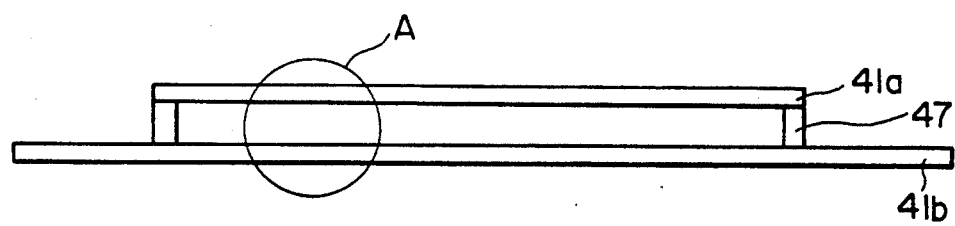
FIG. 31(a) is a schematic view of a mask according to still another embodiment of the present invention.
Figure 31B:
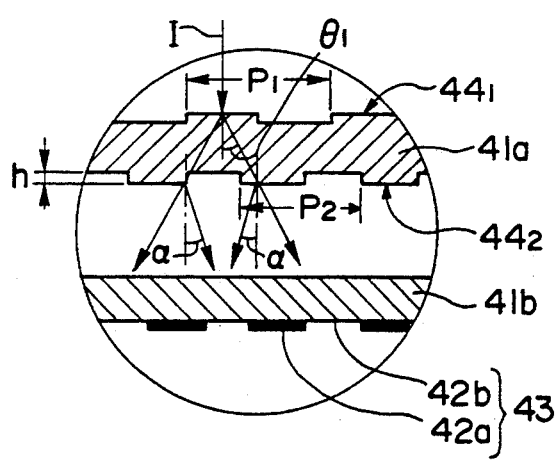
FIG. 31(b) is an enlarged view of a portion A in FIG. 31(a)

FIGS. 31(a) and 31(b) show an integral body of a normal mask substrate 41b and a substrate 41a as a combination of two one-dimensional gratings $44_1$ and $44_2$. The effect of this structure is equal to that in FIG. 25, and a detailed description thereof will be omitted.

Figure 32:
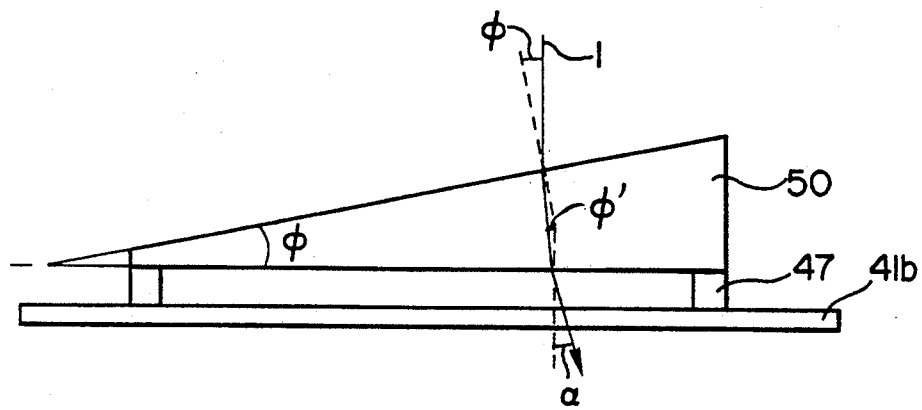
FIG. 32 is a schematic view of a mask according to still another embodiment of the present invention.

FIG. 32 shows an integral body using a prism 50 having a vertex angle φ as an optical device through a substrate 41b and a spacer 47. If a refractive index of a prism material is given as n, the following relation between α and φ is obtained:

$$\sin\phi = n \cdot \sin\phi'$$

$$n \cdot \sin(\phi - \phi') = \sin\alpha \quad (12)$$

If the refractive index of quartz glass is given as n=1.465 and sinα=0.1, then φ=12.2. In this mask structure, oblique incidence illumination from one direction can be performed.

Figure 33A:
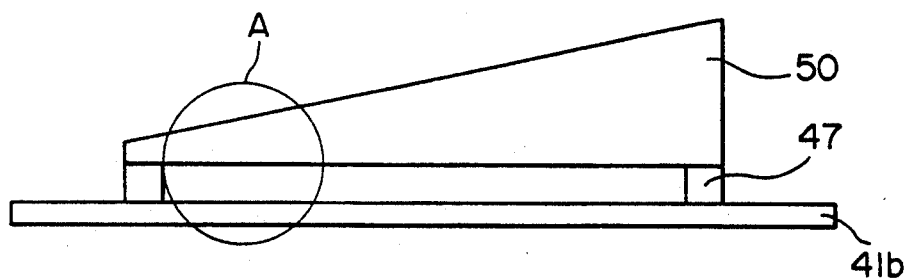
FIG. 33(a) is a schematic view showing a mask according to still another embodiment of the present invention.
Figure 33B:
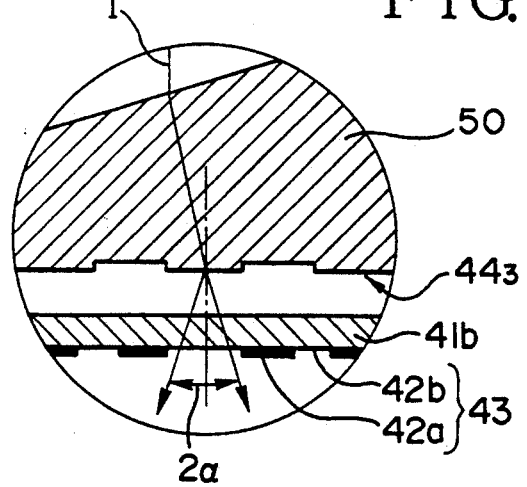
FIG. 33(b) is an enlarged view of a portion A in FIG. 33(a)

FIGS. 33(a) and 33(b) show a structure in which a phase grating $44_3$ is formed on the lower surface of a prism 50 serving as an optical device. In this case, oblique incidence illumination from two direction can be performed as in FIG. 24.

The embodiments described with reference to FIGS. 27 to 33(b), the optical elements are integrally formed with the masks. However, the present invention is also applicable to a mask in which an opaque region may be constituted by a semi-transparent film, and a phase difference of a half wavelength is given to a ray passing through the opaque region with respect to a ray passing through the transparent region.

According to each of the embodiments in FIGS. 27 to 33(b), the optical device for inclining illumination light in accordance with the numerical aperture of the optical projection lens is integrally formed with the mask substrate having the opaque region or the like formed in accordance with a mask pattern to be transferred. Imaging can be performed at the maximum resolving power of the optical projection lens without modifying the conventional optical projection exposure system. In addition, the resolving power almost equal to that obtained by the conventional phase-shifting method in the conventional system can be advantageously obtained for any pattern without using a phase-shifting mask.

FIGS. 34(a) to 38(b) show still another embodiment employing a prism as an optical device. According to a method using a prism as an optical device for performing oblique incidence illumination, a prism having a size almost equal to the transfer pattern area of the mask can be used in oblique incidence illumination from one direction, as shown in FIGS. 21 and 23(a). No problem is posed even if an existing optical projection exposure system is used. However, when a prism for oblique incidence illumination from two direction is used, as shown in FIG. 23(b), the size of the prism in the inclination direction must be about twice that of the mask irradiated with the ray. In addition, the distance between the prism and the mask must be assured in accordance with an inclination angle. When a prism for oblique incidence illumination from four directions, as shown in FIG. 23(c), is used, the same restriction is imposed. When a circuit pattern of a semiconductor integrated circuit is to be transferred, image positions are undesirably shifted in oblique incidence illumination from one direction in such cases that a wafer surface is deviated from an image plane, i.e., a defocus state occurs. In order to eliminate this image shift, light which contributes to symmetrical imaging at the imaging point is required. In this sense, oblique incidence illumination from two directions is required. In addition, since patterns in various orientations are included in the circuit patterns, inverted conical oblique incidence illumination from four directions in addition to two directions is preferable.

In consideration of the above points, as shown in FIGS. 34(a) to 38(b), a mechanism is provided such that an optical device having a function for inclining illumination light perpendicular to a mask surface by a predetermined angle up to an angle corresponding to the numerical aperture of an optical projection lens is held above the mask of the optical projection exposure system on the light source side, and that this optical device is rotated about an axis perpendicular to the mask surface.

Figure 34A:
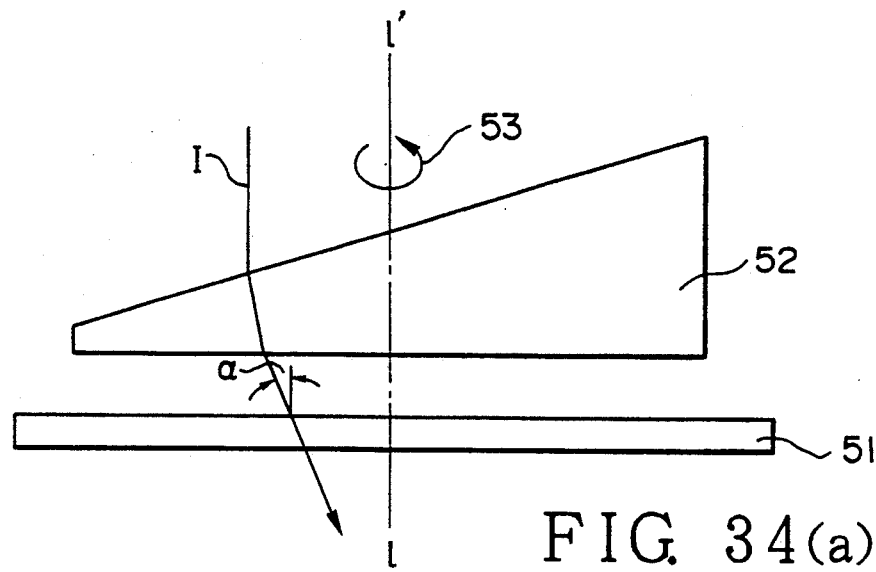
Figure 34B:
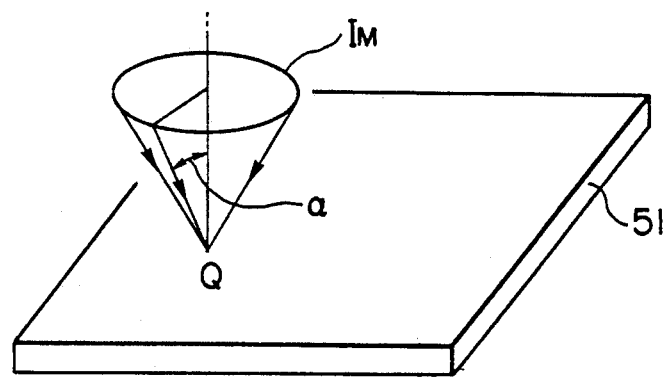

Use of a half-roof prism as an optical device for inclining illumination light I perpendicular to a mask surface by an angle corresponding to the numerical aperture of the optical projection lens will be described with reference to FIGS. 34(a) and 34(b). Referring to FIG. 34(a), this prism 52 is held by a mask 51 on the light source side. The half-roof prism 52 held above the mask 51 inclines the illumination light I perpendicular to the mask surface by an angle $\alpha$ where $\alpha$ is an angle corresponding to the numerical aperture of the projection optical system. The illumination light inclined by the prism 52 illuminates the mask 51. The prism 52 is rotated about an axis I—I' perpendicular to the mask surface in a direction indicated by an arrow 53. Light $I_M$ illuminating any point Q on the mask 51 serves as inverted oblique incidence illumination light, as shown in FIG. 34(b).

Figure 35:
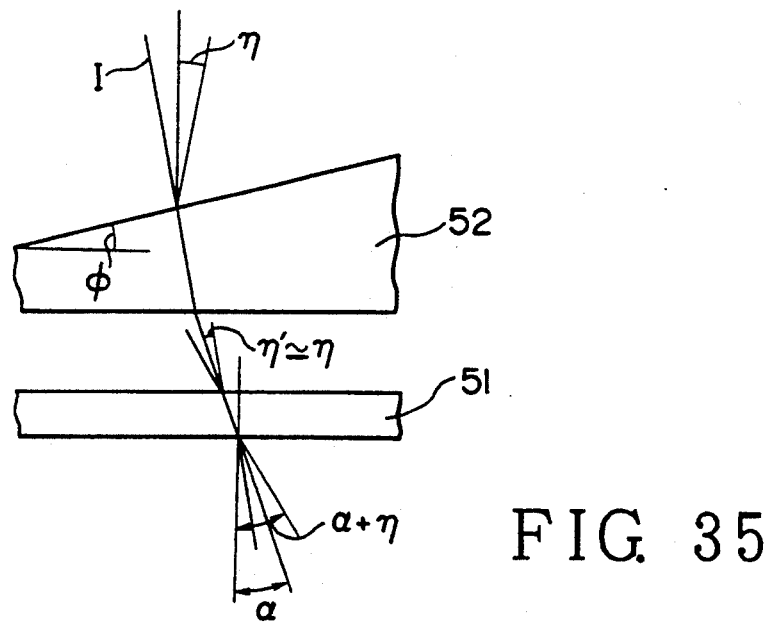
FIG. 35 is a view showing a divergent angle of illumination light of this embodiment.

This embodiment will be described in detail with reference to numerical values. The optical projection exposure system has the numerical aperture of the optical projection lens as NA=0.5 and a reduction magnification of about 1/5 as in the above embodiments. If mask illumination light is regarded as parallel rays and the size of the light source is regarded as zero, an oblique incidence illumination angle $\alpha$ corresponding to the projection optical system becomes $\alpha=5.7°$ from equation (7) as in the above embodiments. In general, however, the light source has a certain size, and the illumination light I has a divergent angle $\eta$, as shown in FIG. 35. The divergent angle of the illumination light is changed from $\eta$ to $\eta'$ when the optical axis is inclined by the prism 52. A difference between the angles $\eta$ and $\eta'$ is very small, and condition $\eta'=\eta$ may be established. In this case, $(\alpha+\eta)$ is set as follows to be caused to correspond to the projection optical system:

$$sin(\alpha+\eta)=(1/5)*0.5=0.1 \tag{13}$$

This oblique incidence illumination angle $\alpha$ can be selected by optimizing the vertex angle $\phi$ of the half-roof prism 52. For example, if the prism consists of quartz glass having a refractive index of 1.465 and conditions $\eta=0.1$ and $sin\alpha=0.1$ are established, then $\phi=12.2°$.

Since the prism must cover the pattern area of the mask, the diameter of the prism must be, e.g., 80 mm if the pattern area of the mask is given as 75 mm×75 mm. If the prism has a circular shape having its center as the center of rotation, unnecessary air stirring can be prevented, resulting in convenience.

Since one exposure cycle is generally about 0.5 sec., in order to perform almost uniform illumination regardless of exposure start and end timings, a rotational frequency must be set to be 2,000 to 3,000 rpm. This high-speed rotation is preferably avoided from the viewpoints of wear of parts and reliability. There is proposed a method of controlling n revolutions per exposure cycle, where n represents 1 to about 10 revolutions. The value n may be determined not to overload the rotary mechanism.

Figure 36A:
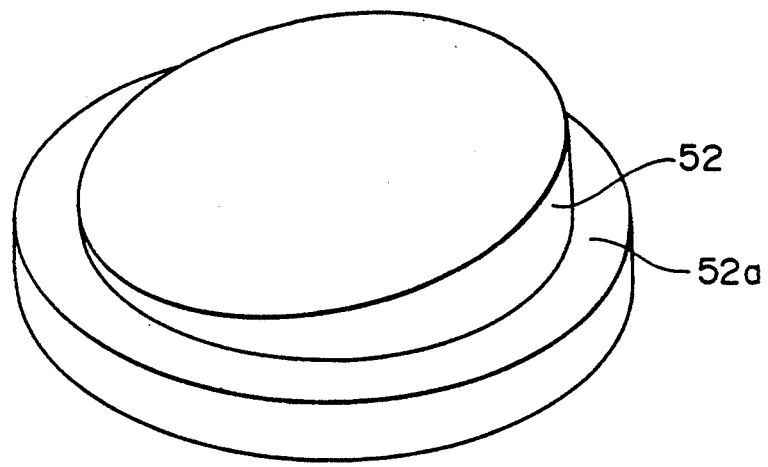
FIG. 36(a) is a perspective view showing a detailed arrangement of a prism in FIG. 34(a)
Figure 36B:
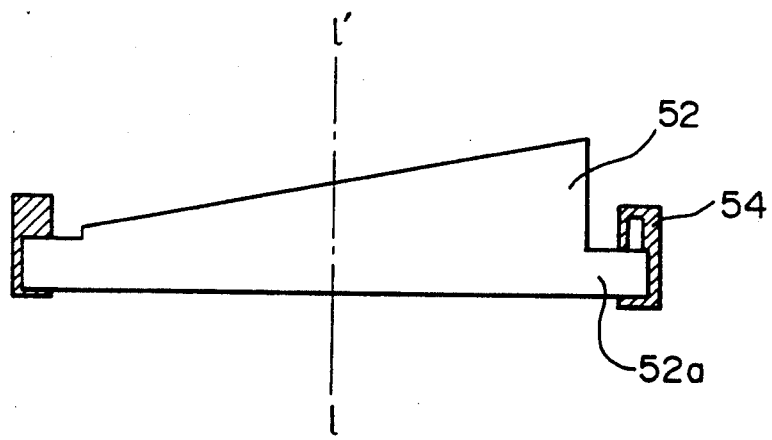
FIG. 36(b) is a sectional view of the prism.
Figures 37A, 37B:
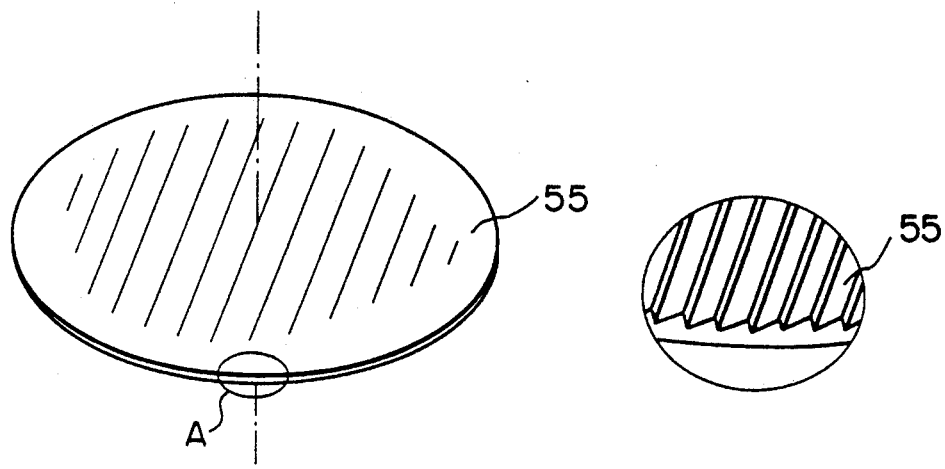
FIG. 37(a) is a plan view of a corrugated prism used as an optical device in this embodiment.
FIG. 37(b) is an enlarged view of a portion A in FIG. 37(a)

A rotating shaft must pass through the center of gravity of a rotary body in the rotary mechanism. In an arrangement shown in FIG. 36(a), the half-roof prism 52 has a circular shape, and a columnar collar 52a is formed in the peripheral portion of the prism. The prism 52 and the collar 52a can be integrally made of quartz FIG. 36(b) is a sectional view of FIG. 36(a). A metal frame 54 is fitted on the collar 52a, and a balancer is mounted on the metal frame 54 to have a structure in which the rotating shaft passes through the center of gravity of the rotary body. The outer surface of the metal frame 54 can be used as, e.g., a surface against which the rotating shaft for applying a rotational force is urged.

When the half-roof prism 52 is used without any modification, the above implementation must be made to balance rotation. As a simpler optical device, a corrugated prism 55 shown in FIGS. 37(a) and 37(b) can be used. This arrangement is also shown in FIG. 23(a). This prism 55 is regarded to have an almost flat surface and does not balance rotation, or can be rotated with slight adjustment of rotation. In addition, the prism 55 has a smaller thickness as a whole than that of the half-roof prism, high-speed rotation can be achieved.

Figures 38A, 38B:
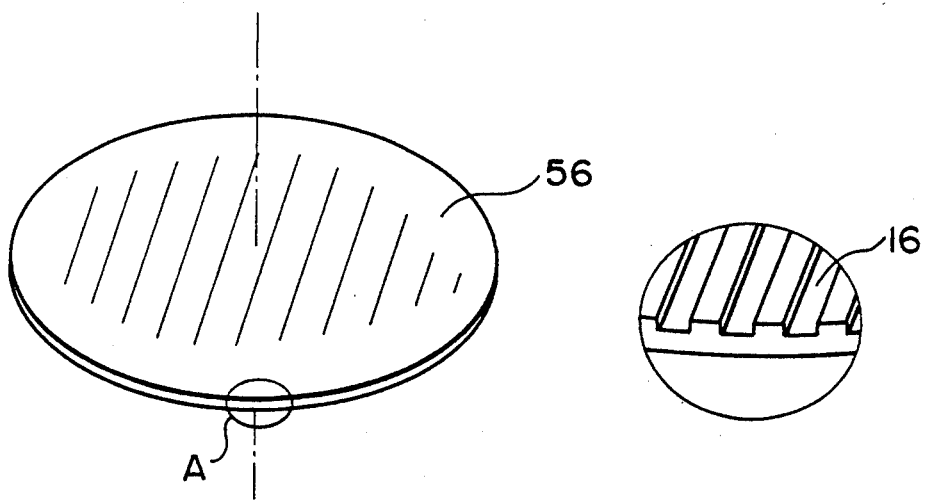
FIG. 38(a) is a plan view of a one-dimensional phase grating used as an optical device of this embodiment.
FIG. 38(b) is an enlarged view of a portion A in FIG. 38(a)

FIGS. 38(a) and 38(b) show a case using a one-dimensional phase grating 56 as an optical device as shown in FIG. 20. If an inclination angle $\alpha$ is set to be $sin\alpha=0.1$ and the wavelength of an i-ray (365 nm) of a mercury-arc lamp is used, the period of the grating 56 is given as 3.65 $\mu$m. Even if the one-dimensional phase grating 16 is not rotated, oblique incidence illumination from two directions can be achieved. However, inverted conical oblique incidence illumination can be achieved by rotation.

The optical devices for inclining the illumination light in a given direction are exemplified in FIGS. 37(a) to 38(b). In practice, however, a portion extending outward from the device, as shown in FIGS. 36(a) and 36(b), and mechanism constituting parts for transmitting a rotational force are required in these optical devices.

According to the embodiment described with reference to FIGS. 34(a) and 38(b), when the optical device located near the mask on the light source side is rotated, illumination light inclined from a limited direction is rotated, and any point on the mask is illuminated in an inverted conical shape. As a result, integrated circuit patterns having various directions can be transferred at a maximum resolving power of the projection optical system.

Still another embodiment representing an annular light source will be described with reference to FIGS. 39(a) to 45(b).

Figure 39A:
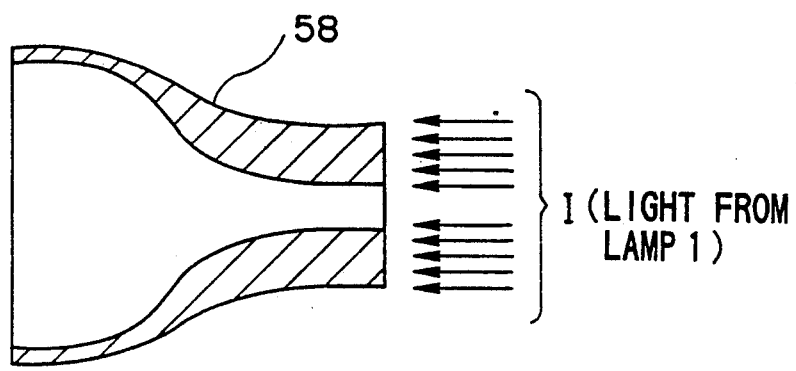
Figure 39B:
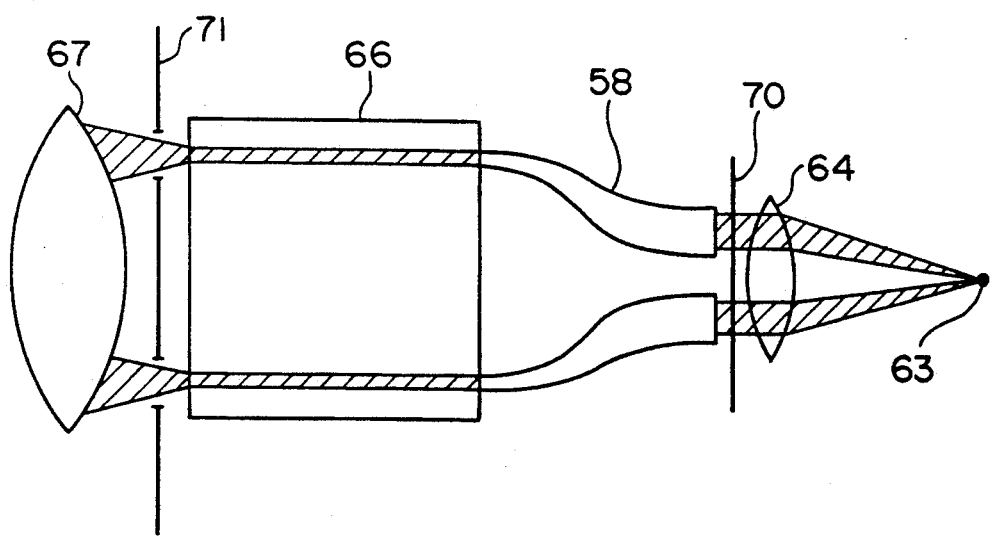

FIGS. 39(a) and 39(b) show a method of realizing an annular light source using an optical fiber. The optical fiber in this arrangement is obtained such that a columnar optical fiber made of glass having a high refractive index and having a diameter of about 10 $\mu$m or less is covered with glass having a low refractive index. Light propagates while repeatedly reflected inside the fiber ideally by total reflection. FIG. 39(a) shows an optical fiber bundle 58 having a small-diameter incident surface for light I and a large-diameter exit surface in a doughnut-like shape. The optical fiber bundle 58 is located between a conical lens 65 and an optical integrator 66 in FIG. 40. This optical fiber bundle may be arranged at any position between a filter 70 and a condenser 68. Light emitted from a primary source and reaching the filter 70 has a distribution having a low-intensity central portion and a high-intensity peripheral portion in accordance with the shape of the primary source.

Figure 40:
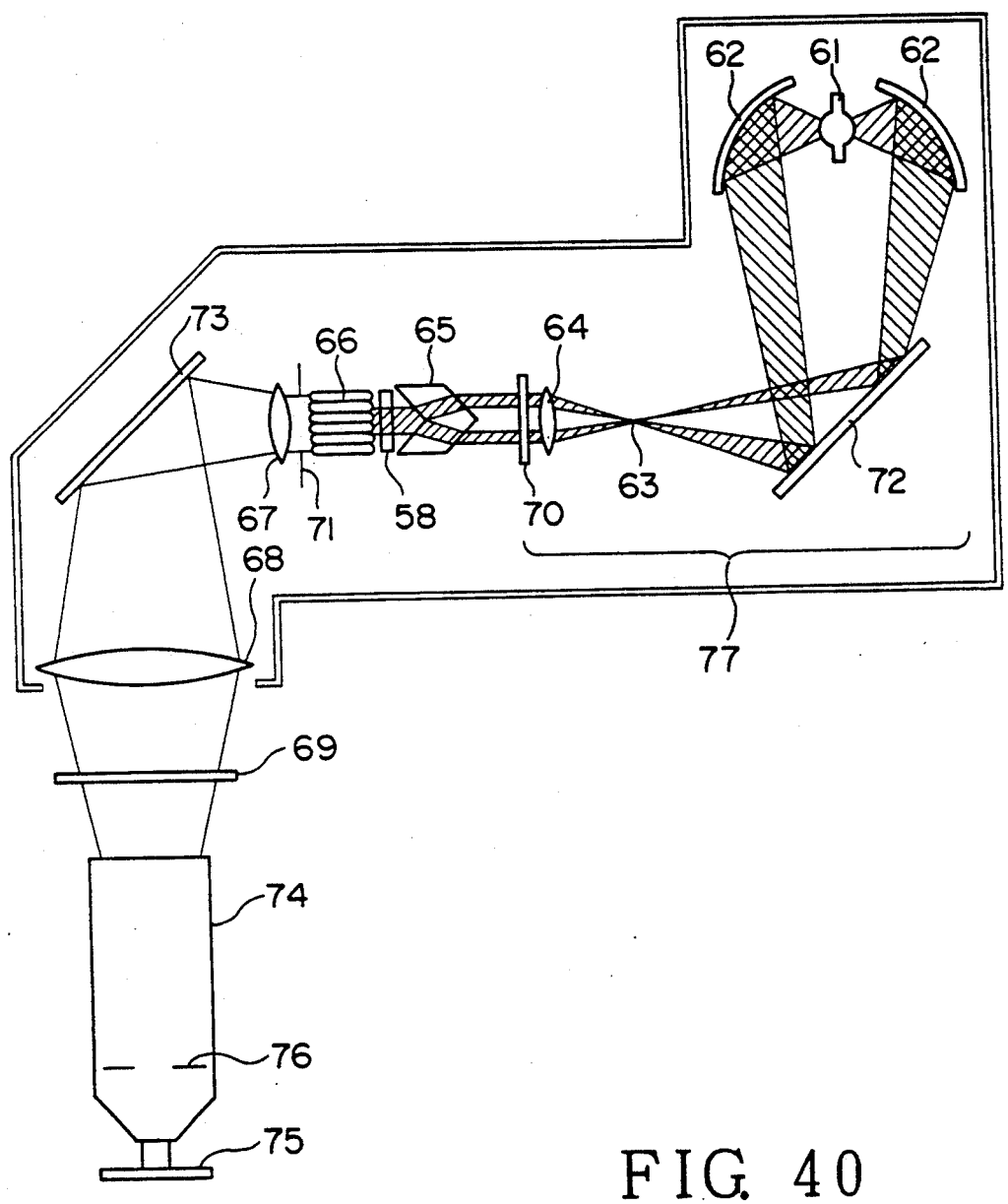
FIG. 40 is a view showing an overall arrangement of an optical projection exposure system which incorporates the optical fiber shown in FIGS. 39(a) and 39(b)

Referring to FIG. 40, a portion except for the optical fiber bundle 58 is an apparatus using a conventional typical imaging method. The arrangement of FIG. 40 will be generally described below. A lam 61 is located at a first focal point of an elliptical mirror 62 constituting a first focusing optical system 77 to temporarily focus rays near a second focal point 63 of the conical lens 65. The bundle of rays are collimated by an input lens 64 having a focal point almost near the second focal point 63 to obtain parallel rays. The parallel rays are focused on the central portion by the conical lens 64 while the light intensity is uniformed. The resultant light is incident on the optical integrator 66 through the optical fiber bundle 58 of the present invention. The optical integrator 66 is constituted by a so-called fly-eye lens. The fly-eye lens is constituted by a large number of short rod lenses each having a short focal length to constitute a plurality of secondary sources. A large number of rays are radiated on the reticle surface to eliminate images diffracted by the reticle, thereby obtaining uniform illumination free from irregularity. The illumination intensity distribution on the reticle surface can become almost uniform.

The input lens 64 and the conical lens 65 serve to minimize shading of rays passing through the optical integrator 66 and to improve imaging efficiency. The rays emerging from the small lenses of the optical integrator 66 are superposed on a reticle 69 through an output lens 67 and a condenser lens group 68. Rays passing through the filter 70 are focused by the conical lens 65 and the rays emerging from the small lenses of the optical integrator 66 can be almost equally superposed on each other, so that the illumination intensity on the reticle 69 becomes almost uniform. An aperture stop 71 is located on the exit side of the optical integrator 66, and the exist size of the optical integrator 66 is determined by the aperture stop 71. The filter 70 is arranged to transmit only rays having wavelengths of the aberration-corrected optical system. Rays radiated on the reticle 69 pass through a projection optical system 74, and an image of a fine pattern on the reticle 69 is projected and exposed. A diaphragm 76 for determining the numerical aperture of the projection optical system 74 is present therein. Note that reference numerals 72 and 73 denote cold mirrors, respectively.

In the system having the above arrangement, when rays from the reticle 69 are taken into consideration, the nature of the rays is the same as that of rays from the optical integrator 66 through the output lens 67 and the condenser lens 68, so that the exit side of the optical integrator 66 seems to be an apparent light source. For this reason, in this arrangement, the exit side of the optical integrator 66 is generally called a secondary source.

The conical lens 65 is arranged to obtain a uniform light intensity distribution. The light intensity of the peripheral portion must be increased according to the present invention. For this reason, the uniform light intensity distribution need not be obtained by the conical lens. The bundle of rays passing through the filter can be guided to the optical fiber bundle 58 having a doughnut-like shape shown in FIG. 39(a), and an annular bundle of rays having a desired radius can be obtained. When an annular light source is to be realized using only an annular aperture stop, the outer diameter of the ring cannot be larger than the radius of the bundle of rays. When the optical fiber is used, the inner and outer diameters of the annular bundle of exit rays and the direction of the exit rays can be arbitrarily changed regardless of the radius of the bundle of incident rays. An annular light source having a radius corresponding to the numerical aperture of the projection optical system by using an optical fiber is shown in FIG. 39(b).

FIG. 39(b) shows an enlarged state in which the doughnut-like optical fiber in FIG. 39(a) is inserted in a corresponding portion of FIG. 40. Rays emerging from the optical fiber bundle 58 are incident on the reticle through the optical integrator 66 and the second focusing optical system. A numerical aperture NA of the optical fiber is defined as follows:

$$NA = (n_1 - n_2)^{\frac{1}{2}} \qquad (14)$$

where $n_1$ is the refractive index of the inner fibers, and $n_2$ is the refractive index of an outer cover. If $n_1 = 1.7$ and $n_2 = 1.5$, then NA = 0.8. The numeral aperture of the fiber is generally larger than that of the lens. Rays output from the fibers become divergent rays. Even if the optical integrator 66 is not inserted, rays radiated on the reticle have an almost uniform intensity distribution. For this reason, the optical integrator need not be inserted. The exit surfaces of the fibers are constituted by lens surfaces to prevent divergence.

The optical integrator 66 may be arranged in front of the fibers. In this case, shading occurs in the rays having angles allowed by the numerical aperture of the fibers during incidence, thereby degrading efficiency. An annular aperture stop may be inserted on the exit side of the optical integrator 66 after the rays are output from the fibers, thereby perfectly shielding the rays from a portion except for the annular portion. If the numerical aperture of the projection optical system is set to be 0.5, and a reduction magnification is set to be 1/5, an illumination angle $\alpha'$ corresponding to these conditions is given as about 5.7° in accordance with the following equation:

$$\sin\alpha' = (1/m)\sin\alpha \qquad (15)$$

When the outer diameter and the position of the optical fiber bundle 58 are set to satisfy this illumination angle, the light incident on the reticle at this inclination angle with respect to the optical axis can have the maximum resolving power with respect to the optical projection lens. When a means for obtaining an annular light source does not comprise a diaphragm but an optical fiber, shading of rays can be eliminated to prevent a decrease in illuminance. When an annular diaphragm is inserted to the exit side of the rays emerging from the optical integrator after the rays are uniformed by the conical lens 65 as in the conventional system, and the annular diaphragm has an outer radius of 2.0 cm and an inner radius of 1.5 cm, the illuminance is reduced to 56% except for shading outside the diaphragm. According to the present invention, however, since the rays are focused by optical fibers and the fibers are located in the entire area where the rays from the primary source reach, an almost 100% illuminance can be obtained.

Figure 41A:
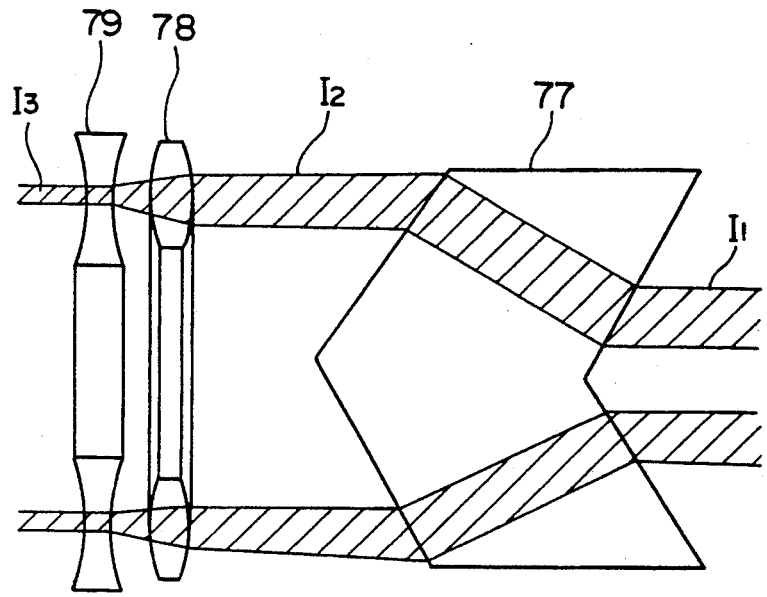
Figure 41B:
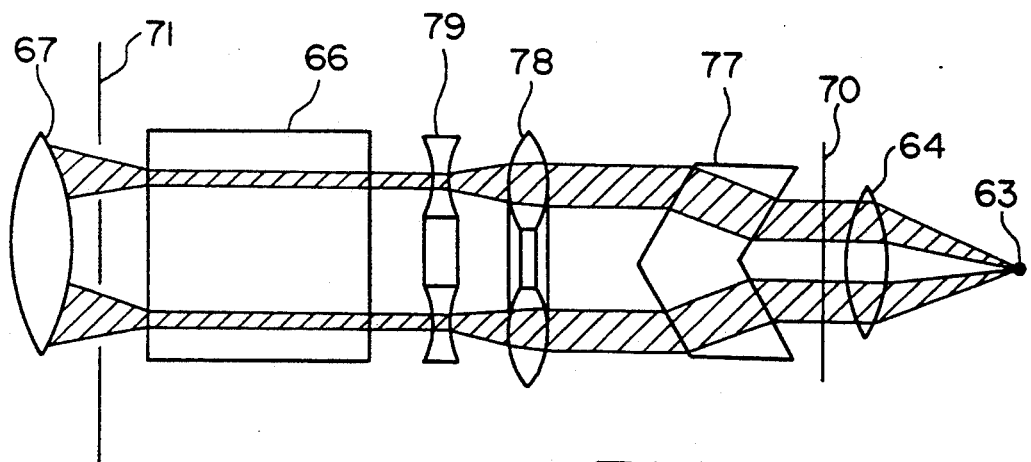

FIGS. 41(a) and 41(b) show a method of realizing an annular light source using a conical lens. FIG. 41(a) shows an optical system to be located between the filter 70 and the condenser lens 68 in FIG. 40. This optical system comprises a conical lens 77, a ring-like convex lens 78, and a ring-like concave lens 79. The rays reaching the filter 70 have a low-intensity central portion and a high-intensity peripheral portion in accordance with the shape of the primary source. In a normal operation, the conical lens 65 is arranged to uniform the intensity of rays incident on the optical integrator 66. However, this operation of causing the conical lens to uniform the light intensity need not be performed because the light intensity of the peripheral portion must be increased.

The bundle of rays passing through the filter do not have a sufficient radius for causing inclination corresponding to the numerical aperture of the lens of the projection system. As shown in FIG. 41(b), the radius of the bundle of rays is increased by an optical system consisting of the conical lens 77 located opposite to the normal direction. This conical lens 77 is a lens obtained by stacking cones and has a V-shaped section, as shown in FIG. 41(a). Rays I incident parallel to the optical axis on the recess of the conical lens 77 are refracted on the lens surface in a direction to be diverged and are then refracted and emerge at the projection of the conical lens 77, thus obtaining rays $I_2$ parallel to the optical axis. As a result, the radius of the doughnut-like incident rays $I_1$ is increased.

The radius of the central rays having a low intensity distribution and having passed through the filter 70 is increased by the conical lens 77 to become an annular bundle of rays $I_2$. The radius of these rays $I_2$ is reduced by a combination of the ring-like convex lens 78 and the ring-like concave lens 79, as shown in FIG. 41(a). More specifically, an optical device having a ring-like convex lens on the exist side of the conical lens 77, i.e., the ring-like convex lens 78 is located to reduce the width of the annular bundle of rays. The rays are then collimated as parallel rays by an optical device having a ring-like peripheral concave lens, i.e., the ring-like concave lens 79. As a result, an annular bundle of rays $I_3$ having a large radius and a high-intensity peripheral portion can be obtained.

In this case, all the rays from the primary source are focused into an annular shape by the conical lens 77 to prevent a decrease in illuminance. The light intensity except for the annular portion may be set zero by inserting the annular aperture stop 71 immediately behind the optical integrator 66. According to the present invention, the width of the annular bundle of rays can be adjusted by a combination of the ring-like convex lens 78 and the ring-like concave lens 79 by using the conical lens 77 having a shape for obtaining rays having a radius corresponding to the numerical aperture of the projection system lens. A maximum resolving power of the projection optical system can be obtained without decreasing the illuminance.

In the embodiment shown in FIGS. 39(a) to 41(b), an optical system such as an optical fiber and a lens is used to adjust he radius of the annular secondary source and at the same time maintain the illuminance. Even if an annular diaphragm which cannot adjust the radius of rays is used, the inclination angle can be adjusted by another implementation, as shown in FIGS. 42(a) to 43(b). In this case, a condenser lens for uniforming the light intensity distribution is not preferably used in a normal exposure system so as to prevent a decrease in illuminance. In addition to this, a means for concentrating the light intensity on the peripheral portion is preferably used.

Figure 43A:
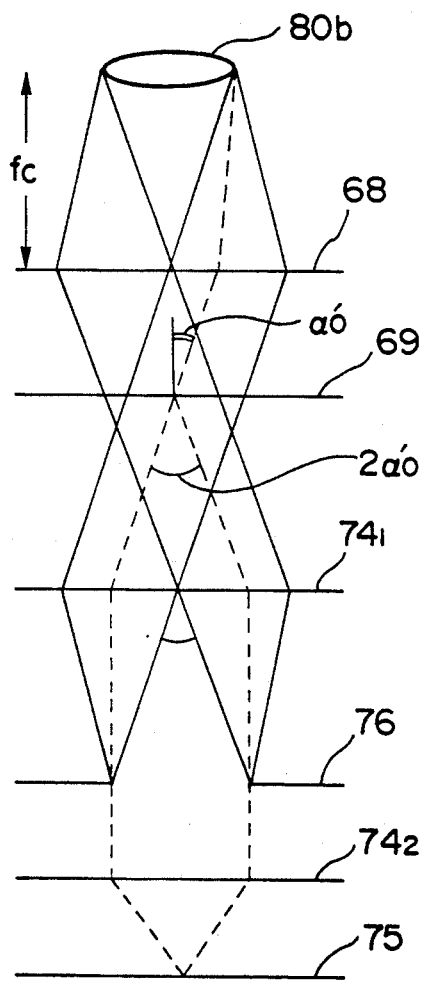
Figure 43B:
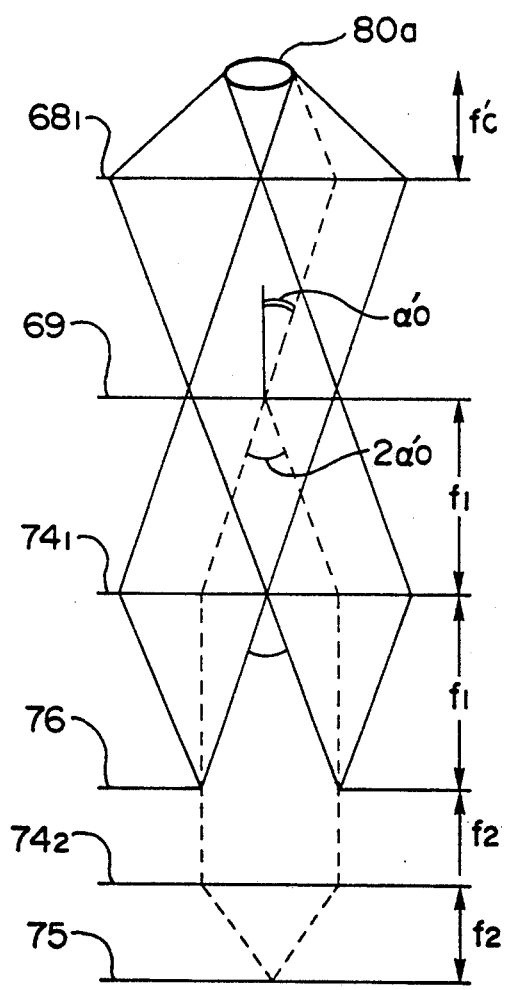

FIGS. 42(a) to 43(b) are views for explaining a method of adjusting a lens magnification as compared with another optical system. FIG. 42(a) shows a case using a point light source obtained by ideally arranging a normal exposure system. FIG. 43(b) shows a case in which a small-diameter annular light source disclosed in Japanese Patent Application No. 59-211269 (Japanese Patent Laid-Open No. 61-91662) is used to perform exposure through a condenser lens. Actual optical systems are simplified for descriptive convenience and are illustratively and qualitatively represented. The same reference numerals as in FIGS. 39(a) and 39(b) denote the same parts in FIGS. 42(a) to 43(b). Four solid lines in each of FIGS. 42(a), 43(a) and 43(b) are two rays passing through the center of a condenser lens 68 and two rays passing through the center of a first optical projection lens 14. Dotted lines in each of FIGS. 42(a), 43(a), and 43(b) show states of diffraction of rays incident on a reticle 69 and imaging states. Reference symbols $f_1$, $f_2$, $f_c$, and $f_c'$ denote focal lengths of the optical systems.

In a conventional optical system, a secondary source has a finite size, which can be idealized as a point light source. This optical system can be represented, as shown in FIG. 42(a). Referring to FIG. 42(a), light emitted from the point light source 80 and passing through the condenser lens 68 becomes parallel light and is vertically incident on the reticle 69. A resolving limit is determined by a diffraction angle $\alpha_0'$ of light passing through the outermost portion of an aperture stop 76 on the reticle surface.

In FIG. 42(b), a secondary source becomes an annular light source 80a having a small diameter. Light incident on the reticle 69 is not perpendicular to the reticle surface but is inclined at an angle $\alpha_1'/2$ with respect to the optical axis. Since this inclination angle satisfies condition $\alpha_0' < \alpha_1'$, the resolving power is higher than that of the point light source. However, since condition $\alpha_1' < 2\alpha_0'$ is established, zero- and 1st-order rays passing through the reticle 69 pass a portion inside the outermost portion of the aperture stop 76 of the projection system and are focused. As a result, the maximum resolving power determined by this aperture stop cannot be obtained.

FIG. 43(a) shows an optical system in which the magnification of the condenser lens in the above two cases is kept unchanged, and the radius of a secondary source is set to be a value for setting inclination corresponding to the numerical aperture of the projection system. Referring to FIG. 43(a), an annular secondary source 80b has a large radius, and an angle of a ray refracted by a condenser lens 68 and incident on the reticle surface is set to be $\alpha_0'$. At this time, a divergent angle between the zero- and 1st-order diffracted rays is $2\alpha_0'$, and the rays pass through the outermost portion of the aperture stop 76, thereby obtaining the maximum resolving power.

A method of causing the inclination of a ray incident on a reticle to correspond to the numerical aperture of a projection system while an annular light source having a small diameter is obtained using an annular diaphragm whose radius cannot be adjusted is shown in FIG. 43(b). Referring to FIG. 43(b), the annular light source 80a has a small radius as in FIG. 42(b). Since a focal length $f_c'$ of a condenser lens $68_1$ is small, the annular light source 80a is located close to the condenser lens 68, or the condenser lens $68_1$ is moved so that each point of the light source is located on the focal plane of the lens. A ray emerging from one point of the light source 80a passes through the condenser lens $68_1$ and is collimated. The resultant parallel light is incident on the surface of the reticle at an angle $\alpha_0'$. As in the case of FIG. 43(a), a divergent angle between the zero- and 1st-order diffracted rays becomes $2\alpha_0'$, thereby obtaining a maximum resolving power of the projection system.

The condenser lens $68_1$ having a high magnification is arranged so as to set an incident angle $\alpha_0'$ on the reticle surface so that the ray diffracted by the reticle 69 passes through the outermost portion of the aperture stop 76. If the optical reduction projection system has a numerical aperture of 0.5 and a reduction magnification of 1/5, the inclination angle of diffracted rays, of all rays passing through the reticle, having a maximum wave number and focused by the projection system without any shadowing is set to be 5.7°. A ray incident on the reticle 69 is inclined at an angle of 5.7°. The magnification and position of the condenser lens $68_1$ are determined to given this inclination angle, thereby obtaining the optimal inclination angle of the illumination light by lens magnification conversion.

In this embodiment, a zoom lens can be used as the condenser lens to change the inclination of the reticle illumination light by the zoom lens in correspondence with a variable numerical aperture of a projection optical system. In this manner, when the zoom lens is used, normal vertical incidence exposure can also be performed by a single system.

Figure 44:
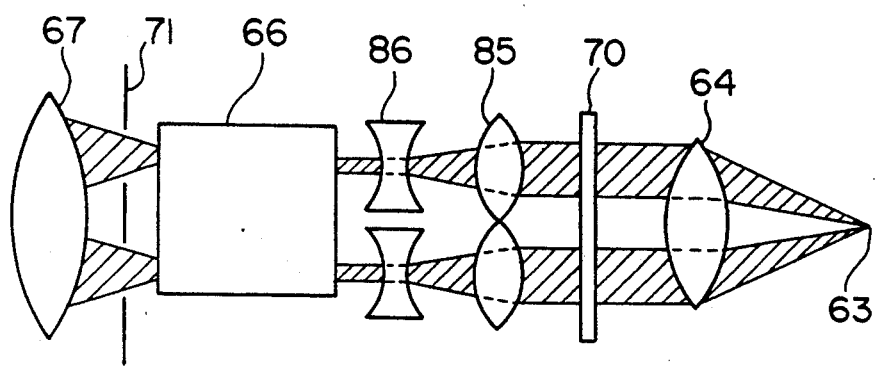
FIG. 44 shows still another embodiment of the present invention, showing an arrangement in which ring-like convex lenses are combined with ring-like concave lenses to realize an annular light source.
Figure 45A:
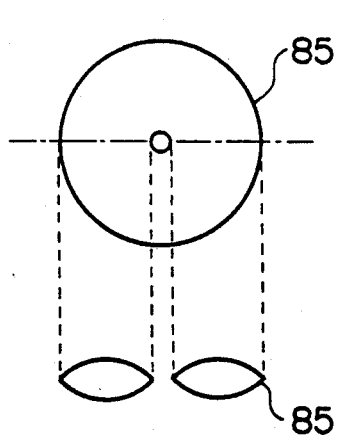
FIG. 45(a) is a sectional view showing a state in which the ring-like convex lenses in FIG. 44 are viewed at the center from the front.
Figure 45B:
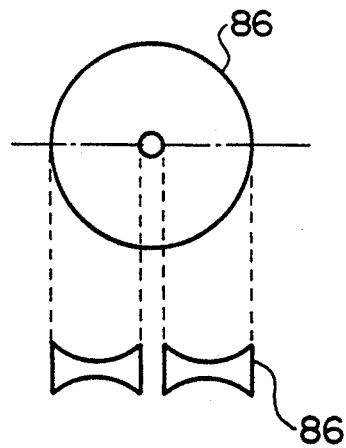
FIG. 45(b) is a sectional view showing a state in which the ring-like concave lenses in FIG. 44 are viewed at the center from the front.

An embodiment exemplifying a method of adjusting an annular secondary source having a radius for obtaining a ray inclined at an angle corresponding to the numerical aperture of a projection system while a width a of the annular light source and its illuminance are kept maintained will be described with reference to FIG. 44. As described with reference to the embodiment of FIGS. 41(a) and 41(b) using the conical lens, parallel rays incident by a combination of a ring-like convex lens 85 and a ring-like concave lens 86 as shown in FIG. 44 are focused. FIGS. 45(a) and 45(b) are sectional views of ring-like convex and ring-like concave lenses 85 and 86 when viewed from the centers thereof.

When the ring-like convex lenses 85 and the ring-like concave lenses 86 are located next to each other behind a filter 70 in FIG. 44, rays having central rays having a low intensity distribution and having passed through the filter 70 become rays whose light intensity distribution is concentrated in an annular shape. When the magnifications of the ring-like convex and concave lenses 85 and 86 are adjusted and a distance therebetween is changed to adjust a width a of the annular shape. The inner diameter defined by the ring-like lenses 85 and 86 is set small, the loss of the light intensity is small, and the high illuminance can be maintained. In this manner, in order to obtain a uniform illumination intensity distribution on the reticle surface, an optical integrator 66 is preferably inserted after the annular light source is formed. In addition, an annular aperture stop 71 can be inserted on the exit side of the optical integrator 66.

An annular light source is obtained by a combination of the ring-like lenses 85 and 86 without decreasing the illuminance, and an inclination angle corresponding to the numerical aperture of the projection optical system is given by the method of changing the magnification of the condenser lens as described above. By these two methods, a change in radius of the secondary source and concentration of the exit light intensity distribution on the peripheral portion can be simultaneously realized by a single system, and at the same time, a decrease in illuminance can be prevented. Therefore, a resolving power can be increased without increasing the exposure time. As described above, by combining a plurality of embodiments described above, an enhanced effect can be obtained.

As described above, in the embodiments described with reference to FIGS. 39(a) to 45(b), the range of inclination angle of the illumination light used in the conventional system is set in accordance with the numerical aperture of the optical projection lens, and imaging at a maximum resolving power of the optical projection lens can be achieved. In addition, an annular light source can be obtained without using an annular aperture stop to prevent a decrease in illuminance by a special diaphragm. The resolving power can be increased for any pattern without posing any problem such as an increase in exposure time.

The method of inclining a ray perpendicular to a mask by inserting an optical device in an exposure apparatus, and a method of inclining mask illumination light by increasing the apparent radius of a light source by means of an optical fiber, a conical lens, or a special aperture stop and by using only rays on the peripheral edge of the aperture stop or the like have been described above. Differences in illumination systems in these methods will be described with reference to FIGS. 46(a) to 47(b).

Figure 46A:
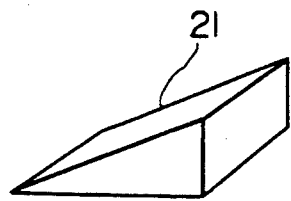
FIGS. 46(a) to 46(b2) are views for explaining an oblique incidence illumination light source upon insertion of the optical device (proposed in the previous drawing)
Figure 46B:
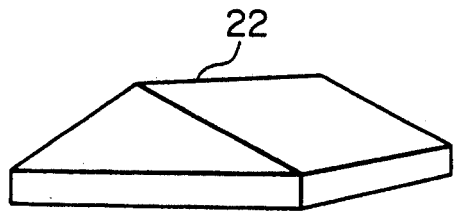
Figure 46:
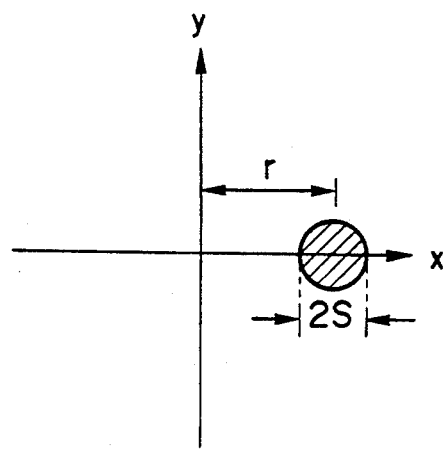
Figure 46:
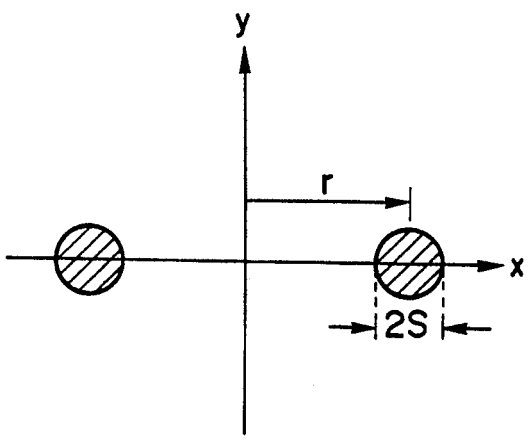
Figure 46:
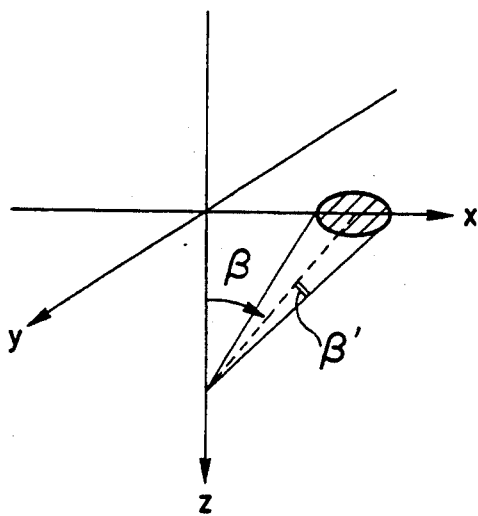
Figure 46:
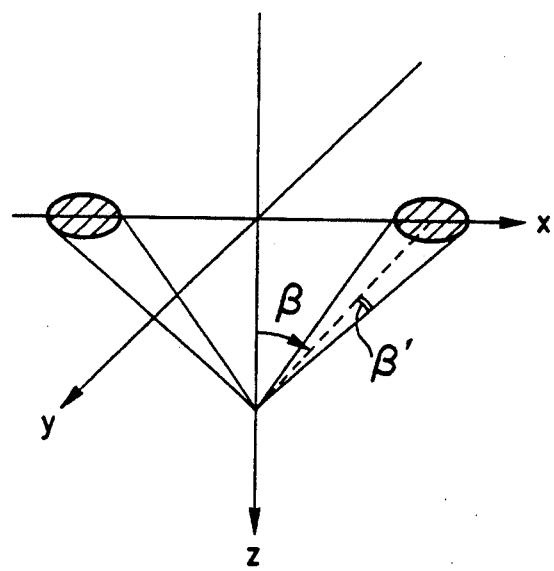

FIGS. 46(a) to 46(b2) are views for explaining effects of oblique incidence illumination light sources realized by inserting optical devices. FIGS. 46(a1) and 46(b1) show cases in which rays incident on a reticle are substituted with rays on an exit surface of a secondary source. FIGS. 46(a2) and 46(b2) conceptually illustrate angles of rays incident on the reticle. An origin in each of FIG. 46(a1) and 46(a2) coincides with an intersection between an x-y plane and the optical axis. FIGS. 46(a1) and 46(a2) show a case for a prism 21 of a right-angled triangle and FIGS. 46(b1) and 46(b2) show a case for a prism 22 of a rectangular equilateral triangle, or a one-dimensional diffraction grating. The radius of a small circle corresponds to that of the aperture stop of the secondary source in the normal exposure system, and a distance r from the origin to the center of the small circle corresponds to an inclination angle in oblique incidence illumination.

Figure 47A:
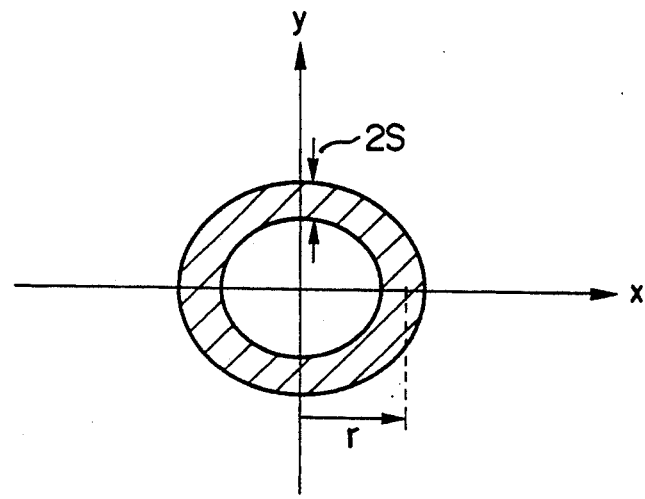
FIGS. 47(a) and 47(b) are views for explaining an oblique incidence illumination light source by means of the optical fiber and the annular aperture stop (proposed in the previous drawings)
Figure 47B:
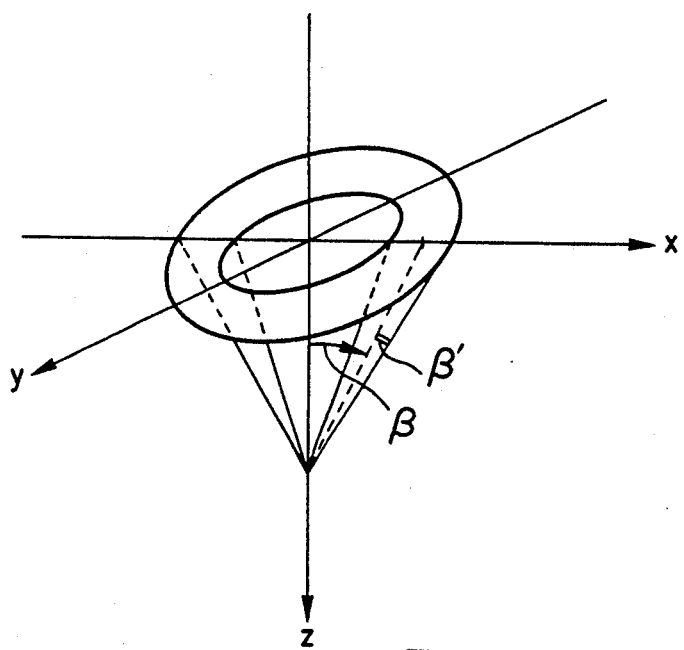

FIGS. 47(a) and 47(b) are views for explaining an effect of a light source in oblique incidence illumination obtained by an optical fiber or an annular aperture stop. FIG. 47(a) shows an aperture stop of a secondary source, and FIG. 47(b) conceptually illustrates an angle of reticle illumination light from this light source. As is apparent from a comparison between FIGS. 46(a) to 46(b2) and FIGS. 47(a) and 47(b), the natures of rays for illuminating a mask are different from each other in accordance with different methods even if illumination light is inclined in correspondence with the numerical aperture of the optical projection lens. If the illumination method using the prism shown in FIG. 46(a) is defined as oblique incidence illumination from one direction, the illumination method using an annular aperture stop can be expressed as oblique incidence illumination from all directions at a predetermined angle.

An inclination angle of oblique incidence illumination in optical reduction exposure is defined as a normalized incident angle R, and a divergence of the rays corresponding to coherency $\sigma$ in normal exposure is defined as $\sigma_D$ as follows:

$$R = m \cdot \sin\beta / NA$$

$$\sigma_D = m \cdot \sin\beta' / NA \quad (16)$$

where m is the reduction magnification, $\beta$ is the inclination angle of the center of the incident rays with respect to the optical axis, $\beta'$ is the divergent angle of the rays, and NA is the numerical aperture of the projection system. As shown in FIGS. 46(a) to 46(b2) and FIGS. 47(a) and 47(b), the meanings of $\sigma_D$ are different between all-direction incidence as in an annular aperture stop and limited-direction incidence as in a prism. The cases in FIGS. 46(a) to 46(b2) and 47(a) and 47(b) are approximated by the following equations:

$$r \approx \sin\beta = (R \cdot NA)/m$$

$$s \approx \sin\beta' = (\sigma_D NA)/m \quad (17)$$

Of the techniques for realizing an exposure method in oblique incidence illumination, the method using the prism of the rectangular equilateral triangle limits an area in which rays in both directions are superposed on each other. In order to cause oblique incidence illumination on the both entire surfaces of a reticle, rays having a large area must be incident on both large sides of the prism. It is very difficult to achieve this in accordance with the state-of-the-art techniques.

In the method of inserting an optical device including the prism of the right-angled triangle, it is necessary to accurately align the direction of installation of the optical device with the x and y directions of the pattern. This always poses a problem when a device is replaced with another in a detachable system.

In the two methods of realizing oblique incidence illumination, when an LSI pattern has line patterns perpendicular to the directions of insertion of the optical elements, the resolving powers cannot be maximized, resulting in inconvenience.

In order to solve the above problem, oblique incidence illumination from a specific direction or a plurality of finite directions must be realized without inserting the optical device. This can be achieved as follows. An inclination angle corresponding to the numerical aperture of the projection system is obtained by modifying a secondary source or changing the magnification of the condenser lens as in annular incidence illumination. At the same time, a specific aperture stop having a shape suitable for a desired incidence method such as one-point oblique incidence illumination or 2-point oblique incidence illumination so as to obtain a desired shape of exit light from the second source is inserted in a secondary source exit portion.

With the above arrangement, the effective radius of the light source can be increased by using an optical fiber or a conical lens. At the same time, the light intensity is concentrated on the peripheral portion or several areas within the peripheral portion, and a special diaphragm having the desired shape is inserted therebehind. Limited-direction oblique incidence illumination can be easily realized without decreasing the light intensity by the aperture stop. By this limited-direction oblique incidence illumination, a resolving power can be increased to be suitable for an LSI pattern without inserting an optical device.

An embodiment of the present invention described above will be described with reference to FIGS. 48(a) to 52(b).

A method of this embodiment includes the basic steps of increasing the effective radius of a light source for obtaining a desired inclination angle and forming an exit hole of a light source so as to realize limited-direction (one direction) oblique incidence illumination. In addition, in order to prevent a decrease in illuminance caused by a decrease in area of the exit hole, a function of concentrating rays on an exit portion in advance can be provided. Detailed arrangements will be described with reference to the accompanying drawings in units of its functions.

First, there is provided a method of using various special aperture stops shown in FIGS. 48(a) to 48(f) in place of the annular aperture stop for increasing the effective radius of the light source and concentrating the rays in an annular shape. The method of increasing the effective radius of the light source may be one of the three methods disclosed in the prior-art invention, i.e., a method using an optical fiber, a method using a conical lens, and a method of obtaining an angle of oblique incidence illumination by increasing the magnification of the condenser lens while the actual radius of the light source is kept unchanged. Desired oblique incidence illumination light sources can be realized by combining these methods and the following special aperture stops.

The special aperture stops shown in FIGS. 48(a) to 48(f) are inserted between the filter 70 and the output lens 67 in the exposure system in FIG. 40. Each special aperture stop is detachable. FIGS. 48(a) to 48(f) show apertures A of aperture stops in secondary source exit portions, respectively. The x- and y-axes on the exit plane correspond to the x- and y-axes on the reticle, and the origin is an intersection between the optical axis and each exit plane.

Figure 48A:
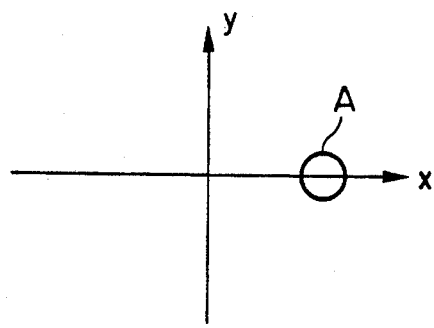
FIGS. 48(a) to 48(f) are views showing special aperture stops used in the present invention, respectively.

FIG. 48(a) shows the diaphragm for realizing oblique incidence illumination from one direction. The diaphragm in FIG. 48(a) corresponds to an optical device in which a prism of a right-angled triangle (half roof) shown in FIG. 21 is inserted. This method aims at increasing a resolving power in one corresponding direction. This diaphragm is suitable in a case wherein a large number of fine line patterns are present in, e.g., the y direction, and only patterns having a line width three times that of thee line patterns in the y direction or larger patterns are present in the x direction. In this case, the maximum resolving power is obtained and the depth of focus can be increased. When the pattern shapes in the x and y directions are reversed and the patterns in the x direction are fine line patterns, the diaphragm in FIG. 48(a) is rotated through 90° and is mounted.

Figure 48B:
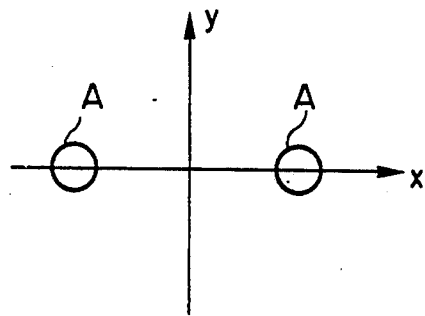

The diaphragm shown in FIG. 48(b) is an aperture stop aiming at realizing oblique incidence illumination from two directions asymmetrical about the optical axis. This aperture stop corresponds to the optical device in which the prism of the rectangular equilateral triangle (full roof) in FIG. 23(b) is inserted. As compared with the case in which a large area for superposing incident rays of both directions cannot be assured by prism insertion, incident rays on both the directions can be incident on almost the entire surface by this aperture stop. When the diaphragm in FIG. 48(b) is used, the resolving power of a pattern in one of the x and y directions can be increased when patterns are present in both the x and y directions. As compared with the diaphragm of FIG. 48(a), an increase in depth of focus is small in the diaphragm of FIG. 48(b). However, the diaphragm in FIG. 48(b) has a resolving power almost equal to that in FIG. 48(a). Since the area of the secondary source exit hole is doubled, the exposure intensity is advantageously high.

Figure 48C:
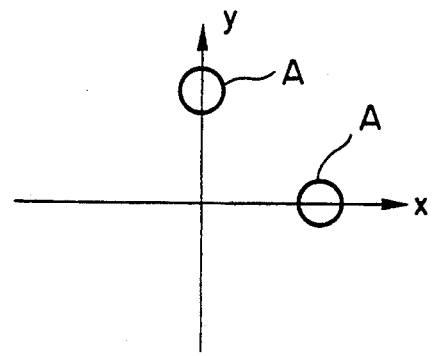

The diaphragm shown in FIG. 48(c) is an aperture stop aiming at realizing oblique incidence illumination from two directions perpendicular to each other. According to this method, the resolving powers of the patterns in both x and y directions can be simultaneously increased.

Figure 48D:
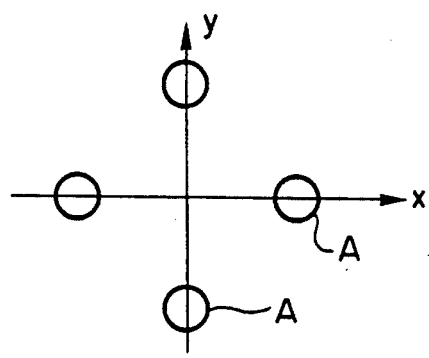

The diaphragm shown in FIG. 48(d) is an aperture stop aiming at realizing oblique incidence illumination from four directions consisting of two directions symmetrical about a given optical axis and two directions symmetrical about an optical axis perpendicular to the given optical axis. This method can increase the resolving powers of patterns in both x and y directions as in the method of FIG. 48(c). In addition, in the diaphragm of FIG. 48(c), the exposure intensity is further increased to shorten the exposure time.

Figure 48E:
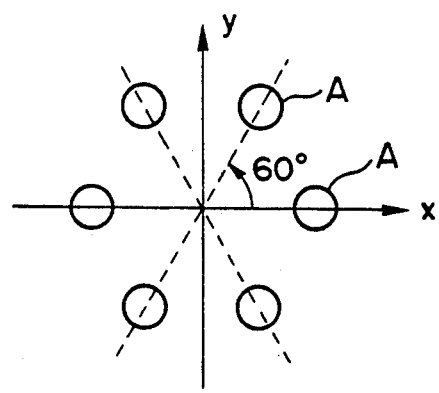
Figure 48F:
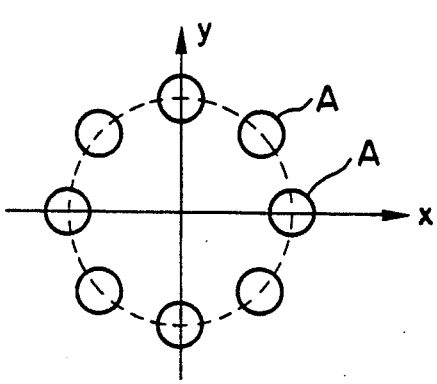

The diaphragm shown in FIG. 48(e) is an aperture stop aiming at realizing oblique incidence illumination from six directions having equal angular intervals (60°) with respect to the optical axis of each incident ray. The diaphragm shown in FIG. 48(f) is an aperture stop aiming at realizing oblique incidence illumination from eight directions having the same characteristics as those of the diaphragm of FIG. 48(e). The diaphragm in FIGS. 48(e) and 48(f) have characteristics close to the annular aperture stop.

Even if any aperture stop described above is used, the resolving powers for patterns in one or a plurality of directions can be increased as compared with a case in which a light source radius increasing method using an optical fiber or a conical lens is combined with a normal exposure method to form a pattern. When the number of incident directions is small, the directions of the reticle incident rays can be easily changed by replacing aperture stops one another in accordance with a pattern to be formed although the exposure intensity is largely decreased, as compared with the following case.

An embodiment of a method of realizing a secondary source as in several aperture stops shown in FIGS. 48(a) to 48(f) according to another method without using an aperture stop or with an aperture stop being used as an auxiliary device will be described below.

Figure 49:
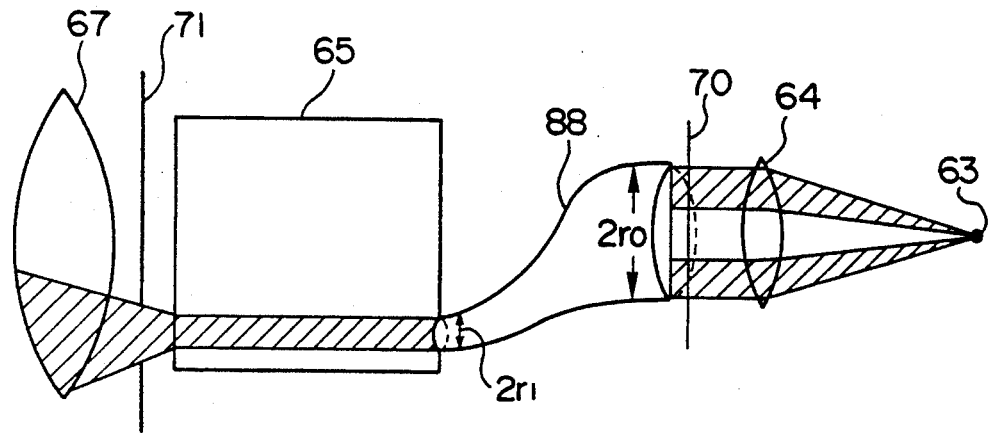
FIG. 49 is a view for explaining a one-directional oblique incidence illumination light source according to still another embodiment of the present invention.

FIG. 49 shows a method of oblique incidence illumination from one direction by imaging rays into one point using optical fibers. Reference numeral 63 in FIG. 49 denotes a second focal point. This point is a point at which rays emitted from a light source lamp 61 in an optical projection exposure system are focused by an elliptical mirror 62. Rays from this focal point 63 become parallel rays through an input lens 64. Operations before the rays pass through a filter 70 are the same as those in normal exposure. An optical fiber bundle 88 having a radius ($2r_1$) at one end thereof and a radius ($2r_0$) at the other end thereof larger than the radius at one end is installed in a layout as shown in FIG. 49. The rays are concentrated in a small area and are displaced to a position where desired inclination is given. Assume that the numerical aperture of a projection system is 0.5, its reduction magnification is 1/5, a $\sigma$ value is set to be 0.5, and the radius of the entrance pupil is 1.5 cm.

As an example of oblique incidence illumination, if the divergent angle of rays is given as $\sigma_D=0.2$ and an inclination degree is given as R=0.8, the rays are focused by the optical fiber bundle 88 to a circle having a radius of 0.6 cm. At the same time, the center of this circle is shifted to a point spaced apart from the optical axis by 2.4 cm in the x direction, thereby realizing a desired oblique incidence illumination light source. The rays emerging from the optical fiber bundle 88 pass through the optical integrator 65 as in the normal exposure system and are incident on the output lens 67 of the illumination system. The optical integrator 65 may be omitted. Alternatively, a method of arranging small lenses at the exit end of the optical fiber bundle 88 to serve as an optical integrator may also be effective.

When the optical integrator is inserted, an aperture stop 71 arranged such that a circular hole having a radius of 0.6 cm is formed therein at a position spaced apart from the optical axis by 2.4 cm in the x direction is preferably inserted, particularly, between the optical integrator 65 and the output lens 67. Although the aperture stop 71 is preferably inserted to obtain a desired oblique incidence illumination light source, a bundle of rays having a desired diameter are already formed at a desired position by the optical fiber bundle 88, and the number of rays shielded by this aperture stop is small.

The above description exemplifies focusing of rays on one point However, when rays are incident from two corresponding directions, as shown in FIG. 48(c), the optical fiber bundle 88 is divided into two parts, the exit port of one part is guided to a predetermined position in the x direction, and the exit port of the other part is guided to a predetermined position in the y direction, thereby obtaining desired light sources Similarly, the oblique incidence illumination light sources corresponding to all the aperture stops shown in FIGS. 48(a) to 48(f) can be formed by the optical fibers.

Figure 50:
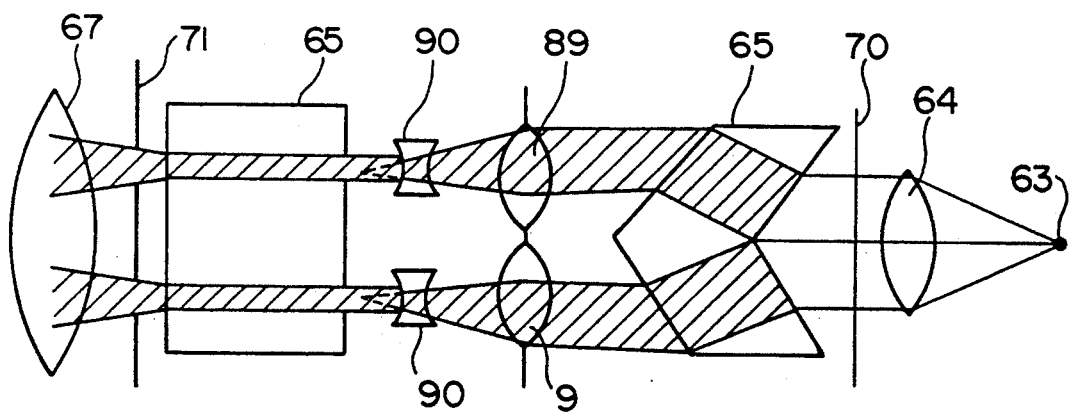
FIG. 50 is a view for explaining a two-directional oblique incidence illumination light source using a conical lens according to still another embodiment of the present invention.

A method of performing oblique incidence illumination by a combination of a conical lens and convex and concave lenses in place of the optical fibers will be described below. FIG. 50 is a view for explaining this method in which oblique incidence illumination is performed from two directions symmetrical about the optical axis. Operations until the rays passing through an input lens 64 pass through a filter 70 are the same as those of the optical fiber bundle in FIG. 49. In the arrangement of FIG. 50, the rays passing through the filter 70 pass through a lens obtained by stacking cones, i.e., a conical lens 65. During this operation, the radius of the bundle of rays is increased to obtain a desired inclination degree The rays passing through the conical lens 65 are an annular bundle of parallel rays having a section having a large width. Convex lenses 89 are located at two angular positions symmetrical about the optical axis, and concave lenses 90 are located coaxially with the convex lenses at positions in front of the focal points of the convex lenses 89. When the convex lenses 89 are located at two positions of the annular bundle of rays having a second having a large width, rays incident on the two convex lenses 89 are focused. Since the concave lenses 90 are located in front of the focal points of the convex lenses 89, circular parallel rays each having a small radius are obtained.

At this time, the position of the circular bundle of rays and the radius of the circle corresponds to the inclination degree and the divergence of the rays, respectively. As in the previous example, in an exposure system in which a $\sigma$ value is set to be 0.5 and the radius of the corresponding light source is 1.5 cm, in order to realize oblique incidence illumination having an inclination degree as R=0.7 and a divergence of the rays as $\sigma_D$=0.2, the two bundles of rays have circles having centers as positions (symmetrical about the optical axis) spaced apart from each other by 2.1 cm from the optical axis. For this purpose, the maximum radius of the annular bundle of rays is increased to a maximum of 4.2 cm by the conical lens 65. In order to focus a large number of rays, the radius of each of the two convex lenses 89 is preferably large The radius is set so as not to overlap two convex lenses In this case, two convex lenses each having a radius of 2.1 cm are located such that their centers are spaced apart from the optical axis by 2.1 cm.

Assume the focal length of the convex lens 89 is defined as $f_1$. The concave lens 90 having a radius of about 1 cm is spaced apart from the convex lens by a 5/7 $f_1$ distance and located at a 2.1-cm point as in the convex lens from the optical axis so that the centers of the corresponding convex and concave lenses are aligned with each other Under this condition, the rays passing through the concave lens 90 become a bundle of parallel rays having a radius of 0.6 cm. In this lens system, rays which are not incident on the convex lens 89 after passing through the conical lens 65 do not contribute to form a light source. For this reason, a light-shielding plate is preferably arranged around the convex lens, or an aperture stop is preferably arranged to open the convex lens portion to shield the peripheral rays.

Figure 51A:
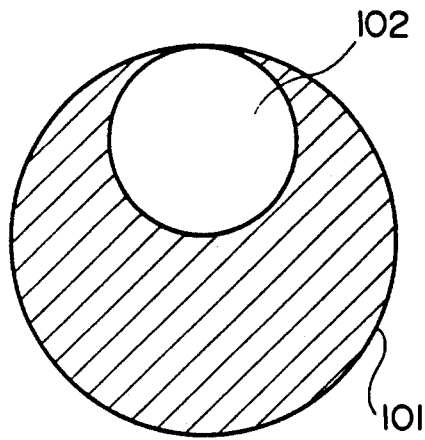
FIGS. 51(a) to 51(d) are views for explaining an opaque region around convex lenses of this embodiment.
Figure 51B:
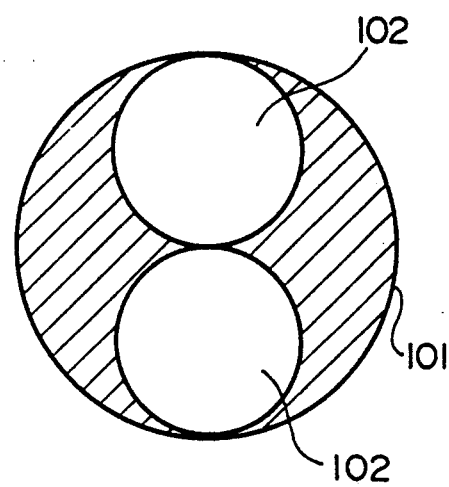
Figure 51C:
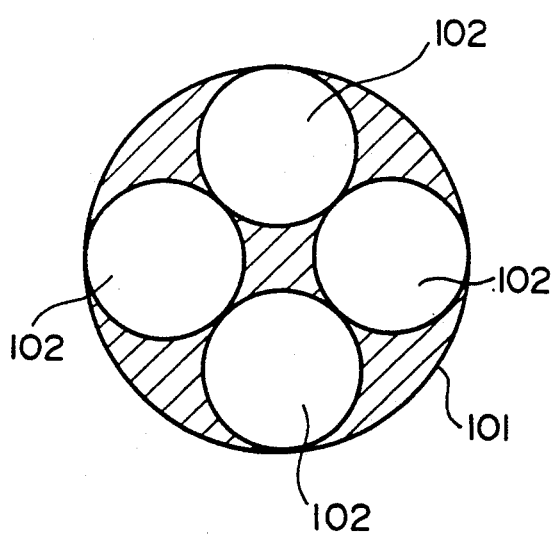
Figure 51D:
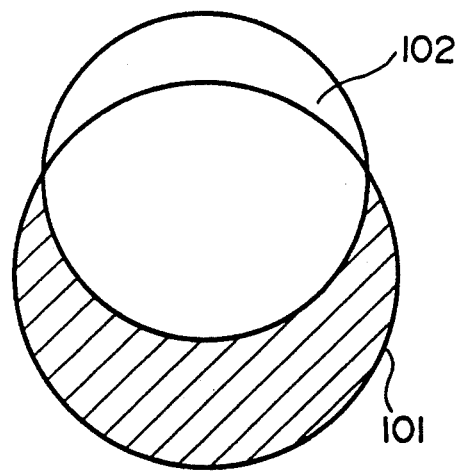

Opaque areas in several limited-direction oblique incidence illumination operations are indicated by hatched portions in FIGS. 51(a) to 51(d). Reference numeral 101 in each of FIGS. 51(a) to 51(d) denotes a transparent area; 102, a light incident area for the convex lens 89. FIG. 51(a) shows a case of oblique incidence illumination from one direction, FIG. 51(b) shows a case of oblique incidence illumination from two directions, FIG. 51(c) shows a case of oblique incidence illumination from four directions, and FIG. 51(d) shows a case of oblique incidence illumination from one direction under suppression of the light intensity. At this time, if the light intensity of rays having passed through the conical lens 65 is assumed to be entirely uniform, the decrease in light intensity by shielding is 50%. Similarly, when convex lenses are located at four positions symmetrical about the optical axis, the light intensity is decreased by about 31%.

That is, if a large convex lens is used to perform a focusing operation, a decrease in exposure intensity caused by light shielding to obtain an oblique incidence illumination light source is a maximum of ⅔ even in oblique incidence illumination from one direction. However, if a localized light intensity distribution in one direction is required, a prism is used in place of a conical lens to focus rays on a necessary portion in advance, thereby further suppressing the decrease in intensity. Although a method of directly obtaining a limited-direction oblique incidence illumination light source by a combination of an optical fiber and a lens cannot easily change this limited direction, but has advantageously a small decrease in exposure intensity.

The embodiment described above with reference to FIGS. 48(a) to 51(d) according to the present invention can greatly increase a resolving power when the range of inclination of the reticle illumination light used by the conventional system is set in correspondence with the numerical aperture of the optical projection lens. In addition, the limited-direction oblique incidence illumination corresponding to line patterns frequently used in LSIs is realized by a light source, and a high resolving power can be obtained for patterns such as LSI patterns without inserting an optical device, alignment of which is difficult.

A relationship between an angle of oblique incidence illumination and a pattern shape will be examined.

In the invention of the present application in FIG. 1, light illuminated on the reticle is inclined with respect to the optical axis, so that the light having a large diffraction angle passes through the reticle to increase a resolving power. Light having a largest diffraction angle can pass when the zero-order diffracted ray passes the outermost portion, thereby obtaining a maximum resolving power.

The above discussion is effective for infinite long lines and interval patterns when the reticle illumination light is given by a perfectly coherent point light source. However, in a practical exposure system, since a light source has a finite size, partially coherent processing is required.

An accurate discussion on coherency in a partially coherent arrangement is avoided for descriptive simplicity, and the fact that a light source has a finite size will be taken into consideration. A normalized incident angle R representing an inclination degree of a light source and a divergence $\sigma_D$ of the rays corresponding to coherency of the light source to describe an oblique incidence illumination method in an optical reduction projection exposure having a light source having a finite size are defined as follows:

$$R = m \cdot \sin\beta / NA \quad (14)$$

$$\sigma_D = m \cdot \sin\beta' / NA \quad (15)$$

where m is the reduction magnification, $\beta$ is the inclination angle of the center of the incident rays with respect to the optical axis, $\beta'$ is the divergent angle of the rays, and NA is the numerical aperture of the projection system. According to these definitions, the inclination degree corresponding to the numerical aperture of the projection system is represented by R=1.

Even if the light source has a finite size, the nature in which a higher resolving power can be obtained by oblique incidence illumination of rays from the center of the light source on the reticle as compared with vertical incidence illumination is apparent from the analogy in the above discussion. However, unlike in a point light source, if R=1 in equations (14) and (15), the $\sigma_D$ value is not zero. In incident light having the largest inclination angle, its zero-order ray is shielded by the aperture stop of the projection system. When part of the zero-order diffracted ray is shielded, the resolution improvement effect is adversely affected. Therefore, a resolving power for R=1 cannot be maximum. Since the rays are distributed in the range of R−$\sigma_D$ to R+$\sigma_D$, it is assumed that a maximum effect in an increase in resolving power can be obtained in a line interval in which a combination of R and $\sigma_D$ which comes close to 1 within the range below R+$\sigma_D$ infinitely continues.

In the above discussion examining only the central portion of the line interval pattern, the $\sigma_D$ value must be decreased to increase to the resolving power with a large R value. However, when the $\sigma$ value is small, the effective area of the light source is small. For this reason, the illuminance is decreased to undesirably prolong the exposure time, thus posing another problem.

When the $\sigma$ value comes close to zero, the high-frequency components of the MTF frequency characteristics abruptly become zero. For this reason, the intensity distribution is waved at ends of patterns due to coherency, and a pattern having a desired pattern cannot be formed at the end of a pattern. In order to relatively properly form a pattern end portion, differential coefficients are preferably small near zero MTF in the MTF frequency characteristics. These MTF characteristics can be obtained by causing the o value to have a finite value.

Figure 52A:
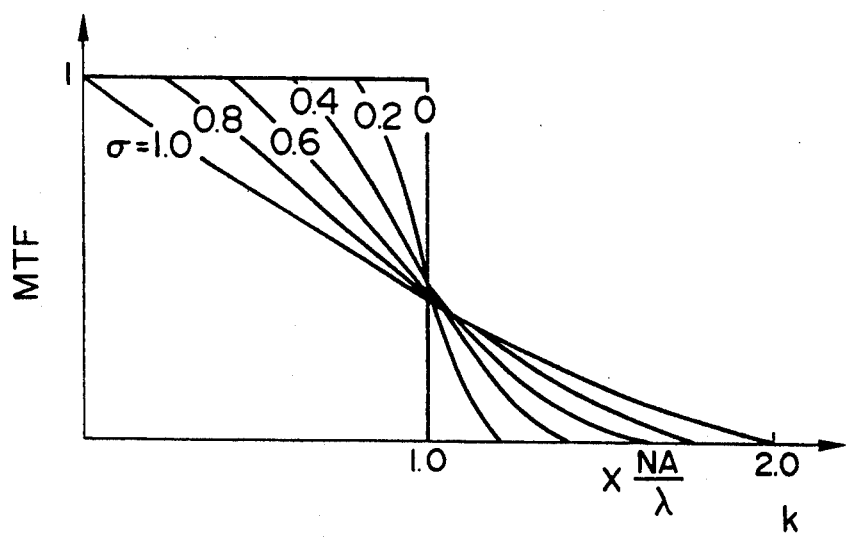
FIGS. 52(a) and 52(b) are graphs showing MTF frequency characteristics according to vertical and oblique incidence illumination methods, respectively.
Figure 52B:
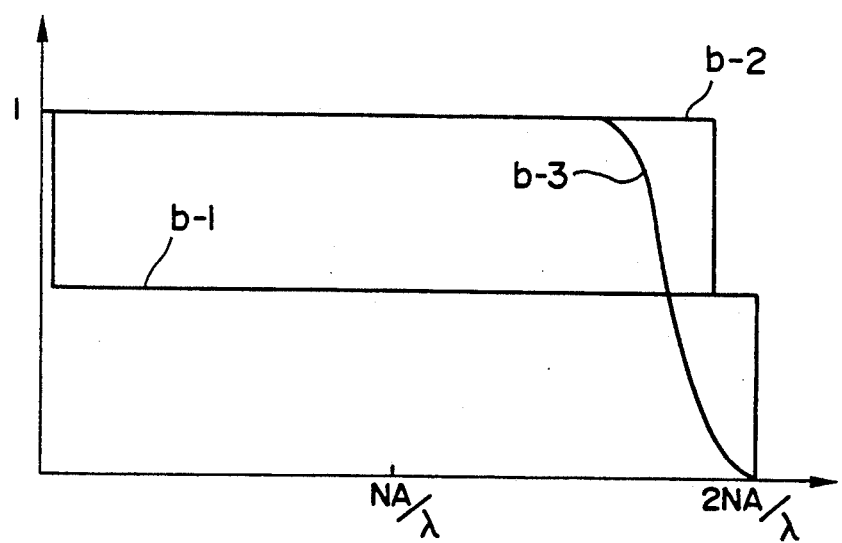

The MTF characteristics in normal illumination exposure and oblique incidence illumination at a fixed angle are qualitatively illustrated in FIGS. 52(a) and 52(b). FIG. 52(a) shows a case in vertical incidence illumination, and FIG. 52(b) shows a case of oblique incidence illumination (zero-order ray filter).

In MTF characteristics for coherent oblique incidence illumination ($\sigma_D=0$), the MTF is abruptly decreased to 0.5 near the zero frequency, as indicated by a characteristic curve b−1 in FIG. 52(b). This is caused by superposition of the zero-order diffracted ray having passed through the reticle. This trouble can be eliminated by arranging a transmittance attenuation filter in the peripheral portion of the pupil of the optical projection lens, i.e., inside the aperture stop. The MTF characteristics for $\sigma_D=0$ upon arrangement of this filer are represented by a characteristic curve b−2 in FIG. 52(b).

To the contrary, the MTF characteristics with a filter for a finite $\sigma_D$ value become relatively smoothly zero as indicated by a characteristic curve b-3 in FIG. 52(b). In an LSI pattern, a large number of patterns close to line interval patterns are present. These patterns are made of line patterns having a finite number, and line end portions and patterns having large areas are also present. When various patterns in the LSI are to be resolved, a better effect is not always obtained by a small $\sigma$ value. In normal exposure, $\sigma=0.5$ is regarded as an optimal value and is generally employed in many optical projection exposure systems. In oblique incidence illumination exposure, it is assumed that an optimal value falls within the range of 0.05 to 0.5 in accordance with patterns and shapes of light sources.

On the other hand, when an inclination degree in oblique incidence illumination is set to be R=1 or R+$\sigma_D$=1, a maximum resolving power for imaging rays utilizing the outermost portion of the lens is assumed to be obtained. In practical patterns, when a pattern having a smallest width is given as, e.g., a 0.3-μm pattern, a necessity of a resolving power for a size smaller than the smallest width is low. It is more important to obtain a larger depth of focus for the maximum resolving power of 0.3 μm, a larger exposure amount margin, and a larger process margin.

Only a system for fixing an inclination angle is proposed as an exposure system using an oblique incidence illumination scheme. If $\sigma_D$ is fixed to a given value, an R value for giving a maximum resolving power is determined, and the system having the inclination angle corresponding to the determined R value is manufactured. However, since an optimal $\sigma_D$ value does not often correspond to an optimal R value depending on the patterns described above, a maximum pattern formation capacity cannot be obtained by the above inclination angle fixing scheme.

In order to solve this problem, a divergent angle and an inclination degree of the bundle of incident rays are set in accordance with different patterns to obtain accurate micropatterns. At the same time, the divergent angle of the bundle of incident rays and its inclination degree are changed in accordance with patterns and processes.

For this purpose, in an optical projection exposure system for projecting and exposing a pattern on a mask onto a wafer through a projection optical system, an aperture stop in a secondary source exit portion is detachably arranged, or an aperture area adjusting function is provided to an aperture stop itself and the aperture stop is set movable along the optical axis while the magnification of the condenser lens is set variable.

With the above arrangement, the aperture stop in the second light source exit portion can be detachably arranged, or the aperture area adjusting function is given to the aperture stop itself to adjust the divergence of the bundle of incident rays. In addition, the magnification of the condenser lens can be set variable and the bundle of incident rays can be moved along the optical axis. Therefore, the inclination degree of the bundle of incident rays can be changed arbitrarily or at one of a plurality of preset angles. The divergence of the rays can be adjusted in accordance with characteristics of pattern shapes, the inclination degree of the rays are adjusted in accordance with the pattern size and the divergence, and a fine pattern can be formed by a normal exposure system stably with a maximum process margin corresponding to the pattern size.

The present invention described above will be described with reference to an embodiment of FIGS. 53(a) to 57(d').

Figure 53A:
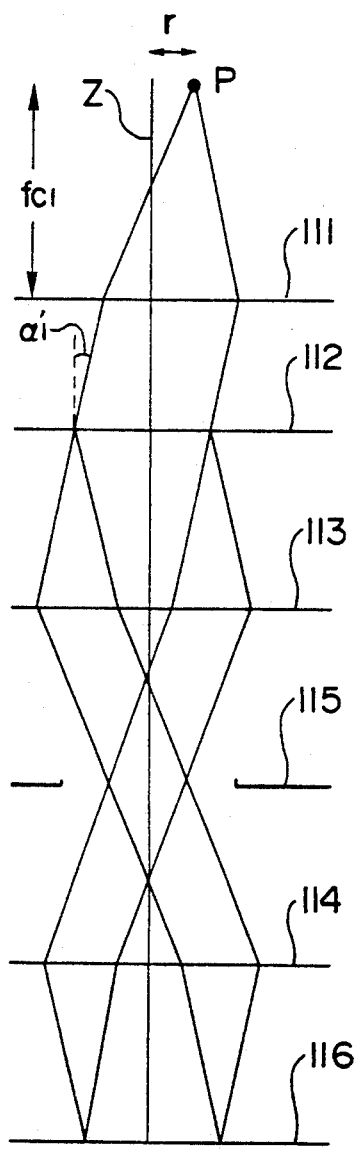
FIGS. 53(a) and 53(b) are views showing a magnification-variable projection optical system in an optical projection exposure system according to the present invention.
Figure 53B:
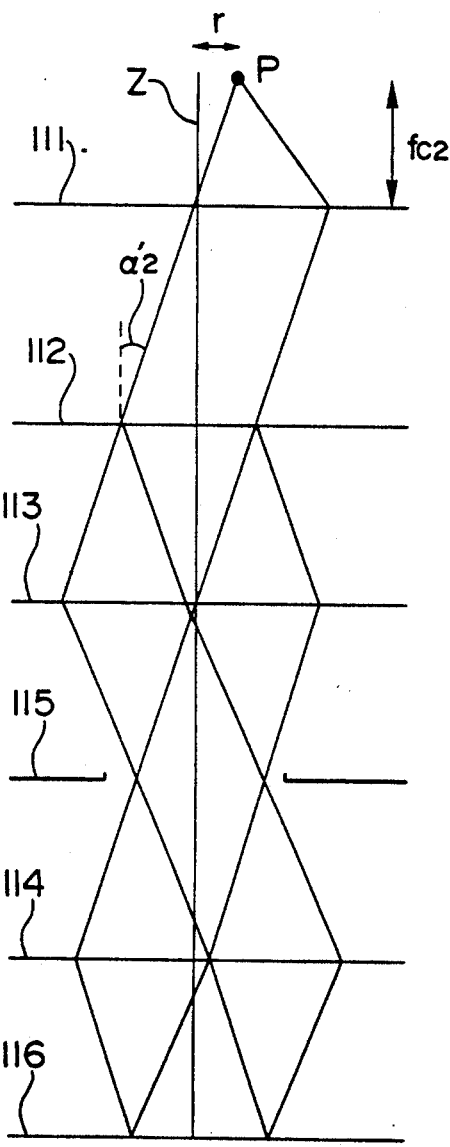

FIGS. 53(a) and 53(b) illustrate a magnification-variable projection optical system in an optical projection exposure system according to the present invention, exemplifying an embodiment of a method of changing rays illuminating a reticle 112 within the range of angles corresponding to optical projection lenses 113 and 114 or setting the rays at a plurality of preset angles. thereby performing exposure. Part of a finite light source which does not include an optical axis is used as a light source. A lens system as a combination of several lenses and having a zoom function is used as the condenser lens 111. A simplest arrangement is a combination of two convex lenses to change a relative distance therebetween to change a focal length. Any lens system can be used if it has a function of fixing a focal point and changing a focal distance. A projection system aperture stop 115 is arranged between the first optical projection lens 113 and the second optical projection lens 114. Light diffracted by a mask pattern on the reticle passes through the projection lens system, so that an image is formed on a wafer surface 116.

A ray from a point P and spaced apart from the optical axis by r is taken into consideration. In each of FIGS. 53(a) and 53(b), the condenser lens system 111 having a zoom function is represented by one lens and a line segment perpendicular to the optical axis. The condenser lens system 111 is adjusted so that the light source is always located on the negative focal plane of the condenser lens system. The optical system in FIG. 53(a) is the same as that in FIG. 53(b). When the magnification or focal length of the condenser lens system 111 is changed, the angle of oblique incidence illumination is changed, as shown in FIGS. 53(a) and 53(b) More specifically, FIG. 53(a) shows a case in oblique incidence illumination having a small angle, while FIG. 53(b) shows a case in oblique incidence illumination having a large angle. In each of FIGS. 53(a) and 53(b), the condenser lens system 111 is illustrated as one lens, so that the lens system is moved so that the light source is located on the focal plane of the lens. In practice, the focal length is changed by the zoom function of the condenser lens system, and at the same time the lens system is adjusted so as not to change the focal point. A method of fixing a focal point may be used by moving the lens system shown in FIGS. 53(a) and 53(b).

Only the ray from the point P spaced apart from the optical axis by the distance r has been described. Any light source which does not include an optical axis and has an effective area may be used as a practical light source. It is assumed that one point in this effective area is regarded as the point P. An arbitrary angle may be variably set as a magnification by a zoom lens function. However, lenses of the zoom lens system can be set in the range of the finite number of positions to stably and easily set a magnification.

An embodiment of a method of changing an effective area of a light source will be described below. A change in size of the light source indicates a change in degree of variations in incident angles of rays incident on the reticle. This change is associated with an effect of an oblique incidence illumination method. If patterns to be formed consist of only line interval patterns, the $\sigma_D$ value is suitably as small as about 0.1. However, in consideration of the presence of pattern ends and large patterns, the $\sigma_D$ value must be adjusted to be, e.g., 0.3.

Figure 54A:
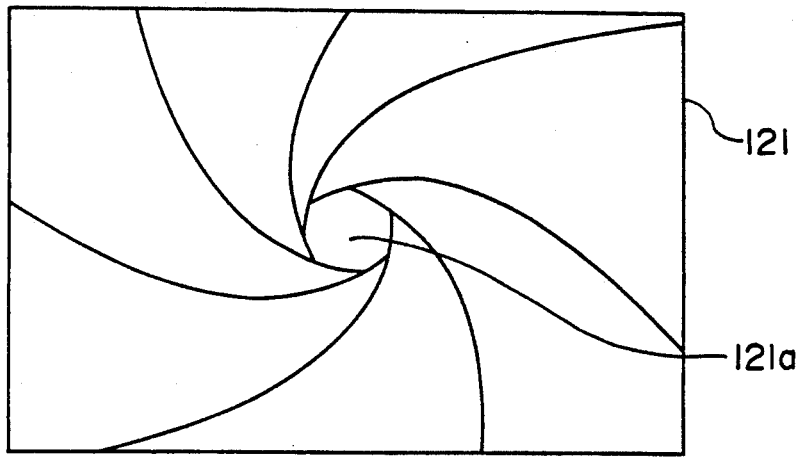
FIGS. 54(a) and 54(b) are views showing an area-variable aperture stop used in the present invention.
Figure 54B:
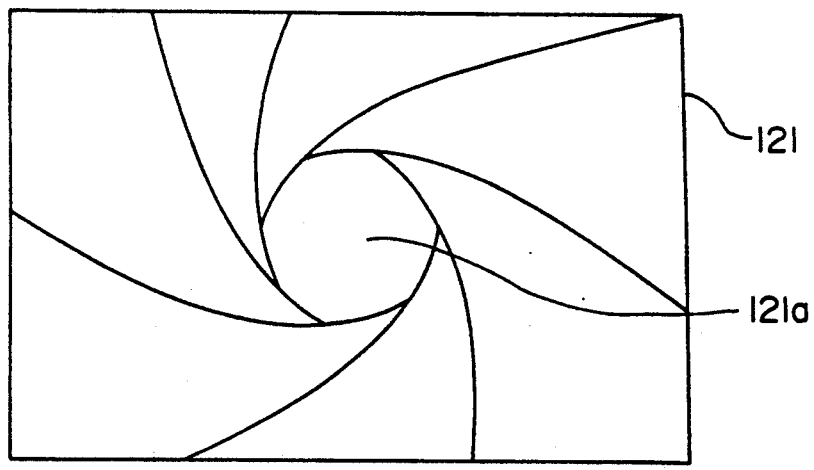

An aperture stop whose aperture is variable is arranged at the exit aperture of a secondary source, or an aperture stop of an illumination system is set replaceable. In the former case, the size of an aperture 121a is changed using an aperture stop 121 having a shape shown in FIGS. 54(a) and 54(b). FIG. 54(b) shows a state in which the aperture 121a of the aperture stop 54(a) is enlarged. In the latter case, aperture stops having circular apertures having different sizes are prepared, and a proper aperture stop is selected in accordance with a given pattern. When an angle in oblique incidence illumination is fixed, an aperture stop is located at a position corresponding to the angle. When the illumination aperture stop is used in combination with the embodiment for changing the magnification of the condenser lens to incline the reticle incident light, the center of an aperture, if it is circular, must be shifted from the optical axis.

Figure 55A:
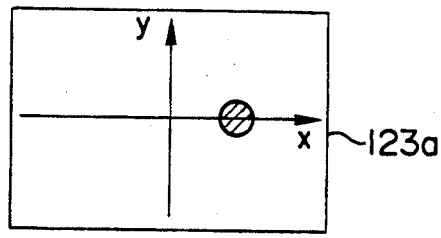
FIGS. 55(a) to 55(h) are views showing illumination-side aperture stops used in the present invention, respectively.
Figure 55E:
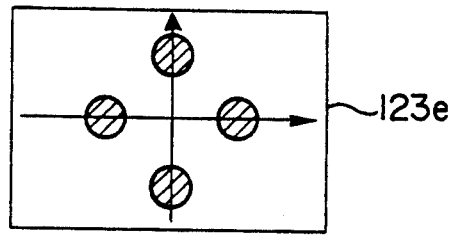
Figure 55B:
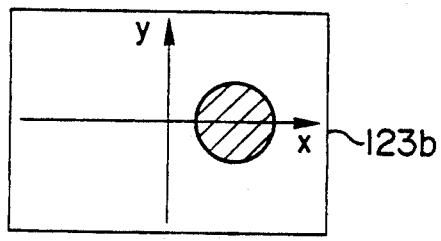

Illumination aperture stops used in this case are exemplified in FIGS. 55(a) to 55(h). The x- and y-axes are plotted on respective illumination aperture stops 123a to 123h, and the intersection between the x- and y-axes is defined as an origin. When such an aperture stop is to be arranged in an exposure system, the optical axis of the projection optical system must pass through the origin of the aperture stop. FIG. 55(a) shows the aperture stop for one-side incidence illumination having a small $\sigma_D$. When this aperture stop 123a is used, a resolving power can be greatly increased. The aperture stop 123a is suitable for fine line interval patterns. FIG. 55(b) shows the aperture stop having a large $\sigma_D$. This aperture stop 123b is suitable for isolated patterns and large patterns which include a small number of periodic portions. The aperture stop shown in FIG. 55(c) for two-side incidence illumination is suitable for an imaging system symmetrical about the optical axis.

Figure 55F:
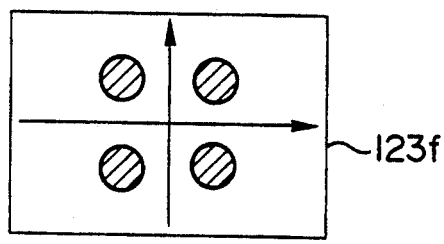
Figure 55C:
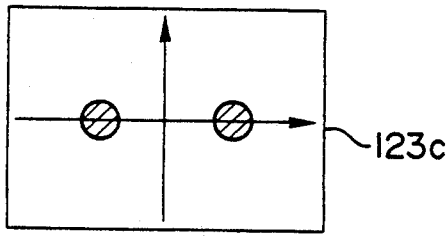
Figure 55G:
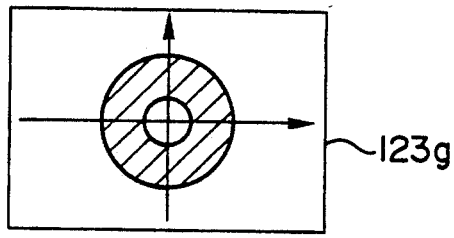
Figure 55D:
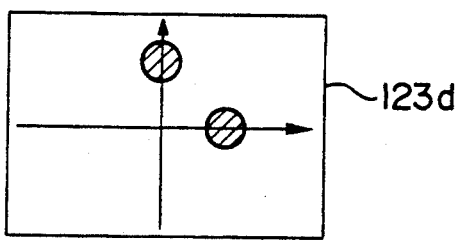
Figure 55H:
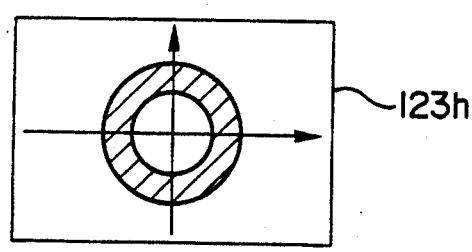

When the aperture stops 123a to 123c shown in FIGS. 55(a), 55(b), and 55(c) are used, the resolving powers of the patterns in the y direction can be increased, but resolving powers of patterns in the x direction are not almost increased. FIGS. 55(d), 55(e), and 55(f) show the aperture stops 123d to 123f which can increase resolving powers in both the x and y directions. More specifically, FIG. 55(d) shows the aperture stop for one-side incidence illumination in both the x and y directions, and FIG. 55(e) shows the aperture stop for two-side incidence illumination. FIG. 55(f) shows the aperture stop for two-side incidence illumination in both the x and y directions. The aperture stop shown in FIG. 55(f) provides a higher resolving power than that in FIG. 55(e). FIGS. 55(g) and 55(h) show the aperture stops 123g and 123h for incidence illumination from all directions by using annular light sources. These aperture stops are effective to increase resolving powers of patterns in all the directions. When the aperture stop 123h shown in FIG. 55(h) is used, it has a higher coherency than that in FIG. 55(g) because the aperture stop in FIG. 55(h) has a larger aperture than that in FIG. 55(g). Therefore, the aperture stop 123h is suitable for a pattern having higher periodicity.

The reticle incident light is inclined within the range of angles corresponding to the numerical aperture of the optical projection lens, and the effective area of the light source is changed to adjust coherency of the reticle incident light. This embodiment will be described in more detail by using numerical values.

For example, the numerical aperture of a projection system of an optical projection exposure system is set to be 0.5, a reduction magnification is set to be 1/5, the $\sigma$ value inherent to the system is set to be 0.5, and the radius of the light source corresponding to this $\sigma$ value is set to be 1.5 cm. Symbols representing the corresponding angle and the like are marked in FIGS. 53(a) and 53(b) when the reduction magnification is set to be 1. If the coherency corresponding to a pattern is given as 0.2, the position of the center of the secondary source is set to be spaced apart from the optical axis by 0.9 cm and the radius of the aperture stop is set to be 0.6 cm by means of a replaceable circular aperture stop or an aperture stop having a variable aperture size. In this case, R=0.3 and R+$\sigma_D$=0.5, so that a resolving power is not largely increased. At this time, the center value of the reticle incident angle is given as follows:

$$\sin\alpha_1' = 0.03$$

$$\alpha_1' = 1.72°$$

The light is then inclined by the zoom function of the condenser lens as follows:

$$\sin\alpha_2' = 0.075$$

$$\alpha_2' = 4.30°$$

A ratio of a focal length $f_{C2}$ of the condenser lens 111 to a focal length $f_{C1}$ of the original condenser lens is defined as follows:

$$f_{C2}/f_{C1} = \tan\alpha_1'/\tan\alpha_2' = \sin\alpha_1'/\sin\alpha_2'$$
$$= 0.03/0.075 = 0.4$$

-continued $$f_{C2} = 0.4 \cdot f_{C1}$$

Thus, R=0.75, R+$\sigma_D$=0.95 are obtained to increase a resolving power in oblique incidence illumination. In this case, a relatively large R value of 0.75 is set. For example, if $\sigma_D$ is set to be 0.3, then R=0.75, and R+$\sigma_D$ exceeds 1. The zero-order diffracted ray is partially shielded by the aperture stop of the projection system. The magnification of the condenser lens must be changed such that R=0.6 in accordance with the $\sigma_D$ value. That is, a change in size of the incident aperture stop and a change in magnification of the condenser lens may be independently performed in accordance with a given pattern, or may be synchronously performed.

A numerical value of the inclination degree R corresponding to the pattern size according to the present invention will be described with reference to FIGS. 56(a) to 56(c). The same reference numerals as in FIGS. 53(a) and 53(b) denote the same parts in FIGS. 56(a) to 56(c). As an example, an operation for forming a pattern having a reference size of 0.3 μm will be described when the numerical aperture of the projection system is set to be NA=0.5 and a wavelength is set to be λ=365 nm under the condition that the reduction magnification is set to be 1 for illustrative simplicity. Since a pitch d is given as 0.6 μm, the 1st-order diffraction angle upon vertical incidence is given as follows:

$$sin\theta_1 = \lambda/d = 0.608$$

$$\theta_1 = 37.5°$$

Figure 56C:
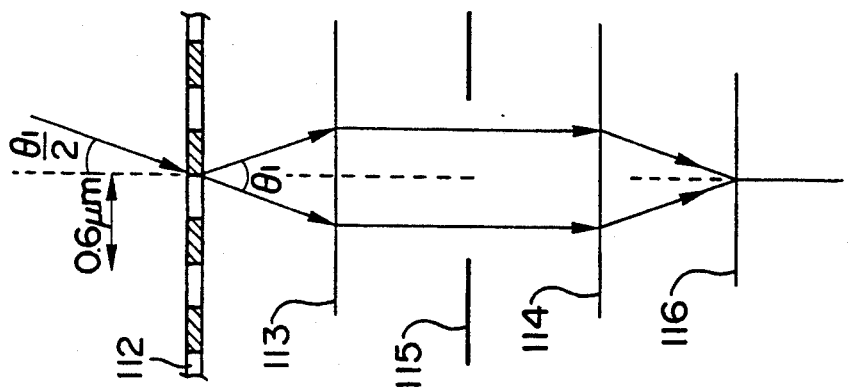
FIGS. 56(a) to 56(c) are views for explaining an oblique incidence illumination method using an incident angle corresponding to a pattern size according to the present invention in comparison with a conventional vertical incidence illumination method.
Figure 56B:
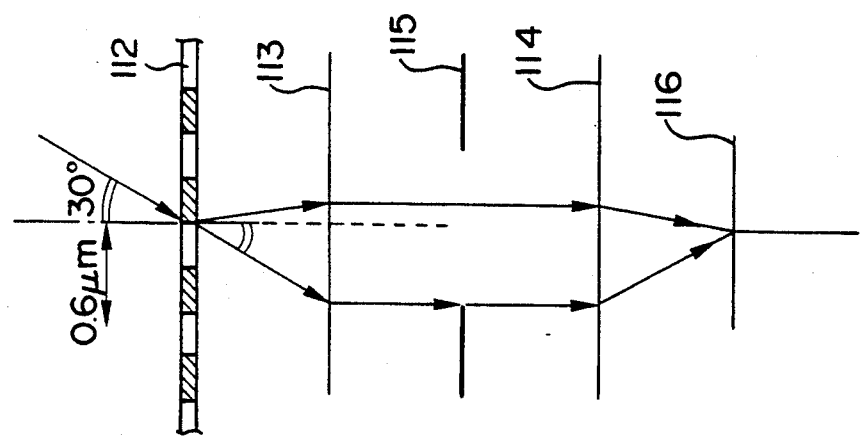
Figure 56A:
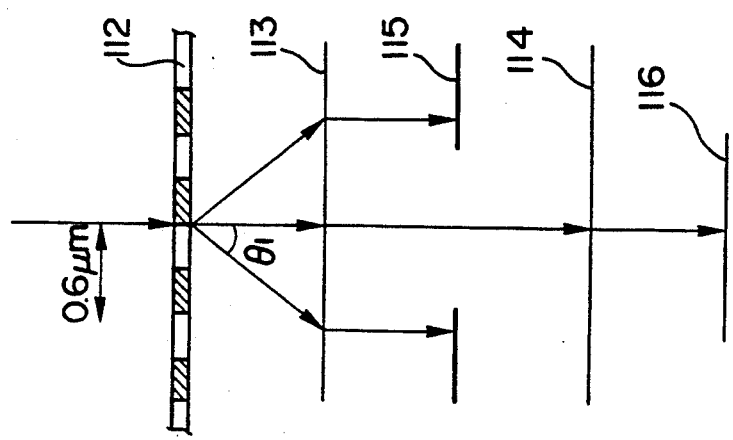

As shown in FIG. 56(a), this pattern is not resolved because it is shielded by an aperture stop 115 in an exposure system for NA=0.5.

When illumination is performed at an angle corresponding to the numerical aperture NA of the projection system regardless of a pattern size, NA=0.5 is given. When a ray is incident at an angle of 30° with respect to the optical axis, a size corresponding to an angle of 60°, i.e., a 0.22-μm line interval pattern can be resolved in principle by using the zero-order light intensity adjustment filter in the projection system. However, if the minimum size of actual patterns is given as 0.3 μm, a resolving power for a 0.22-μm size is not required. It is more important to stably resolve a 0.3-μm pattern. When a 0.3-μm line interval pattern is to be resolved in oblique incidence illumination at this angle, one ray of the rays to be imaged passes through the outermost portion of the lens, and the other ray passes inward from one ray.

On the other hand, when a 0.3-μm pattern is to be resolved, and a ray is incident at an angle of 18.7° as ½ the angle $\theta_1$, the following condition is established:

$$sin\theta_1/2 = 0.321$$

As shown in FIG. 56(c), the ray can be resolved if the numerical aperture NA of the projection system is about 0.35. Zero- and 1st-order diffracted rays which contribute to imaging pass through intermediate lens positions almost symmetrical about the optical axis. When influences of image plane distortion and aberration are taken into consideration, a better result can be expected for illumination at an angle of 18.7° corresponding to the resolution size rather than that at an angle of 30°.

A detailed case of a method of changing a direction and inclination of reticle incident light in correspondence with a pattern shape according to the present invention will be described with reference to FIGS. 57(a) to 57(d'). The x- and y-axes in each of FIGS. 57(a) to 57(d') represent coordinates on the pupil plane. A large circle represents an aperture stop of a projection system. FIGS. 57(a), 57(b), 57(c), and 57(d) show positions of secondary sources (incident light) on the pupil planes, and FIGS. 57(a'), 57(b'), 57(c'), and 57(d') show zero-order diffracted rays A0, B0, C0, and D0 emitted from light sources indicated by hatched lines and having passed through the reticle, and 1st-order diffracted rays AX1, AY1, BX1, and BY1 in the x and y directions. In either case, the zero-order diffracted ray reaches a position of the ray incident on the pupil plane and a position symmetrical about the origin. The 1st-order diffracted ray for a pattern of the y direction is located on a line segment passing through the zero-order diffracted ray and parallel to the x-axis. Of all the diffracted rays, a maximum diffracted ray is located at a position farthest from the zero-order diffracted ray within the large circle representing the aperture stop. This also applies to a case in the x direction.

FIG. 57(a) shows a case in which a light source is located on the x-axis in the pupil plane. In this case, as shown in FIG. 57(a'), a maximum diffracted ray for a line pattern parallel to the y-axis is located at a position farthest from the zero-order diffracted ray on the x-axis, and is represented by AY1. Since the maximum diffraction angle is about twice, the resolving power in the y direction is increased. However, since only rays having very small diffraction angles, as indicated by AX1, pass in the x direction, the resolving power is rather decreased. The secondary source shown in FIG. 57(a) serves as a light source very effective for patterns present in only one direction. When the numerical values in the embodiment of FIGS. 56(a) to 56(c) are used, if a process coefficient is given as 0.6 for NA=$sin\theta$=0.5 in a projection system using a ray having a wavelength of 365 nm, the following equation is given:

$$d=0.6\lambda/sin2\theta=0.25$$

A 0.25-μm line interval pattern in only one direction can be resolved.

In this light source, however, the resolving power for the pattern in the x direction is very low. The light source is not suitable for patterns uniformly present in both the x and y directions. When patterns are uniformly present in both the directions, a light source shown in FIG. 57(b) is suitable. FIG. 57(b) shows a light source located at a 45° point from the x-axis on the pupil plane. As shown in FIG. 57(b'), since $sin\theta$ of the maximum diffraction angle in each of the x and y directions is about $\sqrt{2}$ times as compared with vertical incidence illumination. In this case, a resolving power can be given as about 1.4 times as a frequency ratio. The light source shown in FIG. 57(b) is suitable for a case in which only parallel line patterns are present in the x and y directions, and oblique patterns are absent. Under the above projection exposure conditions, 0.33-μm patterns can be simultaneously formed in both the x and y directions.

A secondary source shown in FIG. 57(c) has different resolving powers in the x and y directions. This secondary source is suitable for a case in which patterns in the y direction are fine and patterns in the x direction can have relatively large line widths. By changing the angle $\phi$, the resolving powers in both the directions can be adjusted. For example, if $\phi=30°$, then the $\sin\theta$ value of the maximum diffraction angle of a pattern in the y direction can be $\sqrt{3}$ times as compared with vertical incidence illumination, and a resolving line width can be 0.28 μm. At this time, the pattern in the x direction can be resolved up to a size of 0.45 μm. That is, while the resolving power in one direction is kept unchanged as in the conventional case, a resolving power of a pattern in a direction perpendicular to one direction can be set to be about 60%. In the light source having an inclination angle except for 45°, a resolving power of a line pattern having an inclination angle of 45° with respect to the x and y directions is not greatly reduced. Similar results of conventional vertical incidence illumination are shown in FIGS. 57(d) and 57(d') for reference.

As described above, an incident angle suitable for a given pattern size to be resolved is present. A stable and good pattern can be obtained when a ray is incident at this angle.

The embodiment of FIGS. 53(a) to 57(d') can greatly increase a resolving power by setting the range of inclination of the reticle illumination light in the conventional system in accordance with the numerical aperture of an optical projection lens. In addition, coherency of the incident light and the incident angle of the light incident on the reticle can be changed in accordance with the minimum size and shape of the pattern. Therefore, a high resolving power can be stably obtained for patterns such as LSI patterns.

Figure 58:
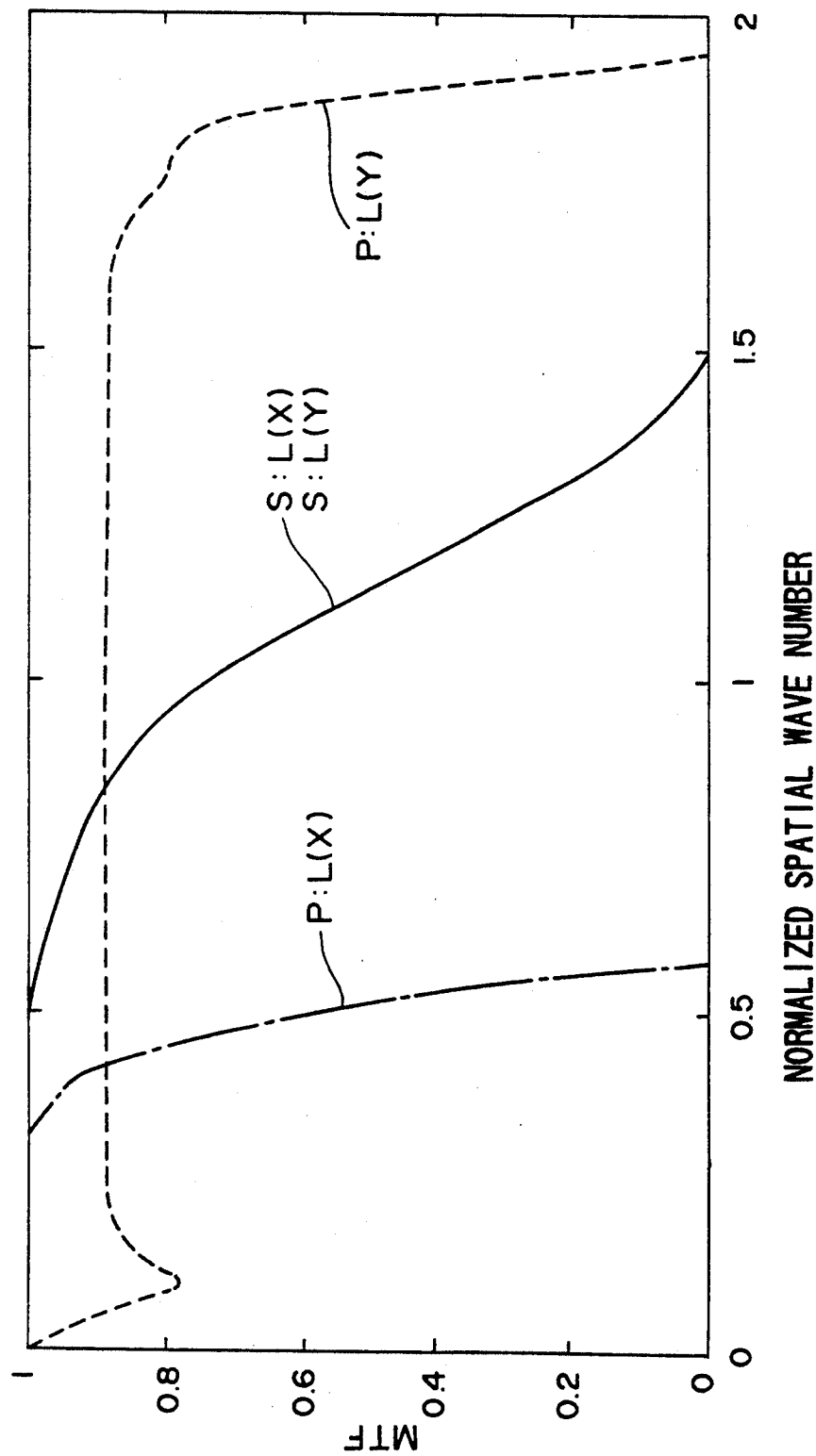
FIG. 58 is a graph showing simulation results of resolution limits obtained when the conventional optical projection exposure system and the oblique incidence illumination system described above are applied.

FIG. 58 shows contrast simulation values of a conventional method and a case in which the optical fiber bundle 58 is omitted, a half-roof prism (FIG. 21) having an inclination angle of 9.2° is placed as the optical device 30 above a reticle 69 in FIG. 40, and the aperture stop 71 having the coherence factor $\sigma=0.2$ is applied. The spatial frequency normalized with the wave number of illumination light is plotted along the abscissa in FIG. 58, and the contrast:MTF is plotted along the ordinate. As is apparent from FIG. 58, the inclination direction of the half-roof prism and the resolution of an L&S pattern P:L(Y) are greatly improved. However, the resolution of a parallel L&S pattern P:L(X) is lower than S:L(X) and S:L(Y) of the conventional method. The former effect can be obtained by the oblique incidence illumination described above. However, the decrease in resolving power is caused by a smaller NA value in a direction perpendicular to the light source and the optical axis since the light source is located near the peripheral portion of the pupil in the pupil plane.

In a system of oblique incidence illumination from one direction using a grating consisting of a half-roof prism, a full-roof prism, or an L&S pattern, or oblique incidence illumination from two directions symmetrical about the optical axis in a plane perpendicular to the optical axis, the resolving power of the L&S pattern parallel to the direction connected to the optical axis in the plane perpendicular to the optical axis is decreased.

In the oblique incidence illumination system using a prism or grating to solve the above problem, when the direction connected to the optical axis and the light source in the plane perpendicular to the optical axis is selected, the resolving power of the L&S pattern perpendicular to the L&S pattern parallel to the selected direction is increased or decreased. Embodiments capable of arbitrarily controlling these resolving powers will be described with reference to FIGS. 58 to 66.

In these embodiments, an optical projection exposure system having a means for giving an angle corresponding to the numerical aperture of an optical projection lens with respect to the optical axis to a ray for illuminating an object plane mask on which a pattern is drawn, comprises a means for performing oblique incidence illumination from one direction outside the optical axis or oblique incidence illumination from two directions outside the optical axis and symmetrical about the optical axis when viewed from a plane perpendicular to the optical axis, and a special diaphragm having an aperture near a given straight line passing through the optical axis, the given straight line being perpendicular to a straight line connecting the one direction or the two directions.

With the above arrangement, the oblique incidence illumination from one direction or two directions outside the optical axis is combined with the special diaphragm, and oblique incidence illumination conditions for these illumination modes are selected to arbitrarily control resolving powers of L&S patterns perpendicular to each other.

Since the illumination direction is specified in oblique incidence illumination using an optical device when viewed from a plane perpendicular to the optical axis, the resolution improvement effect also has directivity. For the descriptive simplicity, X- and Y-axes perpendicular to each other are plotted using the optical axis as the origin on the plane perpendicular to the optical axis, and oblique incidence illumination is performed using a prism having an inclination angle in the X-axis or a grating consisting of an L&S pattern parallel to the Y-axis. This operation is equivalent to an operation in which oblique incidence illumination is performed from the X-axis direction outside the optical axis. Evaluation patterns are represented by L&S patterns parallel to the X- and Y-axes:

L(X): an L&S pattern parallel to the X-axis
L(Y): an L&S pattern parallel to the Y-axis In this system, normalized incident angles RX and RY and a divergent angle $\sigma_D$ of the incident light are defined as follows:

$$RX = m \cdot \sin\beta x / NA$$

$$RY = m \cdot \sin\beta y / NA$$

$$\sigma_D = m \cdot \sin\beta' / NA$$

where m is the reduction magnification, NA is the numerical aperture of the optical projection lens, $\beta'$ is the divergent angle of the reticle illumination light, $\beta x$ is the angle of the central ray of the rays projected on a plane including the optical axis and the X-coordinate, and $\beta y$ is the angle of the central ray of the rays projected on a plane including the optical axis and the Y-coordinate.

Since the special diaphragm of this embodiment has an aperture near the y-axis, RX is determined by the inclination angle of the prism or the L&S pattern pitch of the grating. RY is determined by the aperture position of the special diaphragm. In addition, $\sigma_D$ is determined by the size of the aperture of the special diaphragm.

Several embodiments will be described with reference to accompanying drawings by using these parameters.

Figure 59:
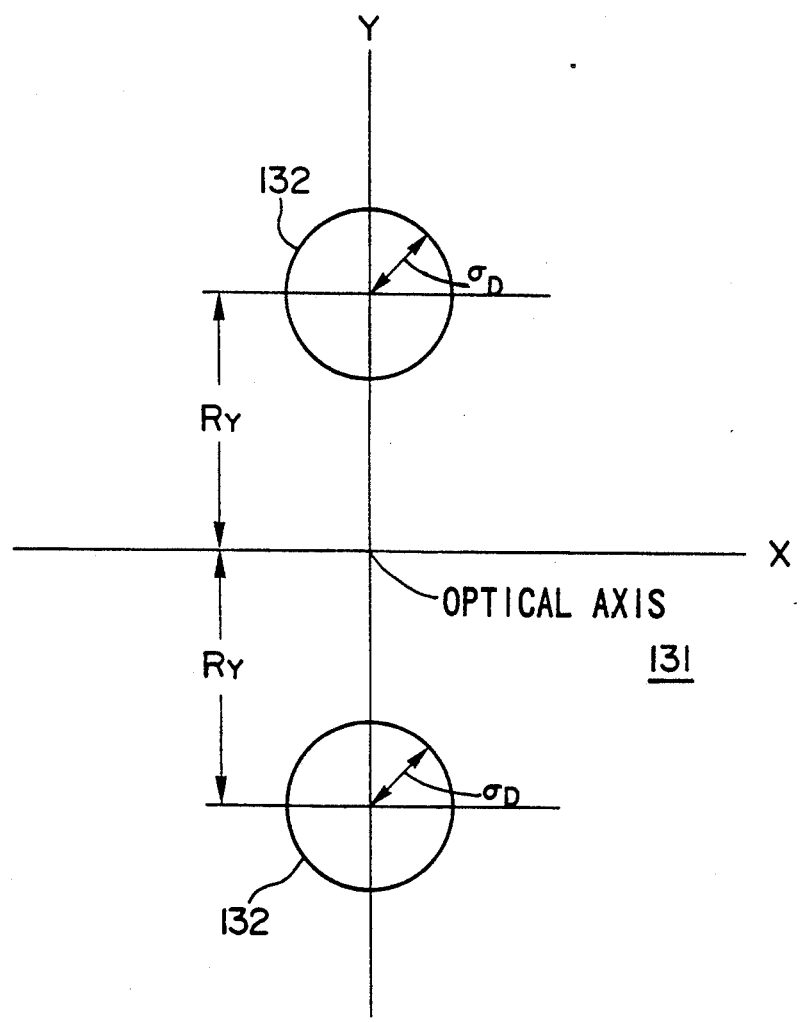
FIG. 59 is a schematic view showing a special diaphragm according to the present invention.

FIG. 59 shows an arrangement of a special diaphragm 131 according to the present invention. This special diaphragm 131 has a circular aperture 132 at a position symmetrical about the optical axis on the Y-axis when viewed from a plane perpendicular to the optical axis. The special diaphragm 131 is applied to an optical projection exposure system wherein a ray used is a g-ray, the numerical aperture of an optical projection lens is set to be NA=0.54, and a reduction magnification is set to be m=5. In practice, the special diaphragm 131 is replaced with the aperture stop 71 of the optical projection exposure system shown in FIG. 40, and an optical device 30 is located above a reticle 69.

In an embodiment shown in FIGS. 60(a) to 62(c), when various conditions of the special diaphragm and the prism or grating are changed, positions and sizes of a light source 135 in a pupil space 134 are shown. The corresponding RX, RY, and $\sigma_D$ values are listed in Table 1.

TABLE 1

| Special Diaphragm | RX | RY | $\sigma_D$ | Resolving Limit | |
|---|---|---|---|---|---|
| | | | | L(X) | L(Y) |
| (S) | 0 | 0 | 0.5 | 0.44 | 0.44 |
| (P) | 0.9 | 0 | 0.1 | 0.60 | 0.28 |
| A | 0.78 | 0.45 | 0.1 | 0.46 | 0.32 |
| B | 0.64 | 0.64 | 0.1 | 0.37 | 0.37 |
| C | 0.45 | 0.78 | 0.1 | 0.32 | 0.46 |
| D | 0.69 | 0.4 | 0.2 | 0.46 | 0.35 |
| E | 0.61 | 0.35 | 0.3 | 0.47 | 0.38 |
| F | 0.35 | 0.2 | 0.1 | 0.43 | 0.39 |
| G | 0.28 | 0.28 | 0.1 | 0.41 | 0.41 |
| H | 0.8 | 0.4 | 0.1 | 0.46 | 0.31 |

FIGS. 60(a) to 60(d) and Table 1 also show the conventional method S (FIG. 60(a)) having a coherence factor as $\sigma=0.5$ and the oblique incidence illumination system P of FIGS. 20 to 26(b) (FIG. 60(b)) having RX=0.9. The contrast simulation results are shown in FIG. 58.

Figure 61A:
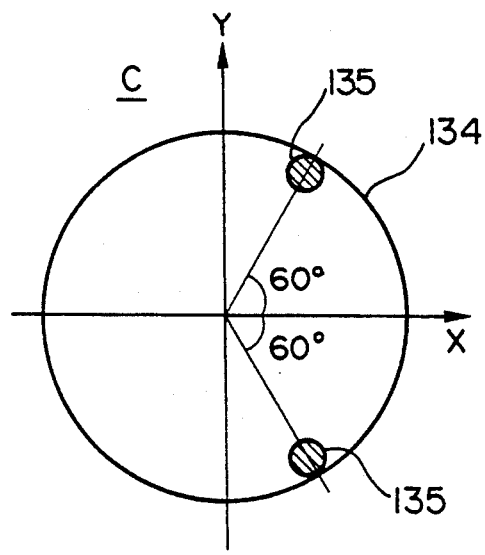
Figure 61B:
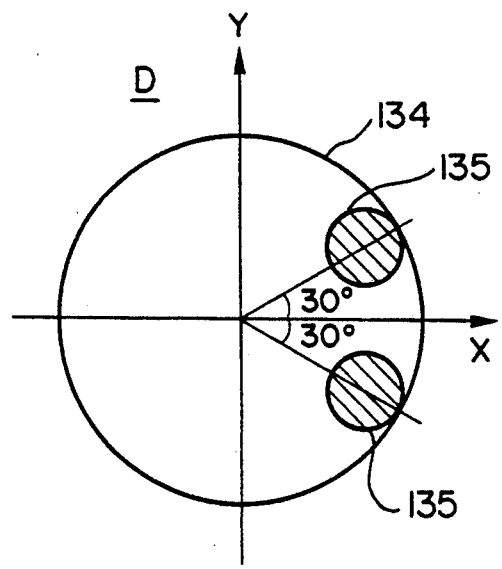
Figure 63:
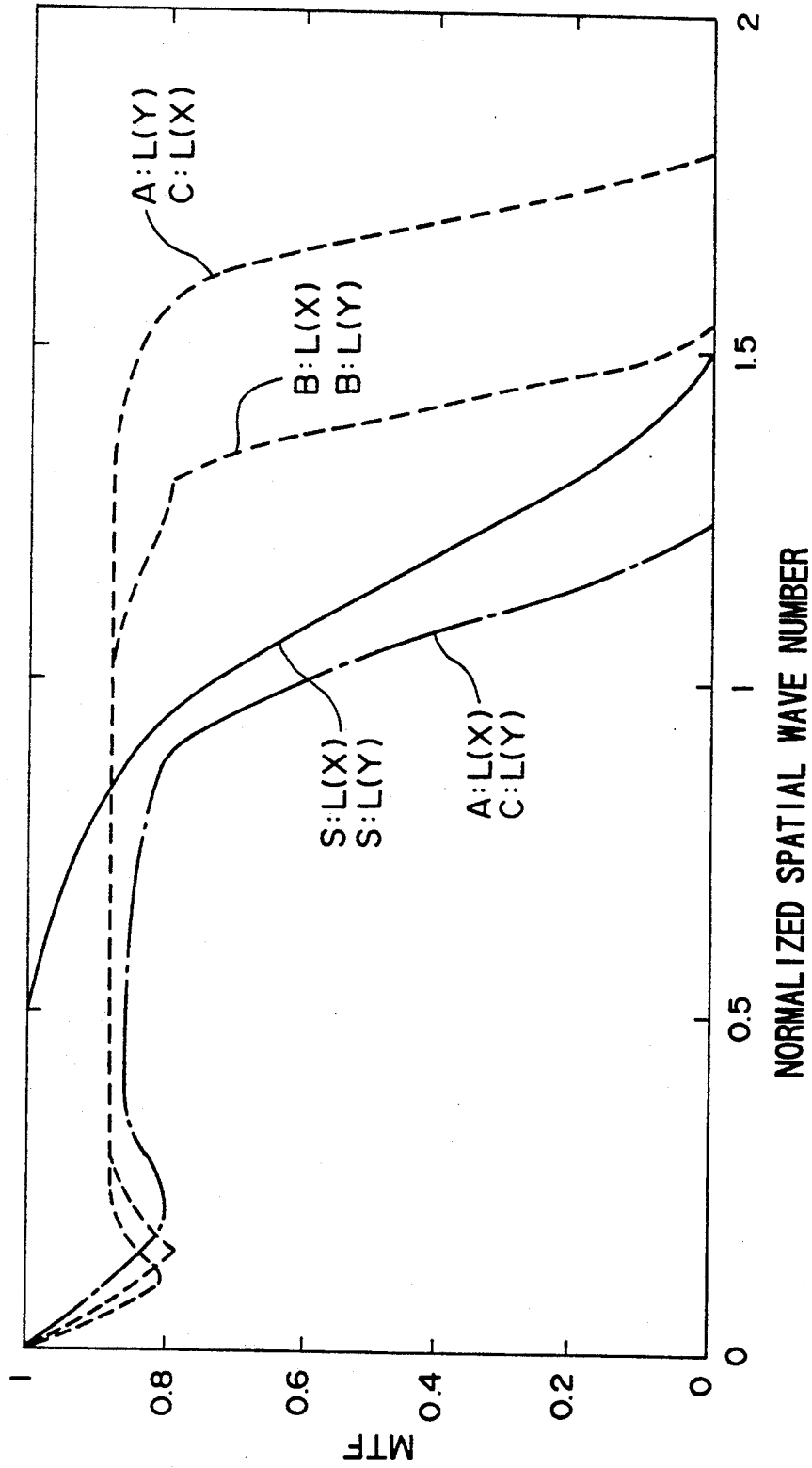
FIG. 63 is a graph showing simulation results of contrast obtained in a conventional optical projection exposure system used for comparison and under pupil conditions A, B, and C according to the present invention.

Pupil conditions A (FIG. 60(c)), B (FIG. 60(d)), and C (FIG. 61(a)) of this embodiment are given for light sources 135 circumscribed near the pupil at angular positions of 30°, 45°, and 60° with respect to the X-axis. The contrast simulation results are shown in FIG. 63. Referring to FIG. 63, in the condition A (FIG. 60(c)), the resolving power is greatly increased for L(X) as compared with the oblique incidence illumination system P of FIG. 58. In addition, in the condition B, the resolution characteristics for L(X) and L(Y) opposite to the condition A are obtained.

L&S (line and space) patterns having various sizes were exposed and developed on a wafer coated with a 0.5-μm thick resist, and the formed patterns were observed with a scanning electron microscope to obtain pattern sizes of limit resolution. The limit resolution pattern size is defined as a size of the smallest pattern of the normally formed patterns as patterns each having 20 lines and spaces without any damage to the patterns and without a resist residue between the patterns. Results are shown in Table 1 and have good correspondence with the simulation results. The results obtained by the conventional method S (FIG. 60(a)) and the oblique incidence illumination system P (FIG. 60(b)) are also shown in Table 1.

In the embodiment described above, when the oblique incidence illumination and the special diaphragm are used to combine appropriate RX and RY values, arbitrary resolving powers for L(X) and L(Y) can be controlled.

Figure 61C:
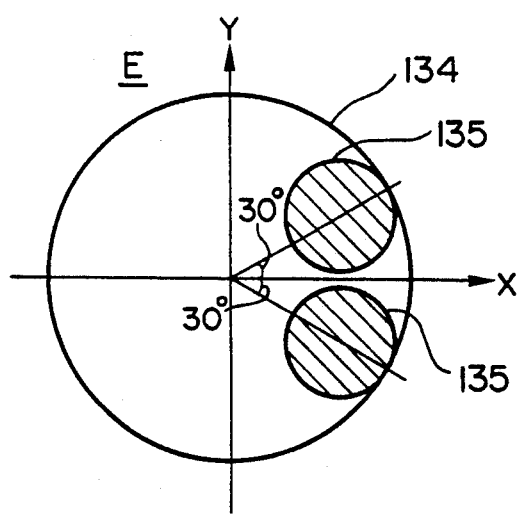
Figure 64:
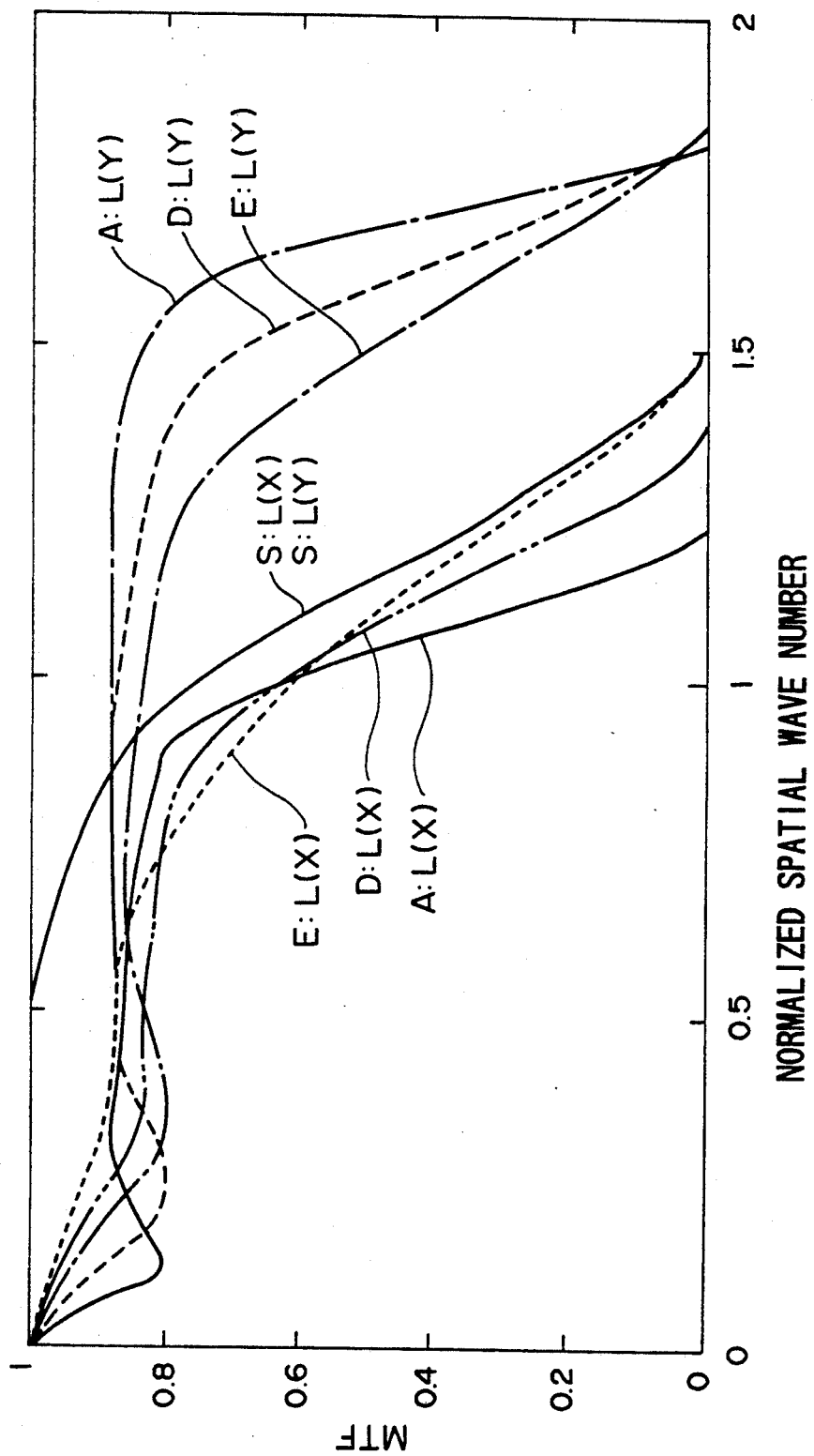
FIG. 64 is a graph showing simulation results of contrast obtained in a conventional optical projection exposure system used for comparison and under pupil conditions A, D, and E according to the present invention.

Pupil conditions A (FIG. 60(c)), D (FIG. 60(b)), and E (FIG. 61(c)) in this embodiment are obtained such that the light source 135 is circumscribed near the pupil at a position of 30° with respect to the X-axis and the coherence factors are changed as $\sigma_D=0.1$ and $\sigma_D0.3$. The contrast simulation results are shown in FIG. 64. Limit resolution characteristics obtained upon actual exposure and development of patterns as in the above method are shown in Table 1.

When the size of the light source 135 is increased, the resolving powers of the patterns L(Y) and L(X) are found to be decreased. However, these results do not indicate that the effect of the present invention is lost.

In the conventional optical projection exposure system, a coherence factor for obtaining an optimal resolving power is set to be about $\sigma=0.5$. The pupil conditions F, G, and H (FIGS. 62(a) to 62(c)) according to the present invention exhibit embodiments applied to the optical projection exposure system having a coherence factor $\sigma=0.5$.

Figure 62A:
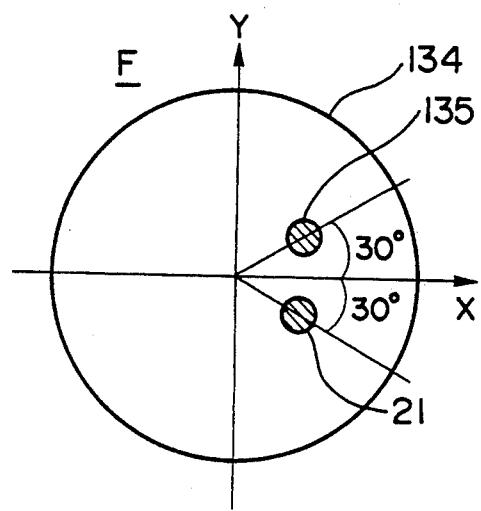
Figure 62B:
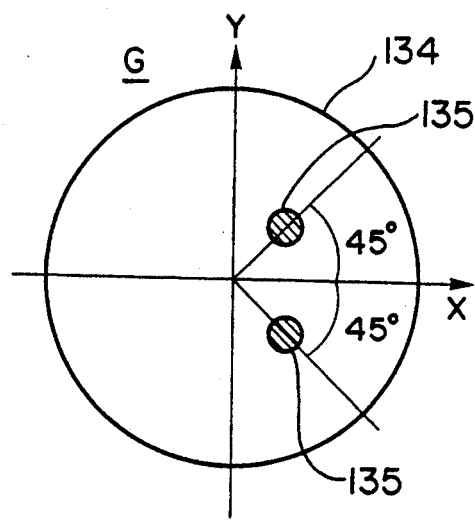
Figure 62C:
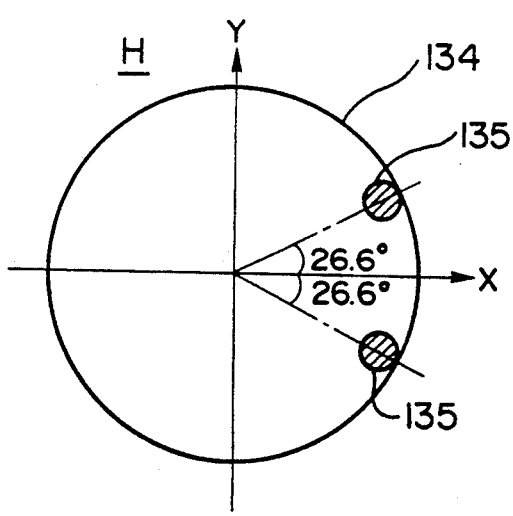
Figure 65:
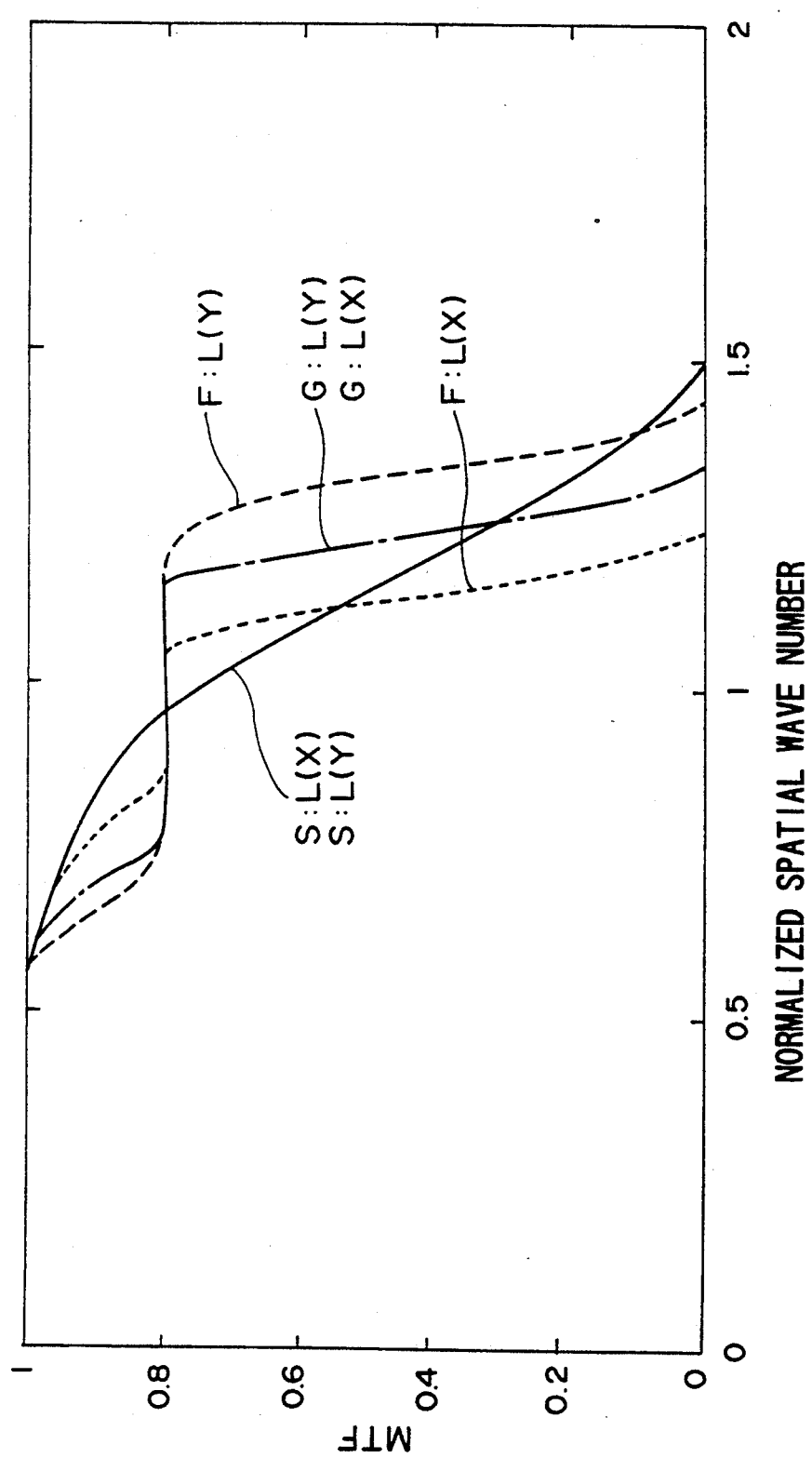
FIG. 65 is a graph showing simulation results of contrast obtained from a conventional optical projection exposure system used for comparison and under pupil conditions F and G according to the present invention.
Figure 66:
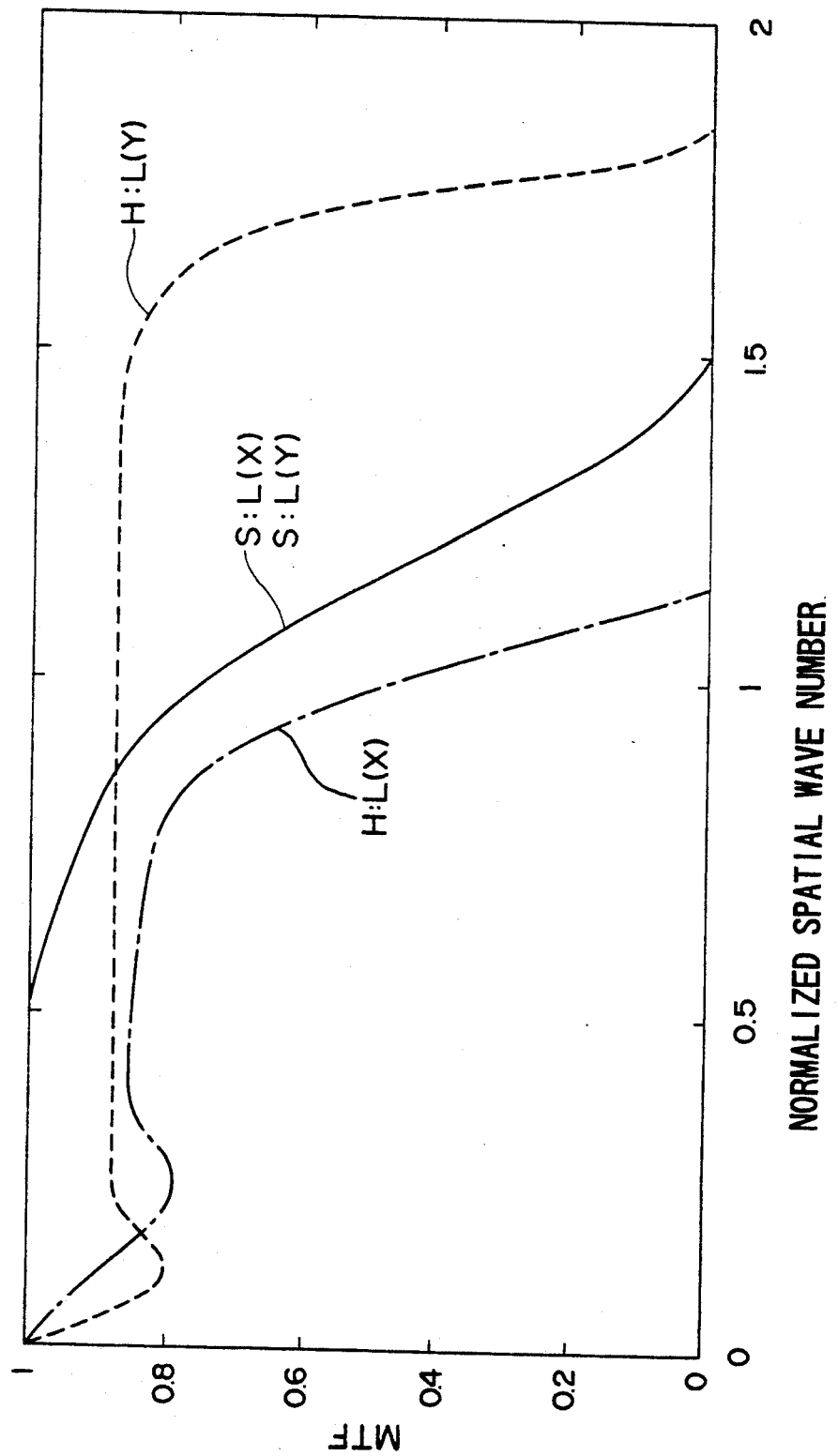
FIG. 66 is a graph showing simulation results of contrast obtained from a conventional optical projection exposure system used for comparison and under pupil condition H according to the present invention.

The pupil conditions F (FIG. 62(a)) and G (FIG. 62(b)) are set such that the light sources 135 are circumscribed with a ½ circle of the pupil at positions of 30° and 45° with respect to the X-axis. The pupil condition H (FIG. 62(c)) is set such that a light source is so arranged as to circumscribe the ½ circle in the y-axis and the circle of 1 in the X-axis. The contrast simulation results are shown in FIGS. 65 and 66, and limit resolution characteristics obtained by actually exposing and developing patterns as in the same method as described above are shown in Table 1. As compared with the results in FIG. 63, the rate of change in resolution characteristics is low, but the effect of the present invention is confirmed. As compared with the results of FIG. 58 representing the conventional oblique incidence illumination system, the resolution characteristics of the pattern L(X) are greatly improved in FIG. 66.

In the above embodiment, the special diaphragm 131 having the circular aperture is located immediately behind the secondary source plane. However, this special diaphragm may have apertures consisting two identical circles or identical polygons symmetrical about the optical axis may be used to obtain the same effect as described above.

In the optical projection exposure system according to the present invention, as has been described above, the special diaphragm is combined with the oblique incidence illumination from one or two directions, and the oblique incidence illumination conditions for these illumination modes are selected. As compared with the conventional optical projection exposure system, the resolving powers of the L&S patterns perpendicular to each other can be arbitrarily controlled.

In each of the optical projection exposure systems in the embodiments of FIGS. 59 to 66, since the resolving powers can be distributed in both the X and Y directions, in formation of a micropattern such as an LSI pattern from a pattern requiring a high resolving power in one direction in a grating or a surface elastic wave element, an optical resolving power distribution can be obtained wherein identical resolving powers are not required in patterns perpendicular to each other, such as a gate pattern and a wiring pattern. Therefore, the integration density of LSIs and the like can be greatly increased, and the device performance can also be greatly improved.

In the above embodiments, although an advantage superior to that of the conventional phase-shifting method is utilized, a detailed relationship between the aperture stop of the projection optical system and the illumination system, allowable values of transmittance adjustment, and an arrangement thereof are not perfectly clarified yet.

In consideration of the imaging contrast required in formation of a resist pattern in an actual exposure process, a method of designing a zero-order light intensity adjustment filter of an aperture stop corresponding to an oblique incidence illumination system will be clarified below.

More particularly, in the following embodiment, according to the characteristic features, an annular filter is arranged in an aperture stop of a projection optical system to adjust the amplitude transmittance of the zero-order diffracted ray, the central portion of the filter is perfectly transparent, and a light source image in oblique incidence illumination corresponds to an outermost area whose transmittance is adjusted. With the above arrangement, by adjusting the transmittance of the annular zero-order light intensity adjustment filter, a maximum frequency range can be assured in correspondence with the required image contrast.

This embodiment will be described with reference to FIGS. 67(a) to 70.

In the micropattern optical projection exposure system of the above embodiment, the transmittance of the outermost portion of the filter is $\frac{1}{2}$ and is derived from a theoretical value obtained upon improvement of the contrast of a low-frequency component. The present inventors made extensive studies on wave number dependency (MTF) of contrast & intensity and found that a remarkable effect could be obtained in the amplitude transmittance range of 30 to 50%. This will be described in detail below.

The theory of partially coherent light must be used to accurately deal with the imaging characteristics of the projection optical system. When the amplitude transmittance of the mask is defined as A(x) (although this function is represented as a linear function for descriptive simplicity, this is given as a function of x and y) and a Fourier transform is defined as A(k) (note that a symbol representing the Fourier transform is omitted, and the function is simply represented as A(k); this also applies to functions $J(k;k')$, $j_0(k_S)$, and $k(k)$ to be described below), an image plane intensity I(x) is represented as follows:

$$I(x) = \int\int A(k)A^*(k')j(k;k')e^{i(k-k')x}dkdk' \quad (16)$$

where $A^*(x)$ is a conjugate complex function, and $J(k;k')$ is called a transmission cross-coefficient represented by the following equation:

$$J(k;k') = \int J_0(k_S)K(k-k_S)K^*(k'-k_S)dk_S \quad (17)$$

where $J_0(k_S)$ is a light source represented by a pupil space, K(k) is a pupil function (Boln Walf "Principle of Optics I, II, and III" (translated by Kusakawa and Yokota), Tokai University Press).

The optical transfer function (OTF) can be evaluated by mainly $J(k;0)$ using equation (2) perfect coincidence at the limit of incoherent light).

Wave number dependency of an amplitude for coherent light and that of an intensity for incoherent light can be clearly defined as values in accordance with the principle of superposition. In partially coherent light, wave number dependency is expressed as a function of two wave numbers k and k' as represented by equations (16) and (17) and is thus expressed as interference between waves at the wave numbers k and k'. As can be apparent from equation (16), since a wave number component at an image plane intensity also depends on a wave number distribution A(k) of a mask pattern, it is difficult to objectively evaluate the performance of the illumination and projection optical systems.

It is convenient to limit the number of types of mask patterns and simplify the mask patterns ($A_0=\frac{1}{2}$ and $A_1=\frac{1}{4}$) in evaluation of wave number dependency (MTF) of contrast & intensity as follows:

$$A(x) = A_0 + A_1(e^{jkx} + e^{-jkx}) = A_0 + 2A_1\cos kx \quad (18)$$

At this time, an image plane intensity I(x) is defined as follows:

$$I(x) = A_0^2 J(0;0) + A_1^2\{J(k;k) + J(-k;-k)\} + \quad (19)$$
$$2A_0A_1\{J(k;0) + J(-k;0)\}\cos kx +$$
$$2A_1^2 J(k;-k)\cos 2kx$$

A contrast $M=(I_{max}-I_{min})/(I_{max}+I_{min})$ is given as follows with respect to a fundamental period k:

$$MTF = \frac{2A_0A_1\{J(k;0) + J(-k;0)\}}{A_0^2 J(0;0) + A_1^2\{J(k;k) + J(-k;-k) + 2J(k;-k)\}} \quad (20)$$

The denominator in equation (20) gives the average intensity $(I_{max}+I_{min})/2$. The MTF and the average intensity can be obtained from equations (17) and (20). When the pupil function K(k) in equation (17) is used as a function representing a filter arrangement, an optical calculation of an oblique incidence illumination system and a filter arrangement can be easily performed. A calculation example of the MTF obtained as described above will be described below.

Figure 67A:
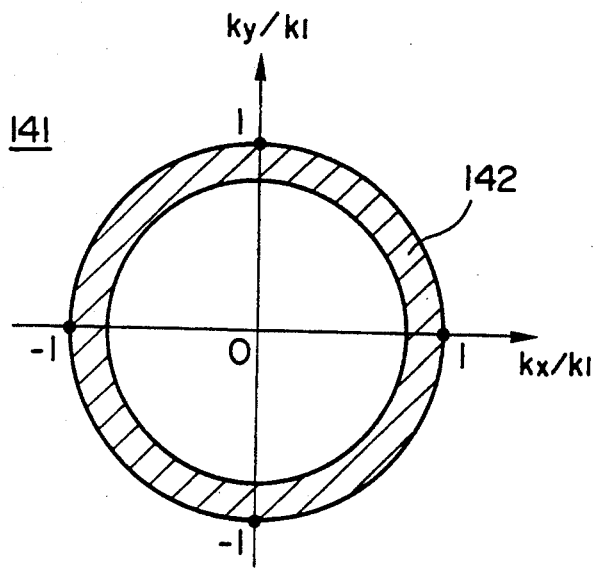
FIGS. 67(a) and 67(b) are views showing an arrangement of a light source and a filter on a pupil coordinate system so as to explain still another
Figure 67B:
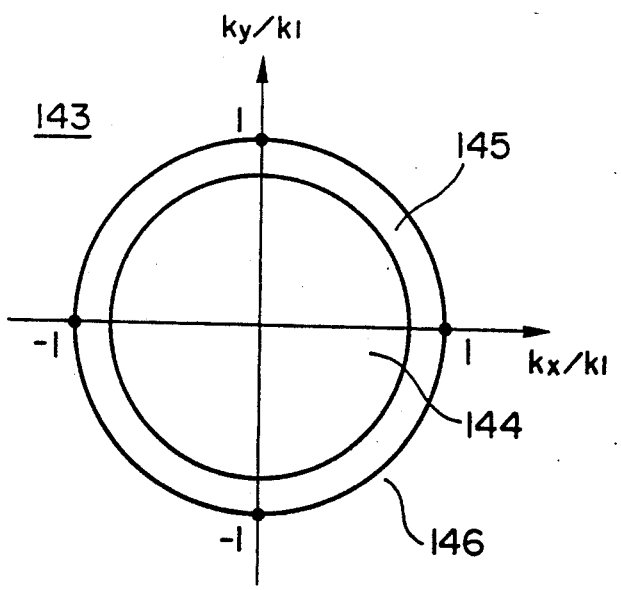
Figure 68:
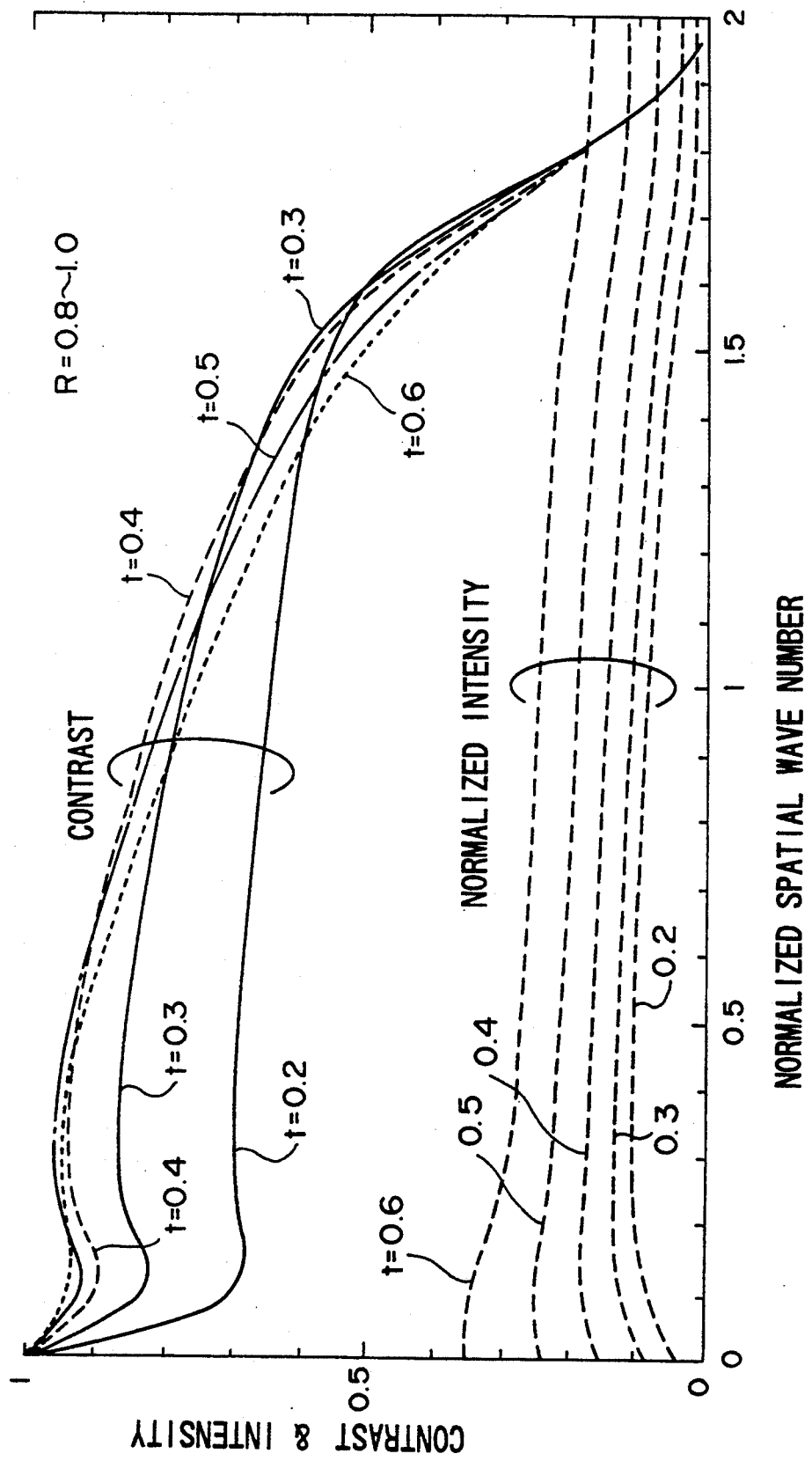
FIG. 68 is a graph showing wave number dependency of contrast and intensity and an average intensity (normalized with light intensity) according to the present invention.

FIG. 67(a) shows an annular portion (1.0 corresponds to the numerical aperture of the optical projection lens) 142 having a radius R=0.8 to 1.0 expressed by pupil coordinates as a light source 141. In correspondence with FIG. 67(a), a transmittance t of an aperture 145 of an annular filter 143 is changed so that the transmittance of a central portion of the aperture is set to be 1, and the transmittance of a peripheral portion 146 is set to be zero, as shown in FIG. 67(b). FIG. 68 shows the MTF calculation result. In a practical resist process, since the contrast & intensity level of 0.5 to 0.7 is required, the contrast & intensity must be assured in the maximum wave number range. This situation is different from design of other optical fields such as a field of microscopes. When the transmittance t is slightly reduced to 0.3, the contrast level in the range of small wave numbers is slightly reduced, but the contrast & intensity level is increased in a range of large wave numbers (i.e., near the normalized spatial wave number range of 1.5 to 1.6). The range in which patterns can be formed is considerably increased. When the transmittance is reduced to 0.2, the contrast is decreased in the entire range. However, if only the contrast of 0.5 is required, a wide wave number range can be obtained. In this manner, when the transmittance is selected to fall within the range of 0.2 to 0.6, good characteristics can be obtained in accordance with a required contrast level.

FIGS. 67(a) and 67(b) show arrangements of the light source and the filter on the pupil coordinate system according to the present invention. The pupil coordinates or the pupil space represents a light source image normalized at the aperture stop portion. A mask pattern corresponds to a Fourier transform plane. In FIGS. 67(a) and 67(b), $k_x/k_l$ is plotted along the abscissa, and $k_y/k_l$ is plotted along the ordinate. In these drawings, $k_l$ is $k_0 \sin\alpha$, and $k_0$ is $2\pi/\lambda$.

Figure 69:
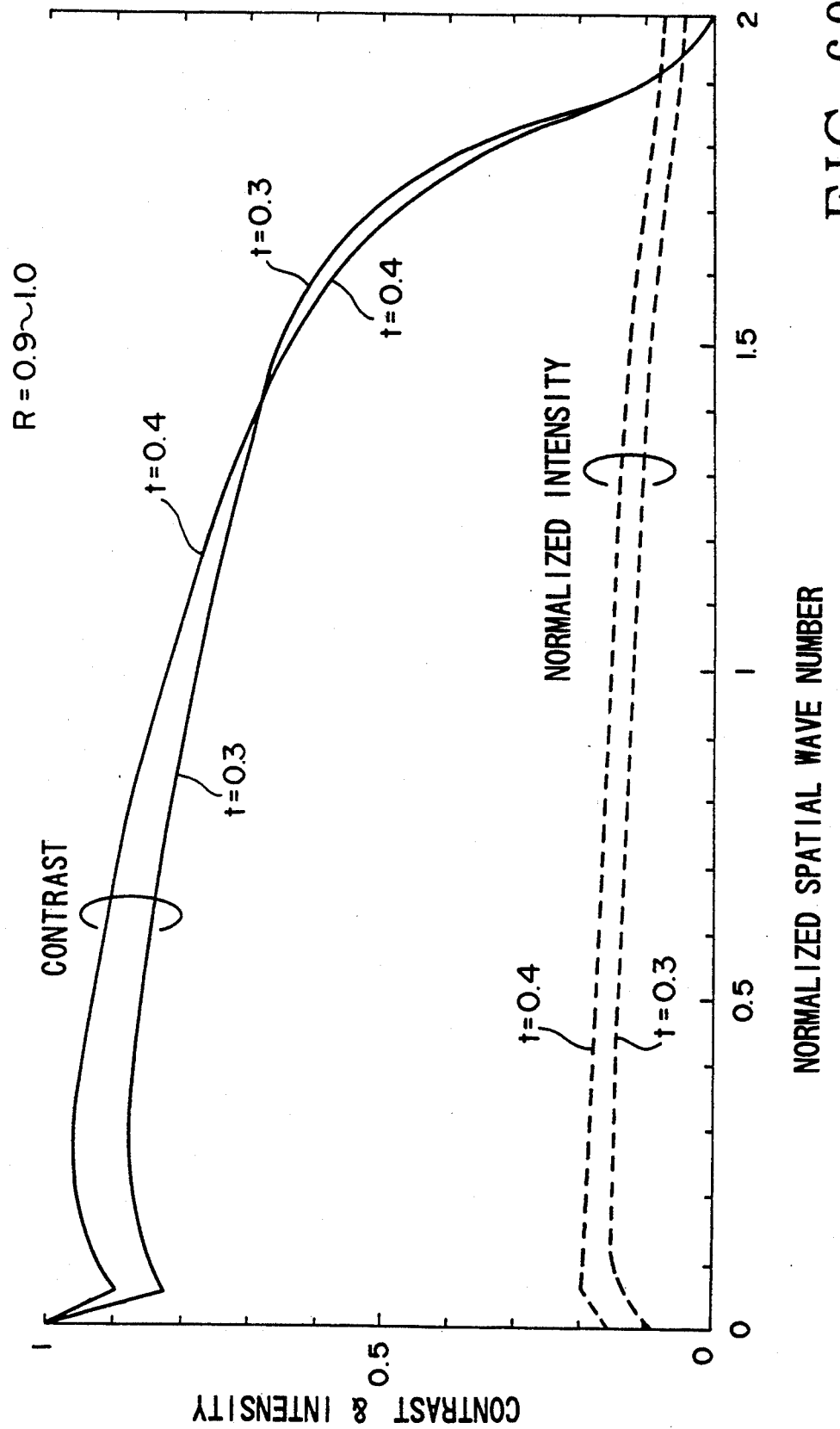
FIG. 69 is a graph showing wave number dependency of contrast & intensity and an average intensity (normalized with light intensity) according to the present invention.

FIG. 69 is a graph obtained when an annular light source having a radius R=0.9 to 1.0 is used. The light source is further restricted to a narrower area corresponding to the numerical aperture of the projection optical system. The large-wave number characteristics are further improved as compared with the case in FIG. 68. This proves effectiveness derived when an illumination system corresponding to the numerical aperture is used.

Figure 70:
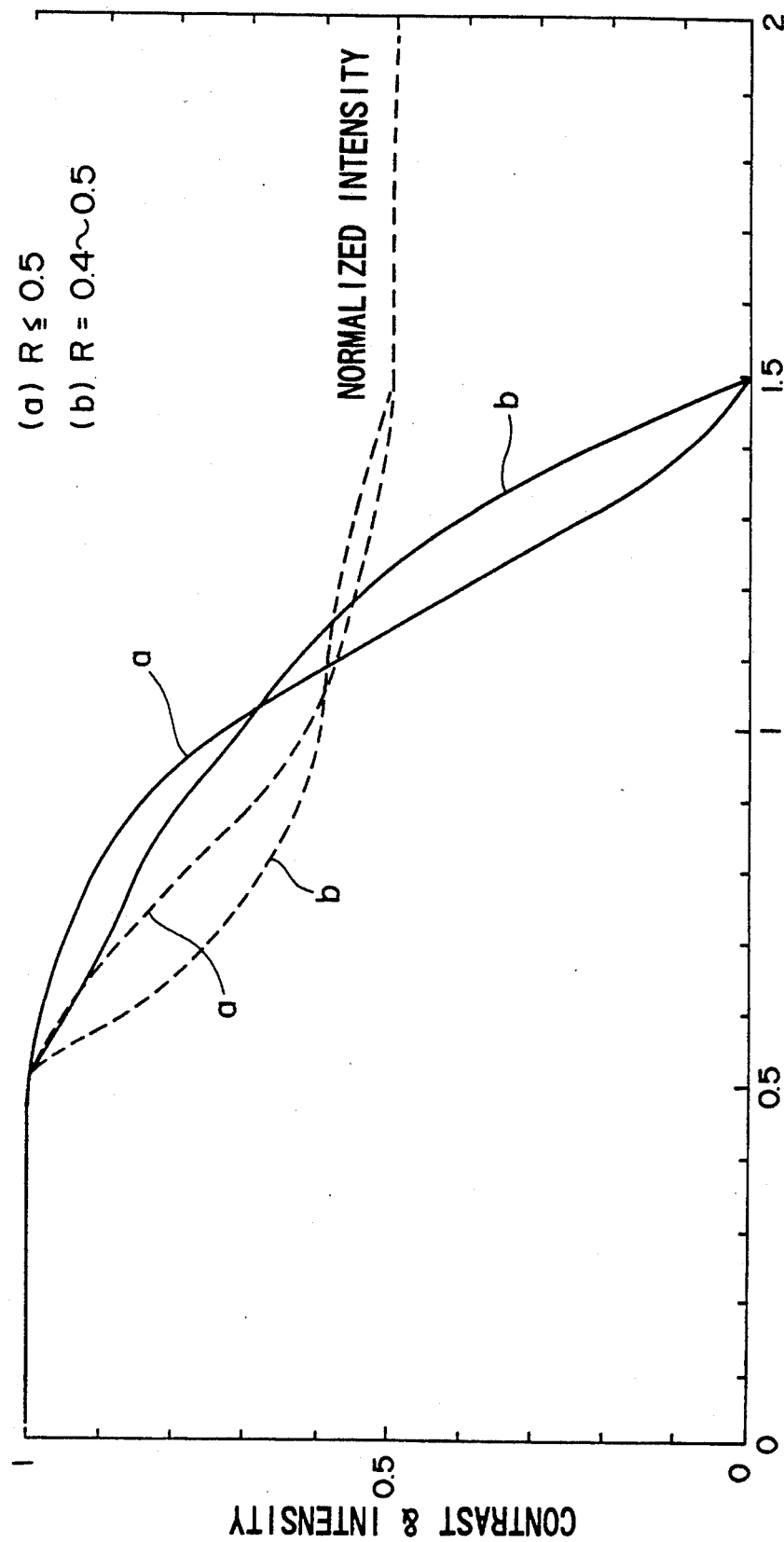
FIG. 70 is a graph showing wave number dependency of contrast and intensity according to a conventional method.

FIG. 70 shows a conventional case using a characteristic curve a as a reference. In this case, the light source has an inner area (coherence factor $\sigma = 0.5$) of a circle having a radius R=0 5. The contrast & intensity value is abruptly decreased near the normalized spatial wave number of 1.0.

A characteristic curve b in FIG. 70 is an annular light source using a conventional light source. This light source has an area having a radius R=0.4 to 0.5. The characteristic curve b exhibits a value much smaller than that represented by the characteristic curve a in FIG. 70. It is apparent that no effect is obtained even if annular illumination is performed using the conventional light source.

According to the present invention, as has been described above, the annular filter 141 is arranged at the aperture stop of the projection optical system, and the transmittance t of the filter 141 is adjusted to assure the maximum wave number range corresponding to the required image contrast. This annular zero-order light intensity adjustment filter is not limited to use for an annular light source, but can be equally used if a light source image is formed in a transmission adjustment range as in two- or four-point oblique incidence illumination.

Note that the numerical aperture of the projection optical system is optimized on the basis of a required depth of focus, an allowable distortion amount, the wavelength of a light source used.

In the embodiment described with reference to FIGS. 67(a) to 70, a ray for illuminating a mask in a micropattern optical projection exposure system is inclined by an angle corresponding to the numerical aperture of the projection optical system with respect to the optical axis, and at the same time, the zero-order light intensity adjustment filter is located at the position of the aperture stop or pupil of the projection optical system so that the amplitude transmittance of the peripheral portion of the aperture corresponding to the light source image of the illumination system is set to be 0.2 to 0.6, and the amplitude transmittance of the central portion of the aperture is set to be 1. When the transmittance of the zero-order light intensity adjustment filter is adjusted, a maximum wave number range corresponding to a necessary image contrast can be assured. For this reason, the oblique incidence illumination system and the filter arrangement can be optimized, and the area in which patterns such as LSI patterns can be formed can be increased.

In a practical micropattern (e.g., LSI patterns) formation process, a focus plane is deviated due to unevenness of a substrate surface and a deviation of an exposure surface from a reference surface. For this reason, a defocus amount must also be taken into consideration when the present invention is applied to a practical process.

These embodiments will be described with reference to FIGS. 71 to 77 below.

In these embodiments, there is provided an optical projection exposure system having a means for inclining a ray for illuminating an object plane mask having a pattern thereon by an angle corresponding to the numerical aperture of the optical projection lens with respect to the optical axis, wherein a ray focused on an aperture stop has an annular light source having inner and outer radii when the radius of an entrance pupil is normalized with the numerical aperture of the optical projection lens and is defined as 1, and a zero-order light intensity adjustment having the same inner radius as that of the ray focused on the aperture stop and an outer diameter of 1 is arranged at the aperture stop of the optical projection lens.

As a condition for obtaining a maximum resolving power without any defocus amount, an annular light source having a maximum inclination angle with respect to the numerical aperture NA or several point light sources are used. When the depth of focus is taken into consideration, the meaning of "correspondence" in the condition of oblique incidence illumination in correspondence with the numerical aperture NA of the optical projection lens also indicates that the inclination angle corresponds to the maximum value of the numerical aperture, and at the same time, a light source is located slightly inward to adjust the margin for improving the resolution limit so as to assure the depth of focus.

An MTF calculation in consideration of a defocus amount is introduced. A defocus amount normalized with $\lambda/2NA^2$ is defined as $\pm Z$, and the image plane intensity I in equation (2) is modified into equation (6). That is, $$J(k;k') = \int J_0(k_s)K(k - k_s)K^*(k' - k_s) \times e^{1/dk_s} \quad (21)$$
$$\text{for } f = (z/2k_0)(k - k')(k + k' - 2k_s) + (k - k')x$$

The intensity I(x) is calculated using equation (6), and $MTF = (I_{max} - I_{min})/(I_{max} + I_{min})$ is calculated on the basis of the MTF definition. As a result, $$MTF = \frac{2A_0A_1(A^2 + B^2)^{\frac{1}{2}}}{A_0{}^2J(0;0) + A_1{}^2\{J(k;k) + J(-k;-k) + 2\frac{(A^2 - B^2)A' + 2ABB'}{A^2 + B^2}} \quad (22)$$

If the following conditions are given:
$C(k;0) = J(k_s)K(k-k_s)K(-k_s)$ and
$C(-k;0) = j(k_s)K(-k-k_s)K(-k_s)$
$C(k;-k) = J(k_s)K(k-k_s)K(k+k_s)$, then
A, B, A', and B' are given as follows:

$$A = \int [C(k;0)\cos\{(\pi/2)kZ(2k_s-k)\} + C(-k;0)\cos\{(\pi/2)kZ(2k_s+k)\}]dk_s$$

$$B = \int [C(k;0)\sin\{(\pi/2)kZ(2k_s-k)\} + C(-k;0)\sin\{(\pi/2)kZ(2k_s+k)\}]dk_s$$

$$A' = \int C(k;-k)\cos(2\pi kZk_s)dk_s$$

$$B' = \int C(k;-k)\sin(2\pi kZk_s)dk_s$$

The important parameters for dealing with oblique incidence illumination using an annular light source according to the present invention will be defined as follows. That is, assume that the radius of the entrance pupil normalized with the numerical aperture NA of the optical projection lens is given as 1. In this case, the inner radius of the annular light source is defined as $R_1$, its outer radius is defined as $R_2$, the amplitude transmittance of the zero-order light intensity adjustment filter located at the aperture stop from the inner radius R to the outer radius $R_2$ is defined as $T_1$, and the amplitude transmittance from the inner radius $R_2$ to 1 is defined as $T_2$.

Figure 71:
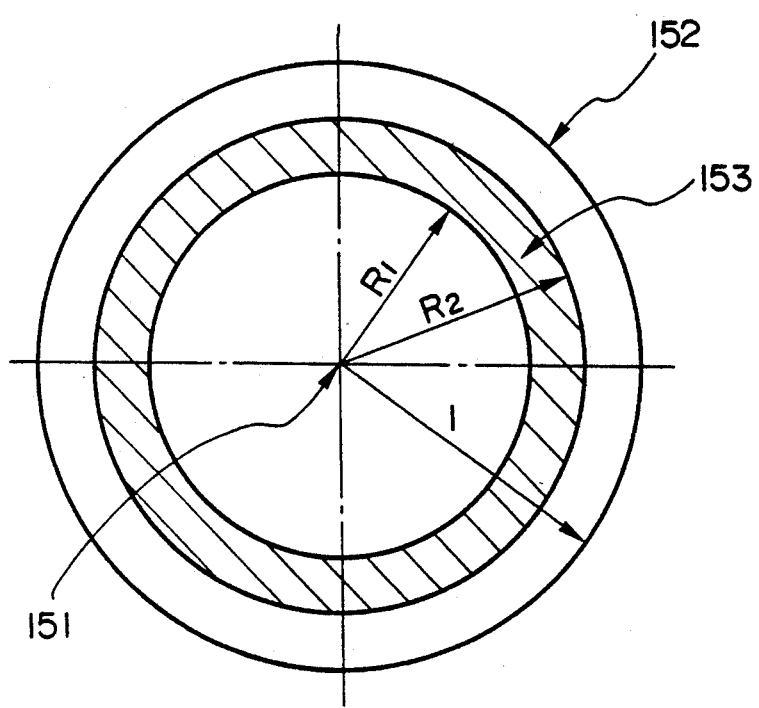
FIG. 71 is a view for explaining parameters used in the oblique incidence illumination system of the present invention and represented in an incident pupil space.

FIG. 71 shows a light source layout represented in the entrance pupil space so as to explain still another embodiment of the present invention. Referring to FIG. 71, reference numeral 151 denotes the center of an optical axis; 152, an entrance pupil circle; and 153, an annular light source indicated by a hatched portion. Reference symbol $R_1$ denotes an inner radius of the annular light source 153 when the radius of the entrance pupil circle 152 normalized with the numerical aperture NA of the optical projection lens; and $R_2$, its outer radius.

When the Z, an optical layout, and a filter condition are set according to equation (22), a curve as a function of the wave number and the MTF is obtained. If a wave number at an intersection between this curve and the MTF required in this process is given as $k_{max}$, a defocus amount: $\pm L$ is given as follows when the wavelength of the light source is given as $\lambda$:

$$L = \lambda Z/2(NA)^2 \qquad (23)$$

At this time, a minimum value of an L&S pattern to be resolved is defined as follows:

$$W = \lambda/(2NA \times k_{max}) \qquad (24)$$

NA is eliminated from equations (23) and (24) to obtain W as follows:

$$W = \sqrt{\lambda L/2} \, /(k_{max}\sqrt{Z}) \qquad (25)$$

In order to minimize W under the condition of the defocus amount: $\pm L$ required in the process, i.e., in order to maximize the resolving power of the optical system according to equation (25), a light source layout and a filter condition which maximize $k_{max}$·root Z where root is $\sqrt{\phantom{x}}$ must be obtained.

Figure 72:
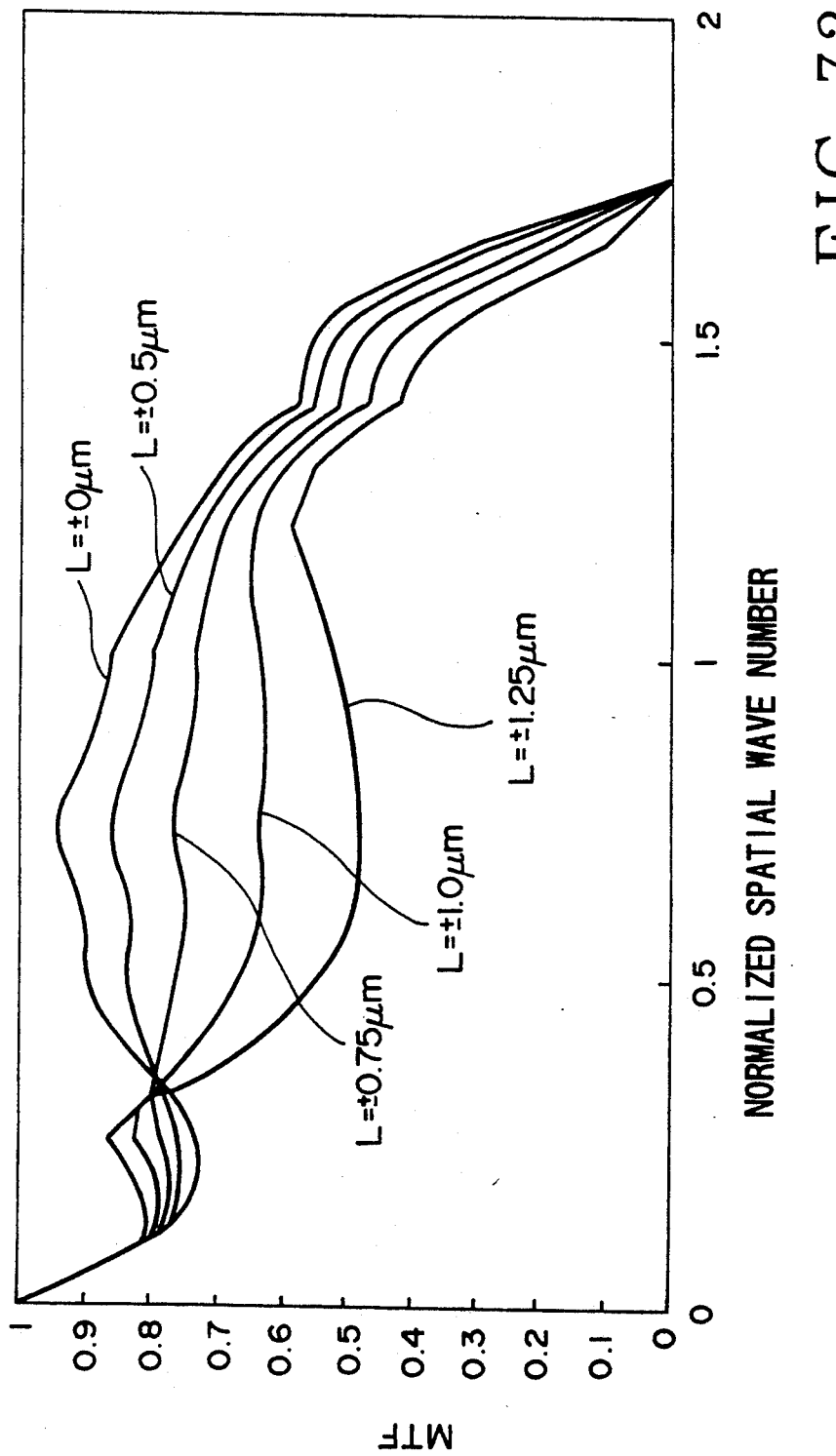
FIG. 72 is a graph showing optimized experimental results obtained so that resolution becomes maximum when an MTF necessary in the process is given as 0.6 and a defocus amount is given as ±1 μm.

FIG. 72 shows optimization results for a maximum resolving power when the MTF required in the process is set to be 0.6 and the defocus amount L is set to be $\pm 1$ $\mu$m. The spatial wave number normalized with $\lambda/2NA$ is plotted along the abscissa. If $R_1=0.65$, $R_2=0.75$, $T_1=0.35$, and $T_2=0.7$, then $Z=1.5$ and $k=1.29$, thus obtaining the maximum value of $k_{max}$·root Z. If these conditions are applied to an exposure system for an i-ray ($\lambda=0.365$), an optimal NA becomes 0.52, and a maximum resolving power: $W=0.27$ $\mu$m is obtained. Therefore, an MTF curve for each defocus amount shown in FIG. 72 can be obtained.

Figure 73:
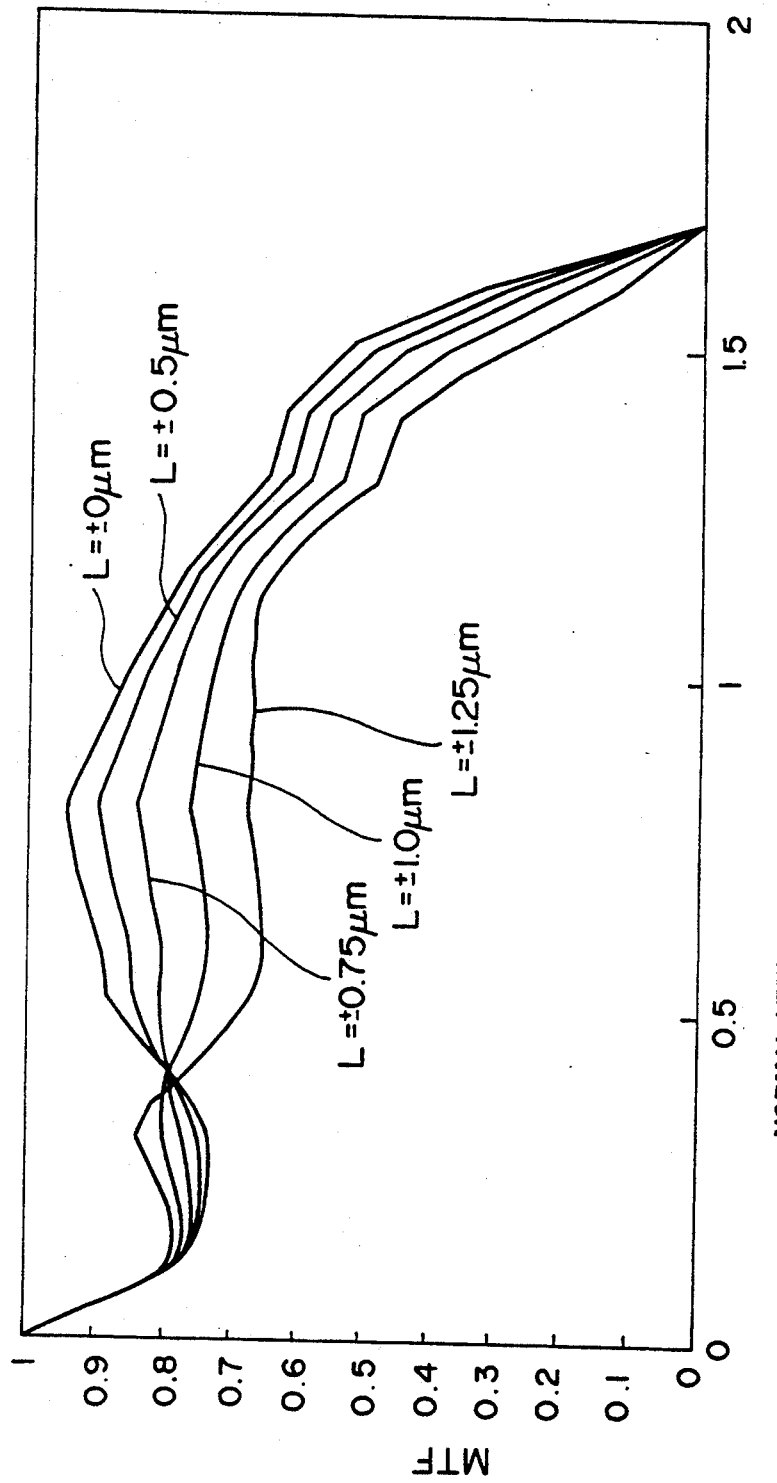
FIG. 73 is a graph showing experimental results obtain when an MTF is given as 0.7 as in FIG. 72 according to still another embodiment of the present invention.

FIG. 73 shows still another embodiment in which optimization is performed when the MTF required in the process is set to be 0.7 and the defocus amount L is set to be $\pm 1$ $\mu$m. If $R_1=0.6$, $R_2=0.7$, $T_1=0.35$, and $T_2=0.7$, then $Z=1.25$ and $k=1.12$, thus obtaining the maximum value of $k_{max}$·root Z. If these conditions are applied to an exposure system for an i-ray ($\lambda=0.365$), an optimal NA becomes 0.48, and a maximum resolving power: $W=0.34$ $\mu$m is obtained. Therefore, an MTF curve for each defocus amount shown in FIG. 73 can be obtained.

Figure 74:
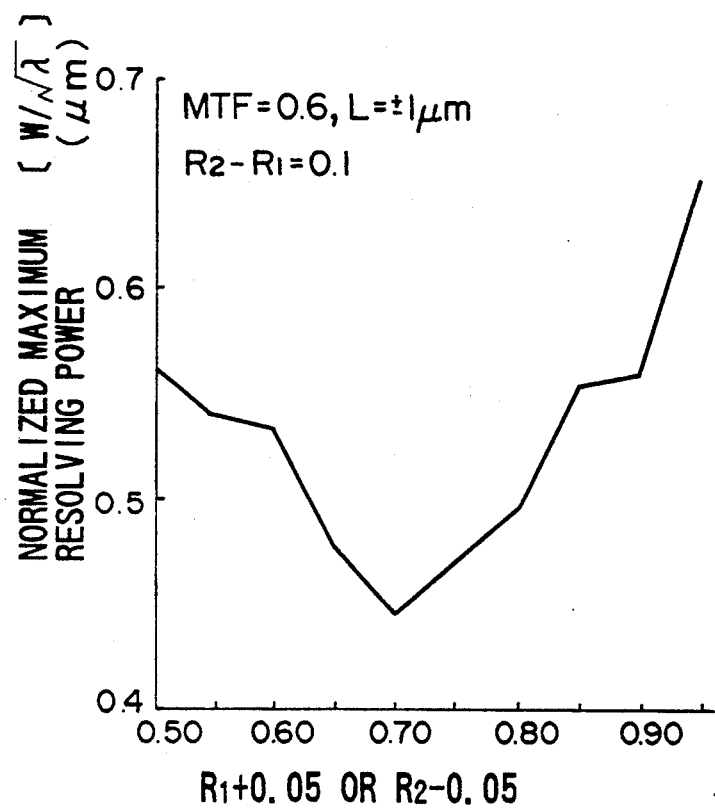
FIG. 74 is a graph showing experimental results obtained when the central position of an annular light source is optimized according to still another embodiment of the present invention.

FIG. 74 shows still another embodiment in which the central position of an annular light source is optimized when the MTF required in the process is set to be 0.6 and the defocus amount L is set to be $\pm 1$ $\mu$m. The maximum resolving power normalized with the wavelength of a light source used is plotted along the ordinate. In this case, $R_2 - R_1$ is kept constant to be 0.1, and the center of the annular light source, and $R_1+0.05$ or $R_2-0.05$ are changed. An optimal value is present when the position of the annular light source is located near 0.7. This optimal position varies depending on the MTF and the defocus amount which are required in the process. Even if these conditions are changed within a practical range, a maximum resolving power can be obtained when $R_1$ is 0.5 or more and $R_2$ is 1 or less.

Figure 75:
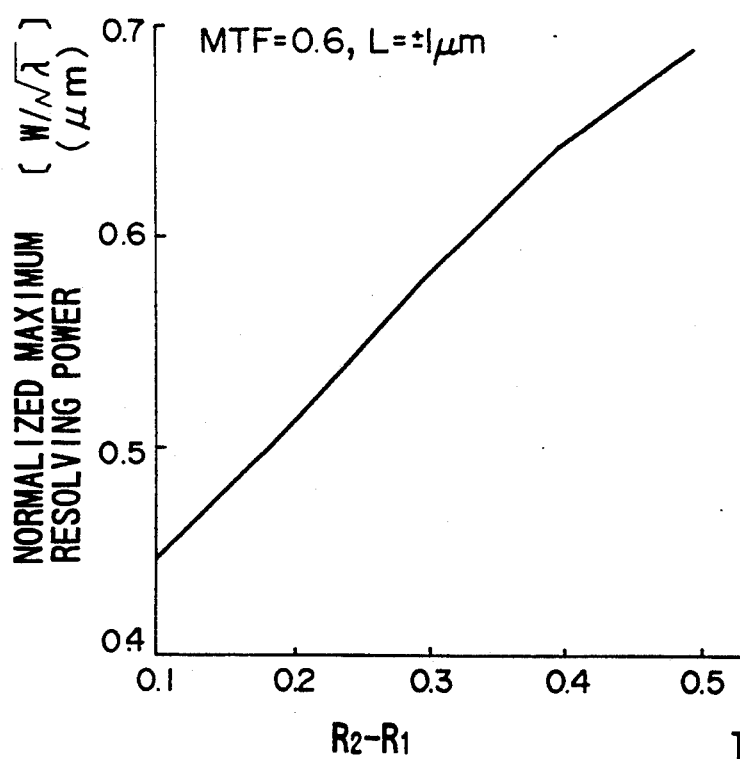
FIG. 75 is a graph showing experimental results obtained when the width of an annular light source is optimized according to still another embodiment of the present invention.

FIG. 75 shows still another embodiment in which the width of an annular light source is optimized when the MTF required in the process is set to be 0.6 and the defocus amount L is set to be $\pm 1$ $\mu$m. The maximum resolving power normalized with the wavelength of a light source used is plotted along the ordinate. As is apparent from FIG. 75, a higher resolving power can be obtained when the width of the annular light source, i.e., the $R_2-R_1$ value is deceased.

Figure 76:
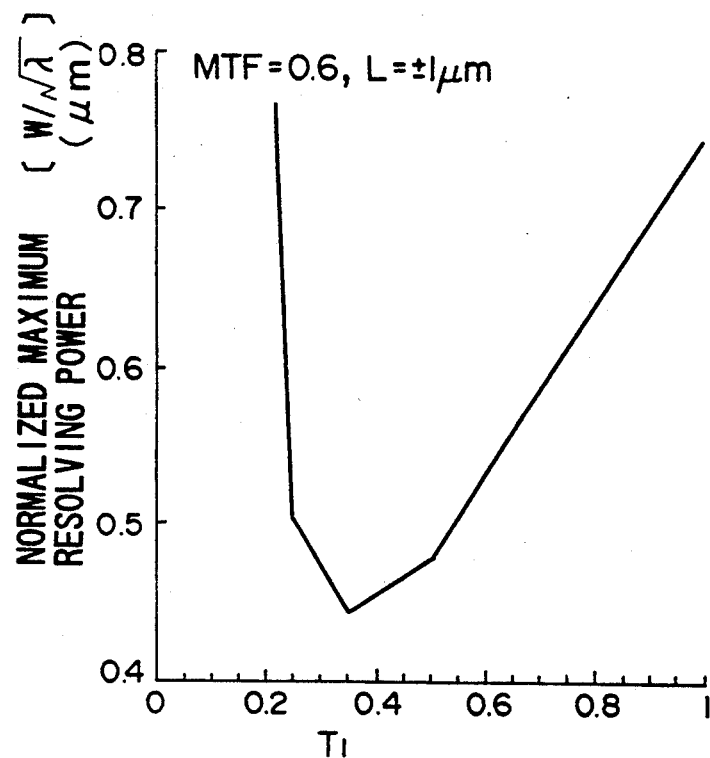
FIG. 76 is a graph showing experimental results obtained when a light intensity adjustment filter T1 is optimized according to still another embodiment of the present invention.
Figure 77:
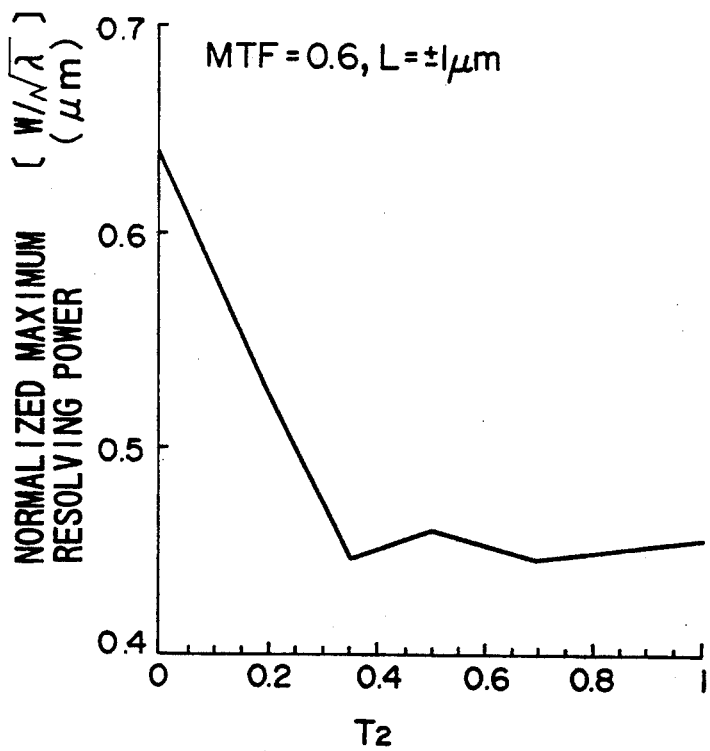
FIG. 77 is a graph showing experimental results obtained when a light intensity adjustment filter T2 is optimized according to still another embodiment of the present invention.

FIG. 76 shows still another embodiment in which a $T_1$ value is optimized when the MTF required in the process is set to be 0.6 and the defocus amount L is set to be $\pm 1$ $\mu$m. The maximum resolving power normalized with the wavelength of a light source used is plotted along the ordinate. In this case, $R_2-R_1$ is kept constant to be 0.1. A maximum resolving power is obtained for $T_1=0.35$. When $T_2$ comes close to 1, the resolving power is slightly decreased. The resolving power is decreased when $T_2$ is 0.2 or less. Since the filter transmittance must be set higher to obtain a higher exposure intensity, $T_2$ need not be equal to $T_1$.

As described above, an optical system for obtaining a maximum resolving power can be designed under the MTF and defocus amounts required in the process by optimizing the parameter for maximizing $k_{max}$·root Z. Therefore, an optimal value for each parameter can be obtained.

In the embodiments of FIGS. 71 to 77, as is apparent from the above description, since the parameters of the oblique incidence illumination system are designed in accordance with a technique for assuring the contrast MTF and defocus amounts required in the process and at the same time obtaining a maximum resolving power, an oblique incidence illumination system for obtaining maximum performance to answer to the process requirements can be obtained.

Figure 78:
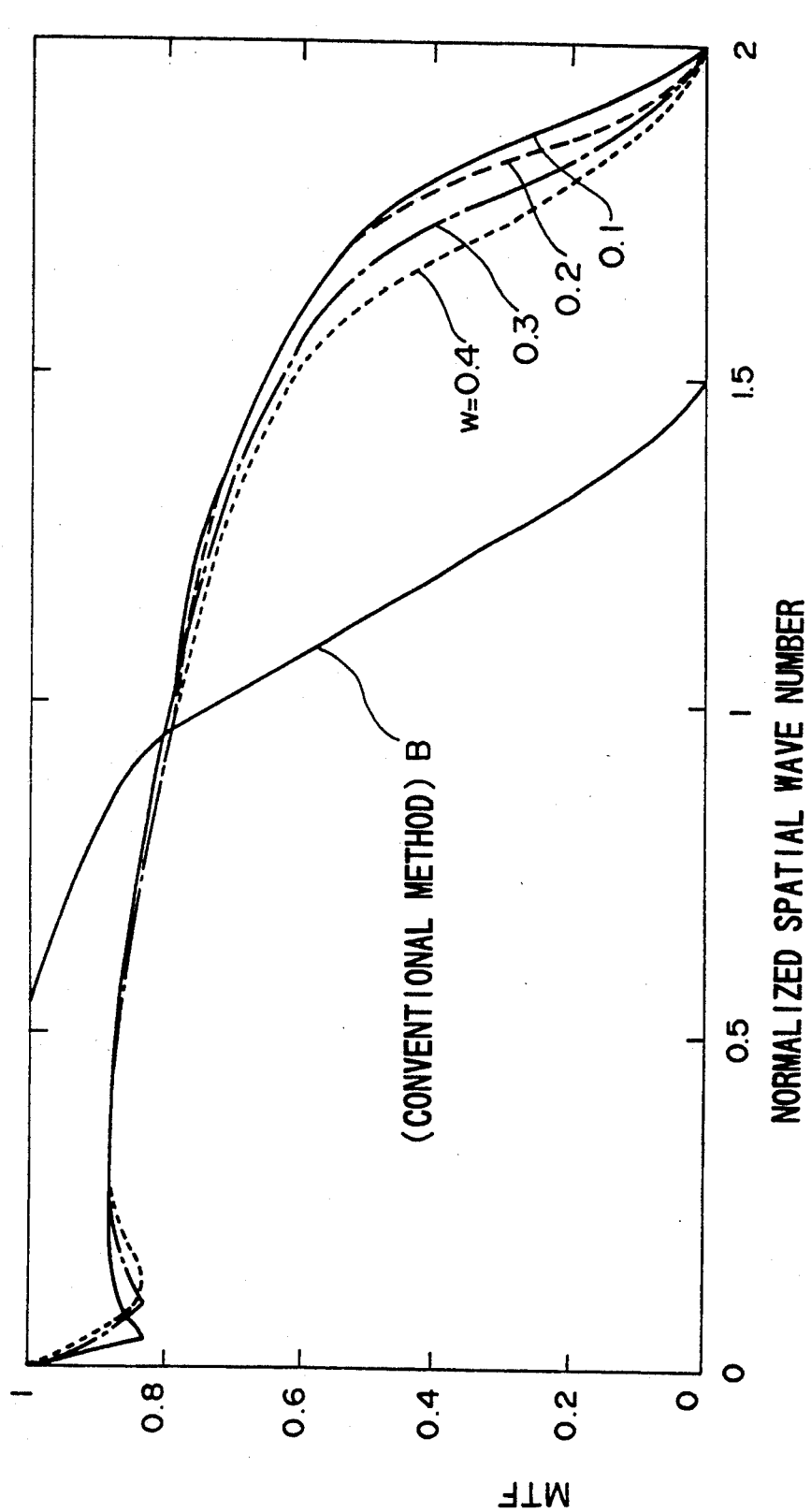
FIG. 78 is a graph showing MTF characteristics shown in the embodiments of FIG. 1 to 16(b)
Figure 79A:
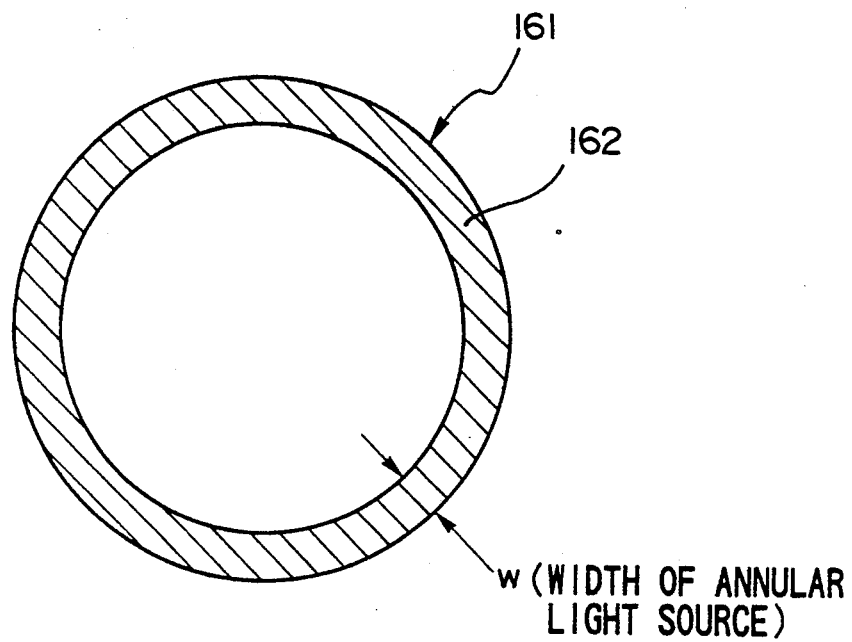
FIG. 79(a) is a view showing a light source layout in an entrance pupil space in the embodiments shown in FIGS. 1 to 16(b)

FIG. 78 is a graph showing contrast (MTF)-normalized spatial wave number characteristics when the annular light source shown in FIG. 6(d) is used. In particular, as shown in FIG. 79(a), an annular light source 161 indicated by a hatched portion is circumscribed with an entrance pupil circle 162. At the same time, when the radius of the pupil circle is defined as 1, contrast values of equation (20) are calculated under the condition that a width w of the annular light source is set to be 0.1, 0.2, 0.3, and 0.4. The normalized spatial wave number of the illumination light is plotted along the abscissa, and the contrast:MTF is plotted along the ordinate in FIG. 78.

Figure 79B:
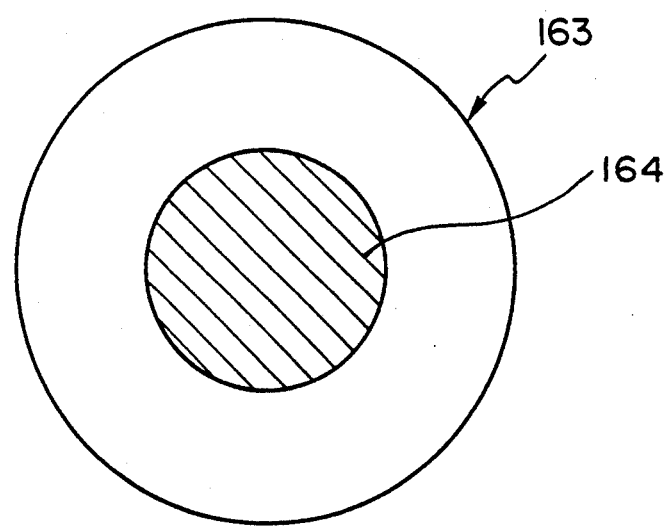
FIG. 79(b) is a view showing a light source layout in a conventional entrance pupil space.

FIG. 78 also indicates the light source 164 (represented by B) having its center as the optical axis and having ½ the size of the entrance pupil circle 163, as shown in FIG. 79(b), i.e., the conventional light source having a coherence factor $\sigma = 0.5$. As is apparent from FIG. 78, when the annular light source is employed, the contrast in the range of large wave numbers is increased, and a resolving power can be largely increased.

On the other hand, whether a pattern having a certain wave number can be actually formed or not is determined by an MTF threshold value determined by a resist material and a resist process. For example, a resist process capable of forming a pattern when an MTF value is 0.5 or more, and a resist process not capable of forming a pattern unless the MTF value is 0.7 or more are available.

A stable resist pattern having a larger dimensional margin can be generally obtained when the MTF threshold value is increased. From this point of view, when an MTF curve of the annular light source of FIG. 78 is taken into consideration, the wave number is increased and at the same time the MTF value is moderately decreased. In order to obtain a high resolving power, a resist process capable of forming a pattern with a small MTF value is required. When the method of the present invention is applied to a resist process requiring a large MTF value, a high resolving power cannot be expected.

Since the MTF value is moderately changed by a wave number in a conventional annular light source, the process margin for forming a pattern is undesirably small.

In consideration of the above situation, an optical projection exposure system of this embodiment has a means for inclining a ray for illuminating a mask by an angle corresponding to the numerical aperture of the optical projection lens. Four partially annular light sources are used to illuminate the mask from four directions symmetrical about the optical axis when viewed on a plane perpendicular to the optical axis. With this arrangement, the four partially annular light sources are arranged at symmetrical positions with respect to the optical axis. The resolving power of the L&S patterns perpendicular to each other can be increased. At the same time, an MTF curve can be steep with respect to the spatial wave number.

Such an embodiment will be described in detail with reference to FIGS. 80 to 84.

In the oblique incidence illumination of this embodiment, the four partially annular light sources are used, and the illumination directions are specified. The resolution improvement effect has directivity. For descriptive simplicity, X- and Y-axes perpendicular to each other and having an origin as the optical axis are plotted, and four partially annular light sources having the same shape and arranged at four angular positions in the X, -X, Y, and -Y directions are set.

In this system, a normalized incident angle R of each partially annular light source and $2\sigma_D$ representing the width of each partially annular light source are defined as follows:

$$R = m \cdot \sin\beta / NA$$

$$\sigma_D = m \cdot \sin\beta' / NA$$

where m is the reduction magnification, NA is the numerical aperture of the optical projection lens, $\beta'$ is the divergent angle of the bundle of reticle illumination rays, and $\beta$ is the angle formed between the optical axis and the central line of the rays projected on a plane including the optical axis. A divergent angle of each partially annular light source on the periphery is defined as $2\theta$.

Figure 80:
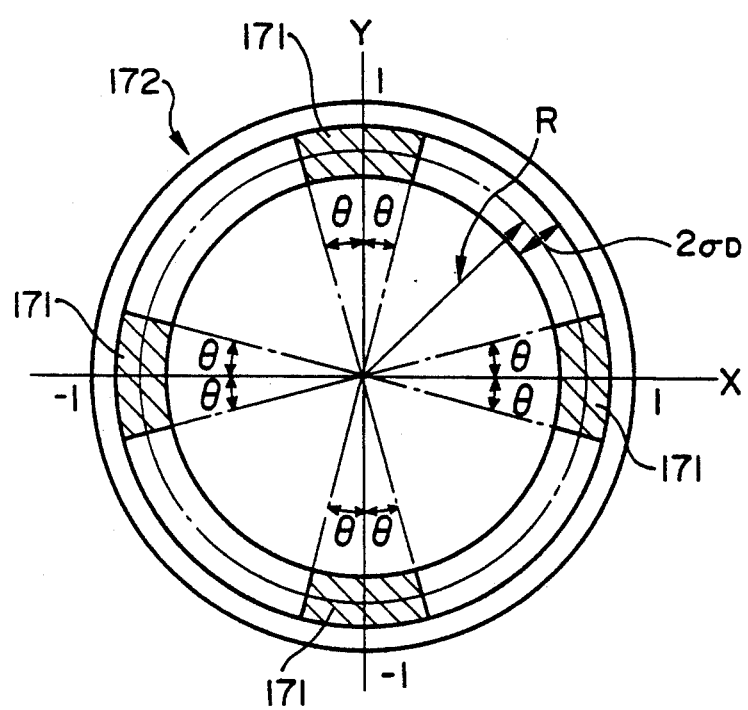
FIG. 80 is a schematic view in which a typical partial annular light source layout is represented in the entrance pupil space.

FIG. 80 is this embodiment of the present invention. The layout of the typical partially annular light sources 171 is represented in the entrance pupil space. If the size of the entrance pupil circle 172 is represented by a circle having a radius of 1 normalized with the NA of the optical projection lens, R, $\sigma_D$, and $\theta$ are illustrated in FIG. 80. According to the present invention, an enhanced effect can be obtained when $R + \sigma_D = 1$, $2\sigma_D \geq 0.3$, and $2\theta \leq 60°$.

In an oblique incidence illumination system, a DC component of a spatial wave number is generally large to decrease the contrast. In order to eliminate this drawback, a transmission adjustment filter is preferably arranged in the optical projection lens aperture, as shown in FIGS. 1 to 6(d1). This filter has predetermined transmittance at only the peripheral portion of the aperture through which a zero-order diffracted ray passes. The best effect is obtained when the filter having the predetermined transmittance is located at a position overlapping the light source when viewed in the entrance pupil space.

In the partially annular light sources of this embodiment, use of the partially annular filter having the predetermined transmittance and located at the position overlapping the light source does not provide a typical effect much different from use of an annular filter. The latter filter is used. The filter transmittance is set to be 0.35 for providing a maximum MTF value (to be described later).

Patterns for evaluating the effect of this embodiment are represented by L&S patterns parallel to X- and Y-axes, and L&S patterns inclined at 45° with respect to the X- and Y-axes.

L(||): an L&S pattern parallel to the X- or Y-axis

L(#): an L&S pattern inclined at 45° with respect to the X- or Y-axis

In this embodiment, since the partially annular light sources are located in the four directions symmetrical about the optical axis, an L&S pattern parallel to the X-axis has a resolving power equal to that of an L&S pattern parallel to the Y-axis. Similarly, all L&S patterns inclined at 45° with respect to the X- or Y-axis have the same resolving power.

Several embodiments will be described with reference to the accompanying drawings using these parameters below.

FIGS. 81, 82, 83, and 84 are these embodiments according to the present invention. Contrast values calculated on the basis of equation (20) under the conditions of the respective light source layouts and their sizes are shown in FIGS. 81 to 84. The respective conditions and evaluation object patterns are as follows.

Figure 81:
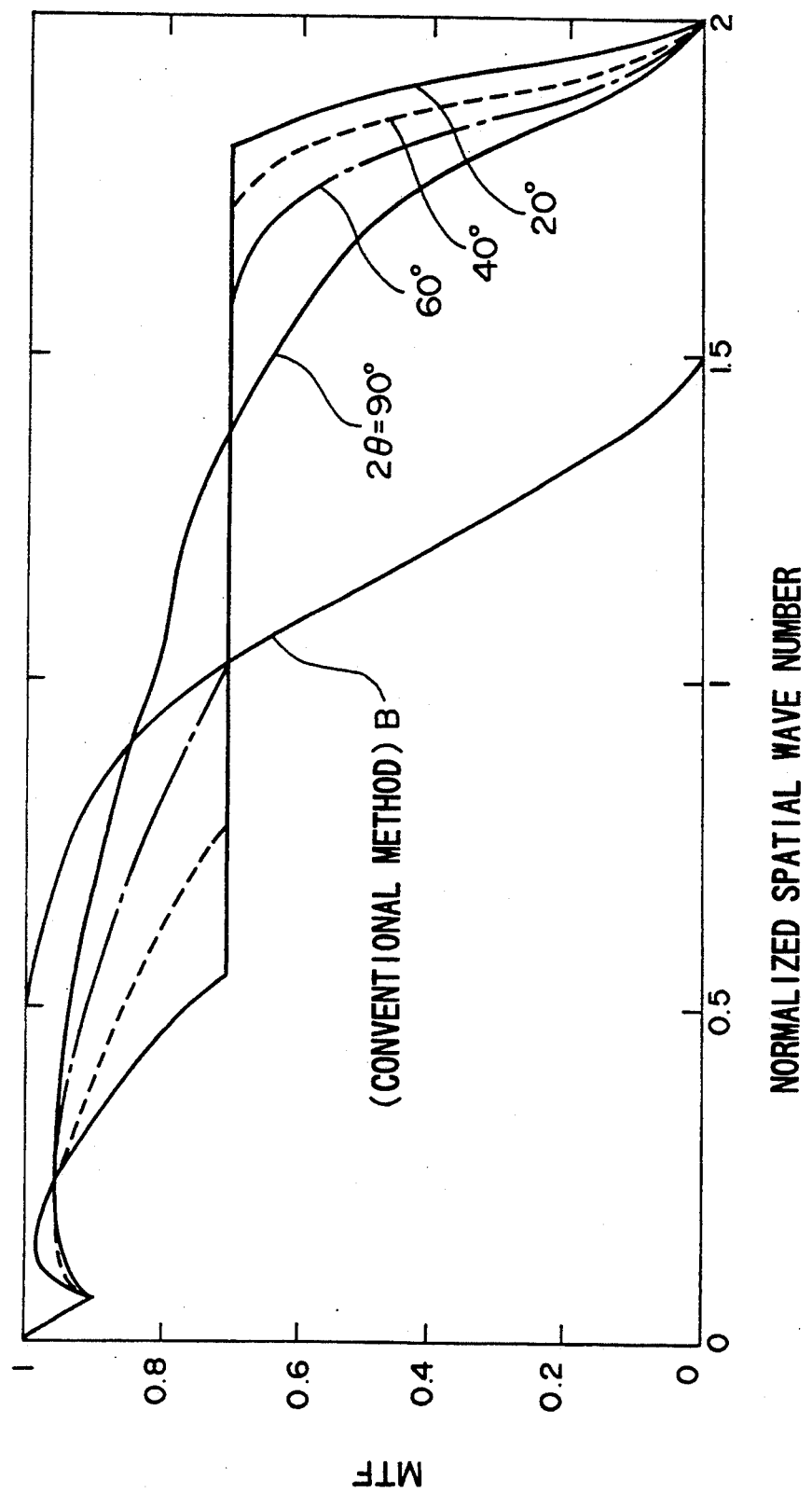
FIG. 81 is a graph showing the contrast calculated on the basis of equation (20) using the light source layout and the size of the light source as compared with a conventional method according to still another embodiment of the present invention.

FIG. 81: L(#) if R=0.95, $2\sigma_D=0.1$, and $2\theta=20°$, 40°, 60°, and 90°

Figure 82:
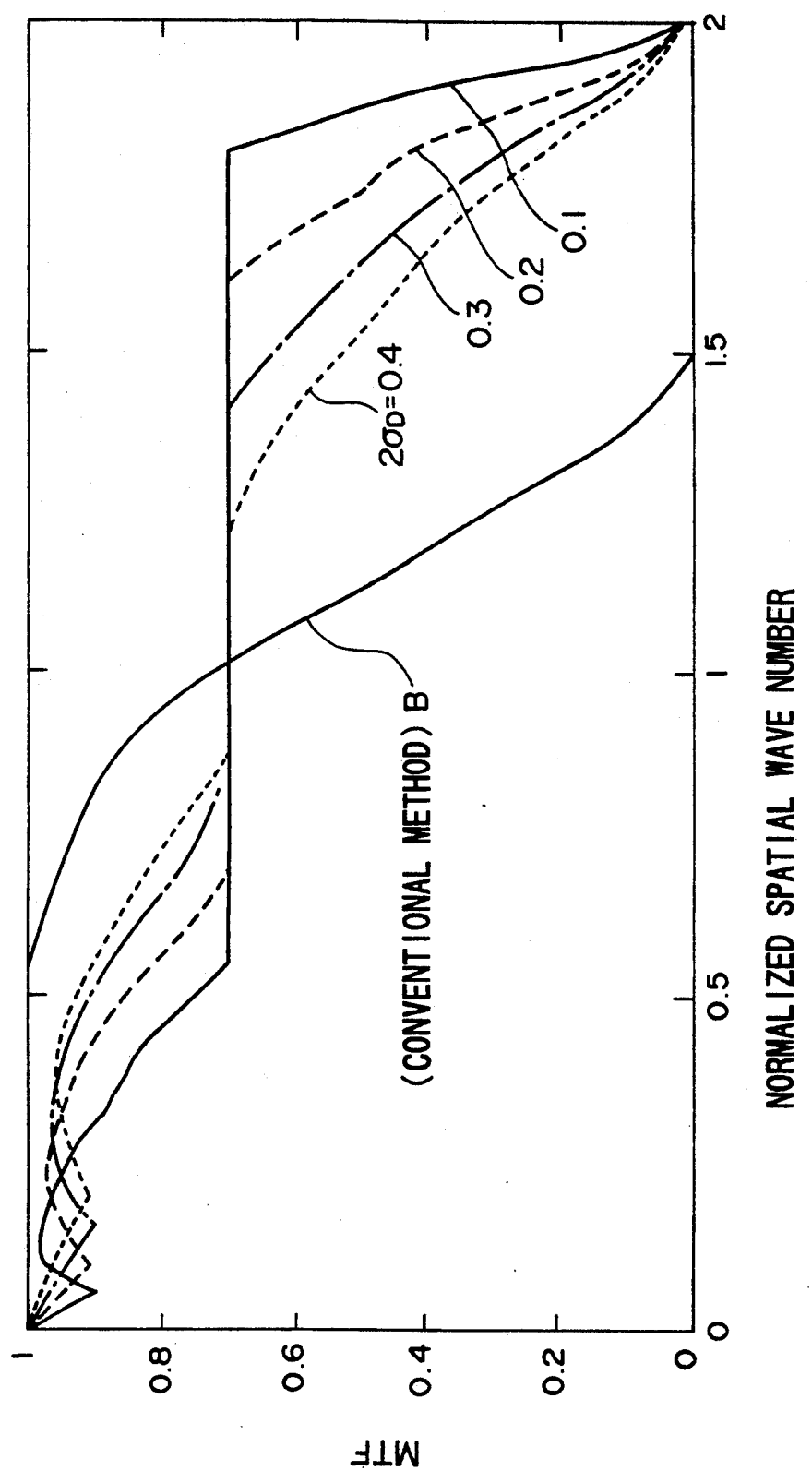
FIG. 82 is a graph showing the contrast calculated on the basis of equation (20) using the light source layout and the size of the light source as compared with a conventional method according to still another embodiment of the present invention.

FIG. 82: L(||) if $2\theta=20°$ and when R and $\sigma_D$ are changed under the condition of $R+\sigma_D=1$ FIG. 83: L(#) if R=0.95, $2\sigma_D=0.1$, and $\theta=20°$, 40°, and 60°

Figure 84:
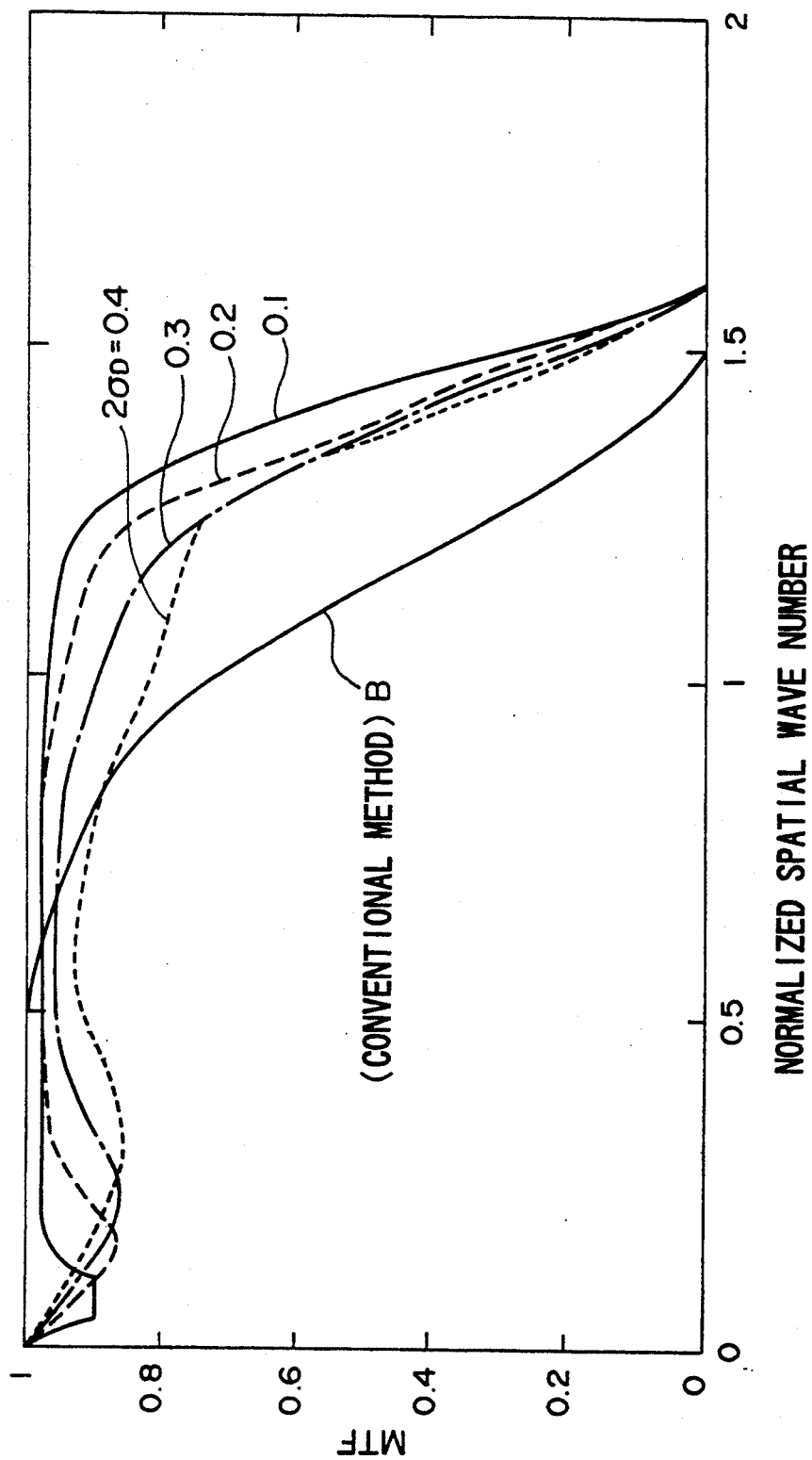
FIG. 84 is a graph showing the contrast calculated on the basis of equation (5) using the light source layout and the size of the light source as compared with a conventional method according to still another embodiment of the present invention.

FIG. 84: L(#) if $2\theta=20°$ and when R and $\sigma_D$ are changed under the condition of $R+\sigma_D=1$ As is apparent from FIG. 81, the MTF curve extends toward the side of a large wave number as compared with the conventional method and an annular light source and is steep. If a resist process having an MTF value of 0.7 or less is used, both a resolution improvement effect and a large process margin can be obtained. When the divergent angle $2\theta$ of each partially annular light source on the circumference is reduced to enhance the effect of the present invention. An MTF curve by the conventional method is represented by reference symbol B.

FIG. 82 is a case in which the width of the partially annular light source is changed. When the width is decreased, the effect of the present invention can be enhanced. However, when the width is decreased, the effect of the present invention is reduced. If $2\sigma_D$ is 0.3 or more, the effect of the present invention can be obtained as compared with the corresponding $2\sigma_D$ annular light sources of FIG. 78.

The MTF values are set to be almost 0.7 in the range of the normalized spatial wave number of 0.5 to 1.5 in FIGS. 81 and 82 when the transmittance for a k=0 component passing through a filter is set to be 0.35 and the transmittance for other components is set to be 1, and the transmission cross-coefficients are defined as follows:

$J(k;0)=0.35$
$J(-k;0)=0.35$
$J(0;0)=0.35\times 0.35$
$J(k;k)=1$
$J(-k;k)=1$
$J(k;-k)=0$ Substitutions of $A_0=\frac{1}{2}$ and $A_1=\frac{1}{4}$ into equation (20) yield an MTF value of about 0.7. When the transmittance of 0.35 is defined as t, and the transmittance t is obtained for $dM/dt=0$ in equation (20), the transmittance t for obtaining a maximum resolving power is given as $t=(\text{root } 2)/4=0.35$. At the time, $MTF=(\text{root } 2)/2 \approx 0.7$ is obtained.

Figure 83:
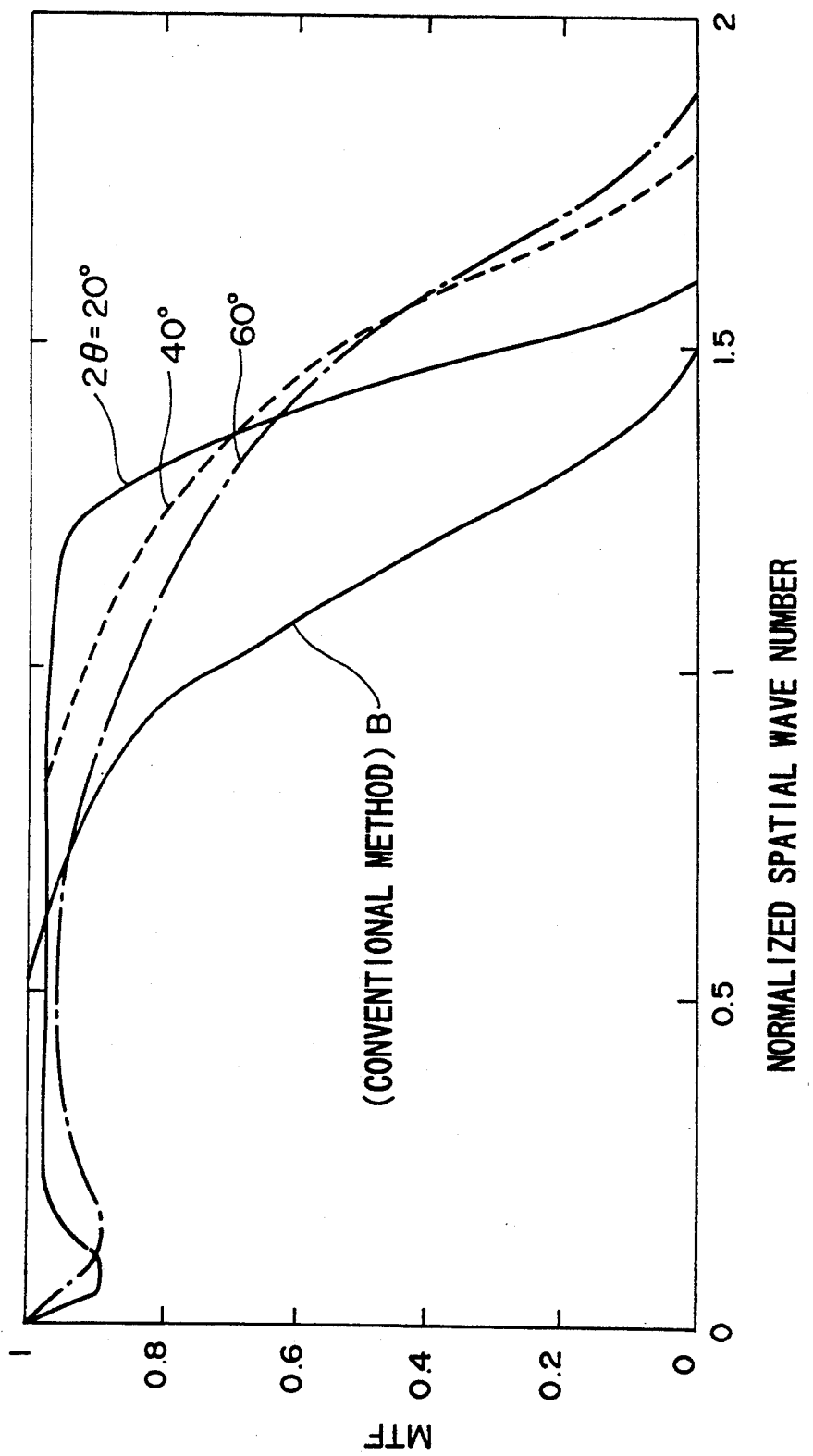
FIG. 83 is a graph showing the contrast calculated on the basis of equation (20) using the light source layout and the size of the light source as compared with a conventional method according to still another embodiment of the present invention.

FIGS. 83 and 84 show evaluation results of L(#) under the conditions corresponding to FIGS. 81 and 82. When the MTF value is 0.7 or less, it is stabilized by the annular light source. A higher resolving power than the conventional case can be obtained. This result exhibits the minimum value of this optical system. The resolving powers of L&S patterns parallel to X- and Y-axes and inclined at angles except for 45° are represented by a curve falling between the MTF curves of FIGS. 74 and 82 having the conditions corresponding to the MTF curve of this result.

Most of the LSI patterns are generally constituted by line patterns perpendicular to each other and rectangular patterns. Oblique patterns are used as some LSI patterns to perform a space work having high efficiency. In this case, demands for dimensional precision and resolution of the oblique patterns are generally less strict than those for patterns perpendicular to each other. No problem is posed in practical LSI pattern formation.

In this embodiment, four identical partially annular light sources are arranged at positions symmetrical about the optical axis. The following two methods are available as a means for obtaining this partially annular light source to obtain the same effect:

1 a method proposed for the annular light source in the embodiment of FIGS. 41(a) to 45(b) to obtain a partially annular light source by using a lens system or an optical fiber; and 2 a method of mounting an aperture having an aperture corresponding to a partially annular light source immediately behind a secondary source plane in a conventional light source having a coherence factor $\sigma=1$.

As described above, in the embodiment shown in FIGS. 80 to 84, as compared with an optical projection exposure system using an annular light source, the resolving powers of the L&S patterns perpendicular to each other can be increased, and the MTF curve can become steep as a function of the spatial wave number. Therefore, there is provided an optical projection exposure system (lithography) having large process margins in dimensional precision and reproducibility.

When the optical projection exposure system having the above arrangement as described above is used, micropatterns can be obtained in general LSI pattern formation requiring high revolving powers in the patterns perpendicular to each other. The integration density can largely be increased, and device performance can also largely be improved.

Figure 17:
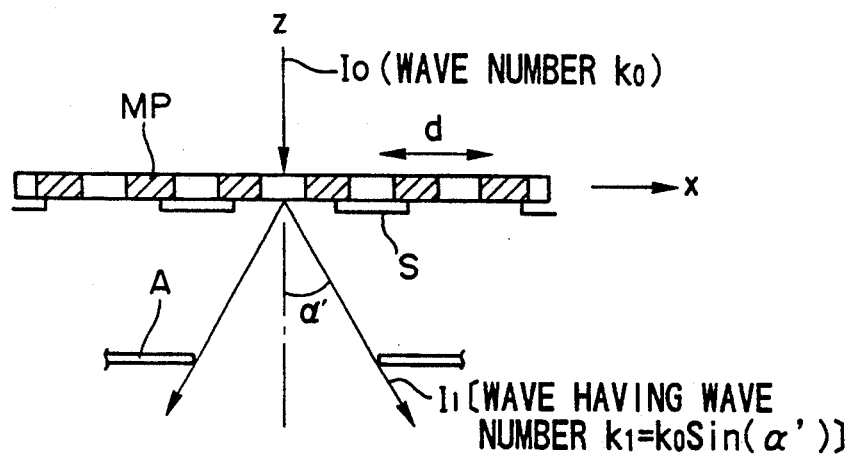
FIG. 17 is a view for explaining a conventional phase-shifting mask method.
Figure 18:
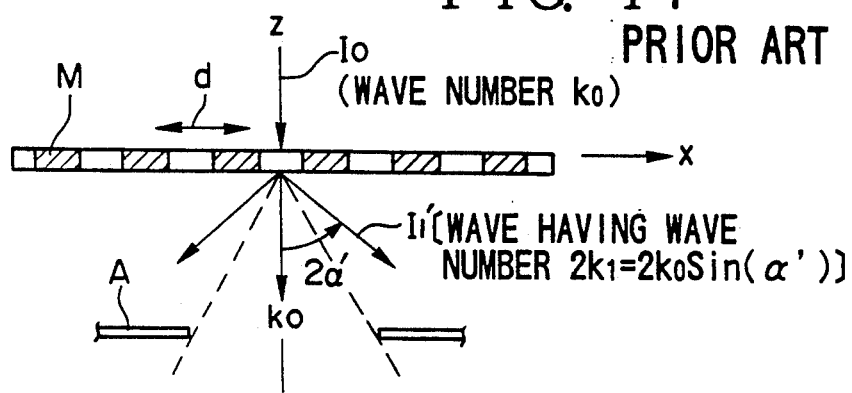
FIG. 18 is a view for explaining a normal illumination method.

Referring back to FIG. 1, a method of oblique incidence illumination will be examined again. In oblique incidence illumination for illuminating a mask 11 from an oblique direction with illumination light inclined at an angle corresponding to the numerical aperture of the optical projection system, wave number components of a mask pattern M up to $2k_1$ can pass through an optical projection lens system A to obtain the resolving power about twice the conventional case, as has been described above. Assume that a mask pattern (light immediately after passing through the mask) is given as a one-dimensional grating pattern defined by $1+\cos kx$. The diffracted rays consist of three components ($I_0$, $I_{+1}$, and $I_{-1}$), i.e., the zero-, +1st-, and −1st-order diffracted rays. A ratio of the amplitudes of these diffracted rays is given as 2:1:1 (all the components are utilized in the conventional method of FIG. 17 to reproduce a mask pattern as its image). In the optical projection exposure method using oblique incidence illumination of FIG. 1, since only two components ($I_0$ and $I_{+1}$), i.e., the zero- and +1st-order diffracted rays are utilized, a high resolving power can be obtained, but the contrast is decreased. In the above embodiment, the method of mounting a filter for reducing the zero-order diffracted ray into $\frac{1}{2}$ at the aperture stop of the optical projection lens is exemplified.

In this optical projection exposure method, however, various aberrations are minimized at the time of design of the optical projection lens system, and the lens system is manufactured and adjusted with extremely high precision. The precision and arrangement of a filter arranged at the aperture stop are not satisfactory, a desired resolution characteristic improvement cannot be often expected.

In order to solve this problem, in the following embodiment, the arrangement of a mask is changed such that the zero-order diffracted component of the diffracted rays is relatively set to be $\frac{1}{2}$ to achieve a good balance with the 1st-order diffracted ray without using the aperture filter. In addition, both a high contrast and a high resolving power can be obtained without modifying the optical projection lens system.

An opaque region of a mask is positively utilized based on the fact that a light intensity of each order of the diffracted rays is proportional to the magnitude of each component obtained by Fourier-developing the mask pattern. That is, in a conventional arrangement, the opaque region which does not transmit light therethrough is semi-transparent to adjust its transmittance. At the same time, a phase difference between the opaque region and a transparent region is set to be 180° to utilize the opaque region as a negative intensity (amplitude intensity), thereby adjusting the value of the zero-order component (DC component).

With this arrangement, since the opaque region of the mask is semi-transparent to set its transmittance in accordance with physical properties such as a pattern width, and at the same time the phase difference of 180° is given to light passing through the semi-transparent opaque region and the mask transparent region, the contrast and the resolving power can be increased without using the aperture filter.

Figure 85A:
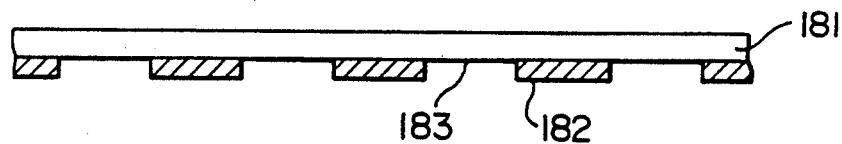
FIG. 85(a) is a schematic view of a mask used in an optical projection exposure method according to the present invention.

The above arrangement will be described in detail with reference to FIGS. 85(a) to 86. Referring to FIG. 85(a), reference numeral 181 denotes a transparent mask substrate; 182, a mask member constituting a semi-transparent opaque region having a predetermined pattern on one surface of the mask substrate 181; and 183, a transparent region of the mask, all of which constitute a mask 184. The mask member 182 has a thickness d determined by $(n-1)d = \lambda/2$ with respect to the refractive index n at a wavelength $\lambda$ of light used. At the same time, the mask material is selected to obtain the mask transmittance t. Under these conditions, an amplitude ratio t can be obtained by light passing through the mask transparent region 183 and the phase difference $\pi$ (180°), and the sign and value of the amplitude can be adjusted.

As another method, a two-layered structure is employed as a mask member, and the transmittance and the phase difference may be controlled independently by these layers. Alternatively, the phase difference may be controlled by the mask transparent region (e.g., its thickness), and only the transmittance may be adjusted by the mask member.

Figure 85B:
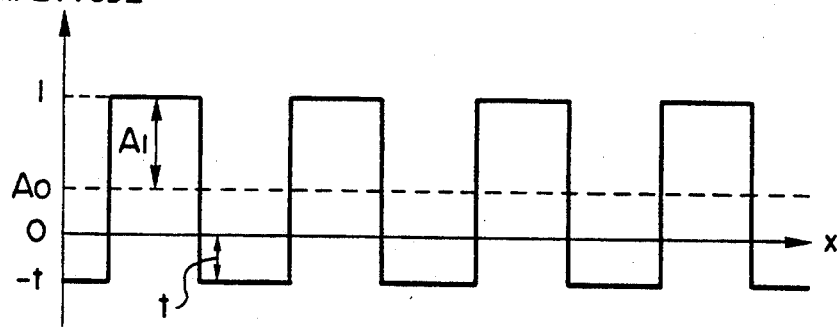
FIG. 85(b) is a view showing an amplitude distribution of this mask.

FIG. 85(a) shows a one-dimensional grating pattern in which a ratio of the opaque region to the transparent region of the mask 184 is set to be 1:1. The corresponding amplitude distribution is shown in FIG. 85(b). Reference symbol $A_0$ denotes a DC component (i.e., the zero-order diffracted component); and $A_1$, an amplitude of the pattern shape. The transmittance corresponding to $t=0$, which is that of the conventional normal mask, so that $A_0 = \frac{1}{2}$, $A_1 = \frac{1}{2}$, and $A_0/A_1 = 1$. In this case, $A_1$ corresponds to the intensity of diffracted rays of $\pm 1$st order or more. When the ratio $A_0/A_1$ is set to be $\frac{1}{2}$ the conventional value, the same imaging characteristics (contrast) as those of the filter used in the optical projection lens aperture stop can be obtained.

Figure 85C:
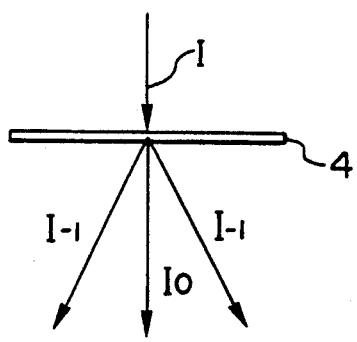
FIG. 85(c) is a view for explaining changes in distribution of diffracted components into zero- and ±1st-order diffracted rays from the mask.

As is apparent from FIG. 85(b), when the amplitude transmittance is set to be t, $A_0 = (1-t)/2$ and $A_1 = (1+t)/2$. Therefore, $t=\frac{1}{3}$ is derived from the ratio $A_0/A_1 = \frac{1}{2}$. States of zero- and $\pm 1$st-order diffracted rays (rays of $\pm 3$rd-order or more are omitted) are shown in FIG. 85(c). If $t=\frac{1}{3}$, then a ratio of 1:1:1 can be obtained. Referring to FIG. 85(c), reference symbol I denotes illumination light; $I_0$, a zero-order diffracted ray; $I_{+1}$, a +1st-order diffracted ray; $I_{-1}$, a −1st-order diffracted ray.

Figure 86:
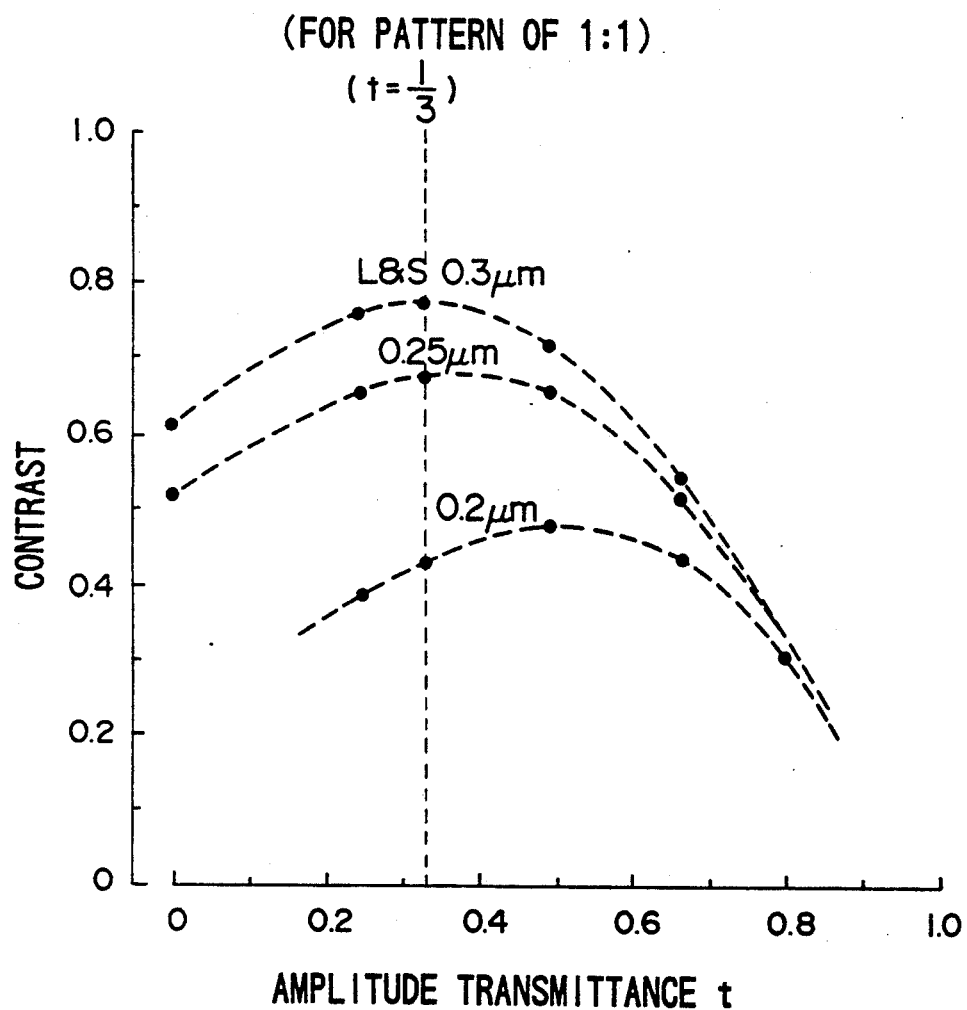
FIG. 86 is a graph showing computer simulation results associated with changes in contrast of imaging as a function of the amplitude transmittance of the mask of this embodiment.

FIG. 86 shows computer simulation results of changes in imaging contrast upon changes in values of the amplitude transmittance t. In this case, the contrast is represented by $(I_{max}-I_{min})/(I_{max}+I_{min})$ where $I_{max}$ is the maximum energy intensity and $I_{min}$ is the minimum energy intensity. At this time, the mask illumination system is set under the conditions (NA'=0.45 to 0.5) for oblique incidence illumination of axial symmetry. The numerical aperture of the optical projection lens system is set to be NA=0.5, and a light source is an i-ray ($\lambda = 365$ nm).

In a line-and-space pattern (i.e., a pattern width) having a size of 0.25 $\mu$m or more, which is close to the resolution limit, a maximum contrast is obtained for $t=\frac{1}{3}$. Each contrast value for $t=\frac{1}{3}$ precisely coincides with a simulation result by a combination of an aperture filter (transmittance of 50% in the peripheral annular portion) in a normal mask and the oblique incidence illumination system of axial symmetry. This proves the effectiveness of the present invention.

In the above description, the ratio of the area of the opaque region (semi-transparent region) to the transparent region of the mask is 1:1. When this ratio, however, is changed, the transmittance t is changed accordingly. Since the values of the transmittance t exhibit moderate dependency, as shown in FIG. 86, a large effect can be obtained even if the value of the transmittance t is selected in a large range of, e.g., 0.2 to 0.6. Therefore, when a rough transmittance t is set in accordance with physical properties of the pattern, a sufficiently high effect can be assumed to be obtained.

In the above embodiment, the function and effect of the mask according to the present invention have been described in combination with the oblique incidence illumination system. However, when the mask of the present invention is combined with a normal illumination system, a pattern boundary similar to that in the phase-shifting method can be distinguished. In particular, in a region of $t=0.2$ or less, the characteristics of the normal illumination system can be improved.

When a mask is used for a typical light source (e.g., an i-ray, a g-ray, or an ArF or KrF excimer laser) to be used in future photolithography, the mask can be arranged to satisfy the following two conditions such that (i) an opaque region of a mask is set to be semi-transparent to each light source described above, and its transmittance is set in accordance with physical properties such as a pattern width, and at the same time (ii) rays passing through the semi-transparent opaque region and the transparent region have a phase difference of 180°.

According to the present invention, as has been described above, since the opaque region of the mask is set to be semi-transparent and its transmittance is adjusted, and at the same time the phase difference between the rays passing through the opaque region and the transparent region of the mask is set to be 180°, there is provided an optical projection exposure method and a mask wherein the characteristic features of the oblique incidence illumination system can be sufficiently enhanced. For this reason, high-precision micropatterns can be accurately formed.

When only a modification using a mask member satisfying the requirements of the present invention in place of a conventional mask member (e.g., a chromium thin film) is performed, the mask pattern manufacturing process of the present invention is almost the conventional mask pattern manufacturing process. High reliability and a high yield can be assured, and the present invention is advantageously effective for almost all arbitrary patterns

What is claimed is:

1. An optical projection exposure method of a micropattern, comprising the steps of inclining illumination light for illuminating a mask having the micropattern thereon by an angle corresponding to a numerical aperture of an optical projection lens located below said mask with respect to an optical axis, and causing the illumination light to be obliquely incident on said mask to expose the micropattern on an object located below said optical projection lens.

2. A method according to claim 1, wherein the illumination light is obtained by superposing a plurality of rays incoherent to each other.

3. A method according to claim 1, wherein the illumination light is constituted by rays obliquely incident from two directions at equal angular intervals when viewed on a plane perpendicular to the optical axis.

4. A method according to claim 1, wherein the illumination light is constituted by rays obliquely incident from four directions at equal angular intervals when viewed on a plane perpendicular to the optical axis.

5. A method according to claim 2, wherein the rays constituting the illumination light are obliquely incident in axial symmetry with respect to the optical axis at angles corresponding to the numerical aperture of said optical projection lens with respect to the optical axis.

6. A method according to claim 1, wherein the illumination light has an annular shape.

7. A method according to claim 1, wherein said optical projection lens has an optical projection lens aperture whose transmittance is adjusted at least at a portion having a shape corresponding to a light source image (without a reticle) focused at the aperture.

8. A method according to claim 1, wherein said optical projection lens comprises first and second lens systems and an aperture stop located between said first and second lens systems.

9. A method according to claim 1, wherein the illumination light obliquely incident on said mask is formed by an optical device located on a light source side of said mask.

10. A method according to claim 9, wherein said optical device comprises a device having a periodic structure.

11. A method according to claim 9, wherein said optical device is a prism.

12. A method according to claim 9, wherein said optical device comprises a combination of a device having a periodic structure and a prism.

13. A method according to claim 9, wherein said optical device comprises a device having periodic patterns respectively formed on both surfaces of a substrate.

14. A method according to claim 9, wherein said optical device is formed integrally with said mask.

15. A method according to claim 14, wherein said mask has an opaque region and a transparent region, said opaque region being semi-transparent, having a transmittance set on the basis of a pattern shape, and having a structure such that light passing through said opaque region has a phase difference of a half wavelength from light passing through said transparent region.

16. A method according to claim 9, wherein said optical device is rotated about an axis perpendicular to said mask.

17. A method according to claim 6, wherein the annular illumination light is formed such that light from a light source is incident on a small-diameter incident surface obtained by bundling optical fibers in a doughnut-like shape and emerges from a large-diameter exit surface thereof.

18. A method according to claim 6, wherein the illumination light is obtained such that light from a light source is guided to a secondary source through a first optical system and light from said secondary source is transmitted through a second optical system.

19. A method according to claim 18, wherein said secondary source is an annular light source.

20. A method according to claim 18, wherein said second optical system includes a convex lens and a concave lens.

21. A method according to claim 20, wherein said second optical system includes a condenser lens.

22. A method according to claim 6, wherein the annular illumination light is formed such that light from a light source is incident on an incident surface of a conical lens and emerges from an exit surface thereof.

23. A method according to claim 1, wherein the step of causing the illumination light to be obliquely incident on said mask comprises the steps of causing light from a light source to be incident on an incident surface obtained by bundling optical fibers in a doughnut-like shape and causing the illumination light emerging from an exit surface thereof to be obliquely incident on said mask from at least one direction.

24. A method according to claim 23, wherein said incident surface of said optical fibers has a diameter larger than that of said exit surface.

25. A method according to claim 23, wherein the illumination light is obtained such that light from a light source is guided to a secondary source through a first optical system and light emerging from said secondary source is transmitted through a second optical system.

26. A method according to claim 18, wherein said secondary source is an annular light source.

27. A method according to claim 18, wherein said second optical system includes a convex lens and a concave lens.

28. A method according to claim 6, wherein the annular illumination light is formed such that light from a light source is incident on an incident surface of a conical lens and emerges from an exit surface thereof.

29. A method according to claim 1, wherein the illumination light incident on said mask is variably inclined within a range of angles corresponding to the numerical aperture of said optical projection lens.

30. A method according to claim 29, wherein the angle of the illumination light incident on said mask is changed in accordance with a parameter derived from the pattern on said mask.

31. A method according to claim 30, wherein the parameter includes at least one factor selected from the group consisting of the pattern shape and a pattern size.

32. A method according to claim 1, wherein coherency of said mask illumination light is adjusted by changing an effective area of the light source.

33. A method according to claim 32, wherein coherency of the illumination light is changed in accordance with a parameter derived from the pattern on said mask.

34. A method according to claim 33, wherein the parameter includes at least one factor selected from the group consisting of the pattern shape and a pattern size.

35. A method according to claim 1, wherein the illumination light is obliquely incident on said mask through at least one diaphragm located at a position outside the optical axis.

36. A method according to claim 35, wherein said diaphragm comprises two apertures having the same shape and centers corresponding to points symmetrical about the optical axis.

37. A method according to claim 35, wherein said diaphragm is located immediately behind said secondary source.

38. A method according to claim 1, wherein a filter designed such that a peripheral portion of an aperture corresponding to an image of a light source of an illumination system has an amplitude transmittance of 0.2 to 0.6 and a central portion of the aperture has an amplitude transmittance of 1 is arranged at an aperture stop of a projection optical system on which the illumination light is obliquely incident.

39. A method according to claim 38, wherein said illumination system and said filter are arranged such that the entire image of said light source which is focused at said aperture stop corresponds to an area in which said peripheral portion of said filter arranged at the position of said aperture stop has a transmittance of 0.2 to 0.6.

40. A method according to claim 1, wherein when a radius of an entrance pupil is normalized with the numerical aperture of said optical projection lens and is defined as 1, rays focused at an aperture stop of a projection optical system on which the illumination light is obliquely incident constitute an annular light source having inner and outer radii, and a zero-order light intensity adjustment filter having the same inner radius as that of the image of the rays focused at said aperture stop of said projection optical system and an outer radius of 1 is arranged at said aperture stop of said optical projection lens.

41. A method according to claim 40, wherein when the inner and outer radii of said annular light source are defined as $R_1$ and $R_2$, respectively, the inner radius satisfies condition $R_1 > 0.5$, and the outer radius satisfies conditions $R_2 \leq 1$.

42. A method according to claim 40, wherein said zero-order light intensity adjustment filter has an amplitude transmittance T satisfying condition $0.2 < T < 1$.

43. A method according to claim 40, wherein when the inner and outer radii of said annular light source are defined as $R_1$ and $R_2$, respectively, a portion from the inner radius R to the outer radius $R_2$ of said zero-order light intensity adjustment filter has an amplitude transmittance different from that of a portion from the inner radius $R_2$ to the outer diameter of 1.

44. A method according to claim 1, wherein the illumination light is constituted by rays from four partially annular light sources from four directions symmetrical about the optical axis when viewed on a plane perpendicular to the optical axis.

45. A method according to claim 1, wherein said mask comprises a mask substrate having an opaque region having a predetermined pattern on one surface of said mask substrate, said opaque region being semitransparent, having a transmittance set on the basis of a pattern shape, and having a structure such that light passing through said opaque region has a phase difference of a half wavelength from light passing through a transparent region of said mask.

46. An optical projection exposure apparatus of a micropattern, comprising:
a light source;
a mask on which the micropattern is drawn;
an optical projection lens located below said mask; and
means for obliquely illuminating the micropattern on said mask with illumination light inclined at an angle corresponding to a numerical aperture of said optical projection lens with respect to an optical axis,
wherein the illumination light is obliquely incident on said mask to expose the micropattern on an object located below said optical projection lens.

47. An apparatus according to claim 46, wherein the illumination light is obtained by superposing a plurality of rays incoherent to each other.

48. An apparatus according to claim 46, wherein the illumination light is constituted by rays obliquely incident from two directions at equal angular intervals when viewed on a plane perpendicular to the optical axis.

49. An apparatus according to claim 46, wherein the illumination light is constituted by rays obliquely incident from four directions at equal angular intervals when viewed on a plane perpendicular to the optical axis.

50. An apparatus according to claim 47, wherein the rays constituting the illumination light are obliquely incident in axial symmetry with respect to the optical axis at angles corresponding to the numerical aperture of said optical projection lens with respect to the optical axis.

51. An apparatus according to claim 46, wherein the illumination light has an annular shape.

52. An apparatus according to claim 46, wherein said optical projection lens has an optical projection lens aperture whose transmittance is adjusted at least at a portion having a shape corresponding to a light source image (without a reticle) focused at the aperture.

53. An apparatus according to claim 46, wherein said optical projection lens comprises first and second lens systems and an aperture stop located between said first and second lens systems.

54. An apparatus according to claim 46, wherein said means for obliquely illuminating the micropattern on said mask comprises an optical device located on a light source side of said mask.

55. An apparatus according to claim 54, wherein said optical device comprises a device having a periodic structure.

56. An apparatus according to claim 54, wherein said optical device is a prism.

57. An apparatus according to claim 54, wherein said optical device comprises a combination of a device having a periodic structure and a prism.

58. An apparatus according to claim 54, wherein said optical device comprises a device having periodic patterns respectively formed on both surfaces of a substrate.

59. An apparatus according to claim 54, further comprising an optical device attaching/detaching mechanism for holding said optical device on a light source side of said mask and attaching/detaching said optical mask to/from said mask.

60. An apparatus according to claim 54, wherein said optical device is formed integrally with said mask.

61. An apparatus according to claim 60, wherein said mask has an opaque region and a transparent region, said opaque region being semi-transparent, having a transmittance set on the basis of a pattern shape, and having a structure such that light passing through said opaque region has a phase difference of a half wavelength from light passing through said transparent region.

62. An apparatus according to claim 54, wherein said optical device is rotated about an axis perpendicular to said mask.

63. An apparatus according to claim 46, wherein said means for obliquely illuminating the micropattern on said mask comprises a bundle of optical fibers bundled in a doughnut-like shape and having a small-diameter incident surface and a large-diameter exit surface, so that light from said light source is incident on said small-diameter incident surface of said bundle of optical fibers and emerges from said large-diameter exit surface thereof to form the illumination light.

64. An apparatus according to claim 51, wherein said means for obliquely illuminating the micropattern on said mask comprises means for guiding light from a light source to a secondary source through a first optical system, and means for transmitting light from said secondary source through a second optical system as the illumination light.

65. An apparatus according to claim 64, wherein said secondary source is an annular light source.

66. An apparatus according to claim 64, wherein said second optical system includes a convex lens and a concave lens.

67. An apparatus according to claim 66, wherein said second optical system further includes a condenser lens.

68. An apparatus according to claim 51, wherein said means for obliquely illuminating the micropattern on said mask comprises a conical lens having an incident surface for receiving light from a light source and an exit surface for causing the illumination light to emerge.

69. An apparatus according to claim 51, wherein said means for obliquely illuminating the micropattern on said mask comprises optical fibers having an incident surface for receiving light from said light source and an exit surface for causing the illumination light to emerge, the illumination light emerging from said exit surface being obliquely incident on said mask from at least one direction.

70. An apparatus according to claim 69, wherein said incident surface of said optical fibers has a diameter larger than that of said exit surface.

71. An apparatus according to claim 69, wherein the illumination light is obtained such that light from a light source is guided to a secondary source through a first optical system and light emerging from said secondary source is transmitted through a second optical system.

72. An apparatus according to claim 71, wherein said secondary source is an annular light source.

73. An apparatus according to claim 71, wherein said second optical system includes a convex lens and a concave lens.

74. An apparatus according to claim 69, wherein said means for obliquely illuminating the micropattern on said mask comprises a conical lens having an incident surface for receiving light from a light source and an exit surface for causing the illumination light to emerge.

75. An apparatus according to claim 46, wherein said means for obliquely illuminating the micropattern on said mask comprises means for variably inclining the illumination light incident on said mask within a range of angles corresponding to the numerical aperture of said optical projection lens.

76. An apparatus according to claim 75, wherein said means for variably inclining the illumination light changes the angle of the illumination light incident on said mask in accordance with a parameter derived from the pattern on said mask.

77. An apparatus according to claim 76, wherein the parameter includes at least one factor selected from the group consisting of the pattern shape and a pattern size.

78. An apparatus according to claim 46, wherein said means for obliquely illuminating the micropattern on said mask further comprises means for adjusting coherency of said mask illumination light by changing an effective area of the light source.

79. An apparatus according to claim 78, wherein said means for adjusting coherency of the illumination light changes coherency of the illumination light in accordance with a parameter derived from the pattern on said mask.

80. An apparatus according to claim 79, wherein the parameter includes at least one factor selected from the group consisting of the pattern shape and a pattern size.

81. An apparatus according to claim 46, wherein said means for obliquely illuminating the micropattern on said mask comprises at least one diaphragm located at a position outside the optical axis, so that the illumination light is obliquely incident on said mask through said diaphragm.

82. An apparatus according to claim 81, wherein said diaphragm comprises two apertures having the same shape and centers corresponding to points symmetrical about the optical axis.

83. An apparatus according to claim 81, wherein said diaphragm is located immediately behind said secondary source.

84. An apparatus according to claim 46, wherein said means for obliquely illuminating the micropattern on said mask is arranged such that a filter designed such that a peripheral portion of an aperture corresponding to an image of a light source of an illumination system has an amplitude transmittance of 0.2 to 0.6 and a central portion of the aperture has an amplitude transmittance of 1 is arranged at an aperture stop of a projection optical system on which the illumination light is obliquely incident.

85. An apparatus according to claim 84, wherein said illumination system and said filter are arranged such that the entire image of said light source which is focused at said aperture stop corresponds to an area in which said peripheral portion of said filter arranged at the position of said aperture stop has a transmittance of 0.2 to 0.6.

86. An apparatus according to claim 46, wherein when a radius of an entrance pupil is normalized with the numerical aperture of said optical projection lens and is defined as 1, said light source whose rays focused at an aperture stop of a projection optical system on which the illumination light is obliquely incident is an annular light source having inner and outer radii, and said means for obliquely illuminating the micropattern on said mask is arranged such that a zero-order light intensity adjustment filter having the same inner radius as that of the image of the rays focused at said aperture stop of said projection optical system and an outer radius of 1 is arranged at said aperture stop of said optical projection lens.

87. An apparatus according to claim 86, wherein when the inner and outer radii of said annular light source are defined as $R_1$ and $R_2$, respectively, the inner radius satisfies condition $R_1 > 0.5$, and the outer radius satisfies condition $R_2 \leq 1$.

88. An apparatus according to claim 86, wherein said zero-order light intensity adjustment filter has an amplitude transmittance T satisfying condition $0.2 < T\ 1$.

89. An apparatus according to claim 86, wherein when the inner and outer radii of said annular light source are defined as $R_1$ and $R_2$, respectively, a portion from the inner radius $R_1$ to the outer radius $R_2$ of said zero-order light intensity adjustment filter has an amplitude transmittance different from that of a portion from the inner radius $R_2$ to the outer diameter of 1.

90. An apparatus according to claim 46, wherein said light source is arranged such that the illumination light is constituted by rays from four partially annular light sources from four directions symmetrical about the optical axis when viewed on a plane perpendicular to the optical axis.

91. An apparatus according to claim 46, wherein said mask comprises a mask substrate having an opaque region having a predetermined pattern on one surface of said mask substrate, said opaque region being semitransparent, having a transmittance set on the basis of a pattern shape, and having a structure such that light passing through said opaque region has a phase difference of a half wavelength from light passing through a transparent region of said mask.

* * * * *